United States Patent
Terao et al.

(10) Patent No.: US 8,319,204 B2
(45) Date of Patent: Nov. 27, 2012

(54) SEMICONDUCTOR DEVICE

(75) Inventors: Motoyasu Terao, Hinode (JP); Satoru Hanzawa, Hachioji (JP); Takahiro Morikawa, Hachioji (JP); Kenzo Kurotsuchi, Kodaira (JP); Riichiro Takemura, Tokyo (JP); Norikatsu Takaura, Tokyo (JP); Nozomu Matsuzaki, Kodaira (JP)

(73) Assignee: Renesas Electronics Corporation, Kanagawa (JP)

( * ) Notice: Subject to any disclaimer, the term of this patent is extended or adjusted under 35 U.S.C. 154(b) by 114 days.

(21) Appl. No.: 12/373,185

(22) PCT Filed: Jul. 21, 2006

(86) PCT No.: PCT/JP2006/314457
§ 371 (c)(1),
(2), (4) Date: Nov. 30, 2009

(87) PCT Pub. No.: WO2008/010290
PCT Pub. Date: Jan. 24, 2008

(65) Prior Publication Data
US 2010/0072451 A1    Mar. 25, 2010

(51) Int. Cl.
*H01L 45/00* (2006.01)
*H01L 27/04* (2006.01)
(52) U.S. Cl. ............ 257/4; 257/5; 257/42; 257/E27.01; 257/E45.002
(58) Field of Classification Search ............... 257/4–42, 257/E45.002, E27.01
See application file for complete search history.

(56) References Cited

U.S. PATENT DOCUMENTS

| 5,254,382 A | 10/1993 | Ueno et al. |
| 5,789,758 A * | 8/1998 | Reinberg ............... 257/3 |
| 5,883,827 A | 3/1999 | Morgan |
| 2004/0184331 A1 | 9/2004 | Hanzawa et al. |
| 2005/0185445 A1 | 8/2005 | Osada et al. |

(Continued)

FOREIGN PATENT DOCUMENTS

EP    1 667 230    6/2006

(Continued)

OTHER PUBLICATIONS

Stefan Lai, et al "OUM—A 180nm Nonvolatile Memory Cell Element Technology for Stand Alone and Embedded Applications", IEEE International Electron Devices meeting, Technical Digest, 2001, pp. 803-806.

(Continued)

*Primary Examiner* — Jarrett Stark
*Assistant Examiner* — Lawrence Tynes, Jr.
(74) *Attorney, Agent, or Firm* — Mattingly & Malur, PC

(57) ABSTRACT

A recording layer 52 made of a chalcogenide material which stores a high-resistance state of a high electrical resistance value and a low-resistance state of a low electrical resistance value is used as a memory element RM in a memory cell region, and it is formed so that a concentration of Ga or In of a first layer 52a positioned on a lower electrode TP side of the recording layer 52 is higher than the corresponding concentration of a second layer 52b positioned on an upper electrode 53 side. For example, the recording layer is formed so that a content of Ga or In of the second layer is 5 atomic % or more smaller than that of the first layer. Also, a circuit which can reverse the voltage polarity between the upper electrode and the lower electrode in a set operation and a reset operation is provided.

2 Claims, 33 Drawing Sheets

U.S. PATENT DOCUMENTS

| | | | |
|---|---|---|---|
| 2007/0009703 A1* | 1/2007 | Shinkai et al. | 428/64.4 |
| 2007/0053786 A1* | 3/2007 | Nonaka et al. | 420/579 |
| 2007/0096074 A1* | 5/2007 | Asano et al. | 257/4 |

FOREIGN PATENT DOCUMENTS

| | | |
|---|---|---|
| JP | 2002-109797 | 4/2002 |
| JP | 2003-100991 | 4/2003 |
| JP | 2005-117030 | 4/2005 |
| JP | 2005-267837 | 9/2005 |
| WO | 03/065377 | 8/2003 |
| WO | 2005/076355 | 5/2005 |
| WO | 2005/112118 | 11/2005 |
| WO | 2007/057972 | 5/2007 |
| WO | 2007/058175 | 5/2007 |

OTHER PUBLICATIONS

Martijn H.R. Lankhorst, et al "Low-cost and nanoscale non-volatile memory concept for future silicon chips", Nature Materials, vol. 4, Apr. 2005, pp. 347-351.

* cited by examiner

SEMICONDUCTOR DEVICE

TECHNICAL FIELD

The present invention relates to a semiconductor device. More particularly, the present invention relates to a technique effectively applied to a semiconductor device provided with a memory element including a phase-change material.

BACKGROUND ARTECTS OF THE INVENTION

As a recording technique using physics of a chalcogenide material, a phase-change memory and a phase-change optical disc are cited. As a phase-change material used for the phase-change memory and the phase-change optical disc, a chalcogenide material containing Te (tellurium) is known.

U.S. Pat. No. 5,254,382 (patent document 1) has disclosed an optical disc medium using a chalcogenide material expressed as $\{(Ge_yTe_{1-y})_a(Sb_zTe_{1-z})_{1-a}\}_{1-b}(In_{1-x}Te_x)_b$ (Here, $0.4 \leq y \leq 0.6$, $0.3 \leq z \leq 0.6$, $0.4 \leq z \leq 0.6$, $0.1 \leq b \leq 0.3$) as a recording layer. In this case, for the purpose of improving the stability of an amorphous state while maintaining a characteristic of being able to crystallize rapidly and improving long-term data storage stability, In is added to Ge—Sb—Te.

On the other hand, in U.S. Pat. No. 5,883,827 (patent document 2), a non-volatile memory using a chalcogenide material film has been described in detail. This non-volatile memory is a phase-change memory in which stored information is written by the change in atomic arrangement of a phase-change material film in accordance with Joule heat and cooling rate caused by a current flowing in the phase-change material film itself. For example, since a phase-change material film is once molten by applying heat of higher than 600° C. in Joule heat when forming a noncrystalline (amorphous) state, the operation current tends to be large, and a resistance value changes by two to three orders of magnitude in accordance with the crystalline state.

As for the electrical phase-change memory, studies for that using $Ge_2Sb_2Te_5$ have been promoted mainly. For example, Japanese Patent Application Laid-Open Publication No. 2002-109797 (patent document 3) has disclosed a recording element using GeSbTe. Also, Japanese Patent Application Laid-Open Publication No. 2003-100991 (patent document 4) has disclosed a technique related to a memory using a chalcogenide material. Moreover, a non-patent document 1 has revealed that a phase-change memory using a phase-change film made of $Ge_2Sb_2Te_5$ is rewritable $10^{12}$ times. Further, a non-patent document 2 has disclosed a technique related to a phase-change memory using a crystal-growth material.

Patent Document 1: U.S. Pat. No. 5,254,382
Patent Document 2: U.S. Pat. No. 5,883,827
Patent Document 3: Japanese Patent Application Laid-Open Publication No. 2002-109797
Patent Document 4: Japanese Patent Application Laid-Open Publication No. 2003-100991
Non-Patent Document 1: IEEE International Electron Devices meeting, TECHNICAL DIGEST, 2001, pp. 803-806
Non-Patent Document 2: Nature Materials, Vol. 4, 2005, pp. 347-351

DISCLOSURE OF THE INVENTION

Problem to be Solved by the Invention

For example, according to a memory configuration of FIG. 12 in U.S. Pat. No. 5,883,827 (patent document 1), the memory includes a memory cell array, a row decoder XDEC, a bit (column) decoder YDEC, a reader circuit RC, and a writer circuit WC. In the memory cell array, memory cells MCpr are disposed at each of the intersections of word lines WLp (p=1, . . . , n) and data lines DLr (r=1, . . . , m). Each memory cell has a configuration in which a memory element RM' and a select transistor QM connected in series are interposed between a bit line DL and ground potential. The word line WL is connected to a gate of the select transistor, and a bit select line YSr (r=1, . . . , m) is connected to a corresponding bit select switch QAr, respectively.

In the configuration as mentioned above, when the select transistor on the word line selected by the row decoder XDEC is conducted and the bit select switch corresponding to the bit select line selected by the bit decoder YDEC is conducted, a current path is formed in the select memory cell, and a read signal is generated to a common bit line I/O. Since the resistance value in the select memory cell differs depending on the stored information, the voltage output to the common bit line I/O differs depending on the stored information. By specifying the difference by the reader circuit RC, the stored information of the select memory cell is read.

In such a phase-change memory, a phase-change material used in an optical disc as well is used as a recording layer, but different from an optical disc, in the phase-change memory, resistance to high temperature is sometimes required in a manufacturing process and use environment thereof. However, for example, when a memory is configured with using a standard phase-change material such as $Ge_2Sb_2Te_5$ as a recording layer, there are the following problems for usage at high temperature.

The first problem is instability of the amorphous state. That is, since the amorphous state is a metastable phase, crystallization is rapidly progressed in a high temperature environment. For example, a microcomputer for controlling an automobile is required to have a resistance to a usage in a high temperature environment of about 140° C. However, when $Ge_2Sb_2Te_5$ is used as a recording layer, an amorphous state is changed to a crystalline state, that is, to a low-resistance state in a few hours, and therefore, data retention property is insufficient in such a high temperature environment and is not suitable for use.

Also, in a microcomputer mounted with a memory, a memory element is exposed to a high temperature environment for soldering and compression-bonding of the chip in a process of packaging a microcomputer chip. In the case of the microcomputer, packaging is generally performed after recording a program to the memory portion. However, in a memory whose data is erased at a high temperature environment in the packaging process, data has to be written after the packaging, and a process different from usual has to be taken. Since heat load in several minutes at 250° C. for soldering and in several hours at 180° C. for compression-bonding is applied, data retention property in a higher temperature environment than an operating temperature has to be secured even for a short period. Therefore, a non-volatile memory for a microcomputer has to be provided with data retention property resistant to such a heat load in a manufacturing process, and much stricter heat-resistance than that of an optical disc is required.

The second problem is a resistance value in an amorphous state at high temperature. Since chalcogenide containing Te (tellurium) as a main component is a semiconductor whose band gap is narrow, a resistance thereof is generally lowered in an exponential manner as the temperature becomes higher. Since a degree of the change is larger in an amorphous state than in a crystalline state, even if there is a large resistance ratio at room temperature, the resistance ratio is lowered when the temperature is increased to 100° C. or higher, and therefore, there arises a problem that reading margin cannot be taken. For example, in the case of $Ge_2Sb_2Te_5$, a ratio of reset resistance/set resistance at room temperature is about 100 times. However, under the condition of 100° C. or higher, the reset resistance is significantly decreased, and the ratio is decreased to about 30 times. Therefore, a large reading margin which is an advantage of a phase-change memory cannot be taken, and depending on cases, a reading method has to be changed in accordance with an environment temperature.

As described above, some problems have occurred in a memory using the phase-change material. In particular, since the above-described second problem regarding the resistance value at high temperature is unique to an electrical memory using a chalcogenide material, this problem is not considered for the chalcogenide material for an optical recording medium. Therefore, a phase-change memory element using a chalcogenide material having an appropriate resistance value and capable of realizing stable data retention property even in a use environment and a manufacturing process at high temperature is required.

On the other hand, for improving data retention property (that is, heat resistance) in a high temperature state as described above, an addition of indium (In) to a composition of a phase-change memory element is considered. FIG. 35 is an explanatory diagram schematically showing a cross-sectional configuration example around a phase-change memory element and a problem thereof in a semiconductor device studied as a premise of the present invention. In FIG. 35, for example, on a plug 43 (lower electrode TP) including a main conductor film 43b of tungsten (W) and a conductive barrier film 43a of titanium (Ti)/titanium nitride (TiN), a memory element RM' is formed. The memory element RM' includes, for example, an interface layer 51 made of tantalum oxide (for example, $Ta_2O_5$), a recording layer 520 made of a chalcogenide layer with a uniform composition of In—Ge—Sb—Te, and an upper electrode 53 made of tungsten. In this manner, by adding indium (In) to a chalcogenide layer and providing the interface layer 51 of oxide or nitride such as $Ta_2O_5$, heat resistance can be improved. More specifically, an unintentional change from an amorphous state to a crystalline state at high temperature can be prevented.

In such a phase-change memory element, a shape of the lower electrode TP is different from that of the upper electrode 53 in most cases. Generally, temperature of an electrode side whose contact area to a chalcogenide layer is smaller (that is, lower electrode TP side) tends to be increased, and therefore, an electrode side whose contact area is larger (that is, upper electrode 53 side) is not molten at the time of reset, or even if it is molten, it is recrystallized during cooling thereof to crystallize. Amorphization occurs around the electrode side whose contact area is smaller (lower electrode TP), and a region A1 which is crystallized during a manufacturing process and remains in a crystalline state is present on an outer side thereof. Note that a region A2 is a region which is crystallized at the time of set and is amorphized at the time of reset. Also, a contact in this specification includes not only the direct contact, but also the contact with interposing a layer or a region such as an insulator or semiconductor which is thin enough to allow the current to flow.

The shortest distance between the lower electrode TP and a closest crystallized region A1 differs depending on the intensity and time of the current flowing at the time of reset. When an area of a transistor specifying an element is reduced, a current is reduced, and a distance L1 between the lower electrode TP and the closest crystallized region A1 in a film surface direction of a chalcogenide layer becomes smaller than a distance L2 in a film thickness direction between the lower electrode TP and the upper electrode 53 (or distance between the lower electrode TP and crystallized region A1 in front of the upper electrode). Therefore, there is a possibility that a lot of current flows in the closest gap (that is, the film surface direction) at the time of set. However, the closest gap becomes unstable due to a process variation, a process failure and others of the recording layer 520. Consequently, there is a possibility that failures such as a characteristic variation between elements and reduction in the number of rewritable times are caused.

Also, since there is a possibility that an atomic arrangement of the recording layer 520 is changed at high temperature, a further resistance increase resulting therefrom occurs in the recording layer 520, so that a high voltage is required for a next set operation. More specifically, when the region A2 of FIG. 35 is in an amorphous state, if atomic arrangement is changed in the entire region A2 at the time of high temperature and further resistance increase is caused, the subsequent set operation becomes difficult in some cases.

Further, since a strong electric field is applied in a phase-change memory element, when ions or easily-ionized elements or components exist in a film between electrodes, they may be moved by the electric field. More specifically, in FIG. 35, since a resistance of a crystallized region A1 from an initial state is low, if In—Ge—Sb—Te has the uniform composition in a film thickness direction, the potential gradient between an outer edge portion of the lower electrode TP and the crystallized region A1 from an initial state is largest at the time of set, and a set operation accompanied with impact ionization is started. At this time, a movement of In ions (positive ions) also tends to occur, and segregation and structure disturbance are caused when temperature is increased, which becomes the cause of changing the resistance to a high-resistance side. Note that, at the time of set/reset operations, a high voltage is applied to the upper electrode 53 based on the lower electrode TP in general, and therefore, In ions move easily to the lower electrode TP side.

As is understood from the foregoing, a phase-change memory element provided with high heat resistance and more stable data retention property is required. The present invention has been made in consideration of that, and the above and other objects and novel characteristics of the present invention will be apparent from the description of this specification and the accompanying drawings.

Means for Solving the Problems

The typical ones of the inventions disclosed in this application will be briefly described as follows.

A semiconductor device of the present invention has a structure in which a recording layer made of a chalcogenide material and disposed between an upper electrode and a lower electrode has a two or more layer structure, and a first layer on the lower electrode side is larger than a second layer on the upper electrode side in average content of a group II element or a group III element in a film thickness direction. The first layer is made of a material containing, for example, at least one element selected from a group including gallium (Ga) and indium (In) of 7 atomic % or more and 40 atomic % or less, germanium (Ge) of 5 atomic % or more and 35 atomic % or less, antimony (Sb) of 5 atomic % or more and 25 atomic % or less, and tellurium (Te) of 40 atomic % or more and 65 atomic % or less. indium (In) is the group III element.

Here, the reason why tellurium (Te) of 40 atomic % or more and 65 atomic % or less is contained is to achieve an appropriate rewriting property and data retention property. The reason why germanium (Ge) of 5 atomic % or more and 35 atomic % or less and antimony (Sb) of 5 atomic % or more and 25 atomic % or less are contained is to achieve the appropriate number of rewritable times and current amount required for rewriting. Also, the reason why at least one element which is selected from a group including gallium (Ga) and indium (In) of 7 atomic % or more and 40 atomic % or less is contained is to achieve an excellent data retention property and a high resistance ratio.

Further, when the average content of a group II element (for example, Zn or Cd) or a group III element (for example, Ga or In) in the first layer in a film thickness direction is set to 7 to 40 atomic %, the average content of a group II or group III element in the second layer in the film thickness direction is, for example, 0 to 15 atomic %, and the difference of the both average contents is set to 5 atomic % or more. As described above, by forming the recording layer to have two or more layer structure with different concentrations, the high heat resistance and a stable data retention property can be realized.

Also, a semiconductor device of the present invention uses such a recording layer as a memory element and is provided with a memory circuit in which voltage polarity between the upper electrode and the lower electrode can be set in reverse at the set and reset operations. In this manner, since a movement of an ionized element to one direction can be prevented, the number of rewritable times can be increased and a stable data retention property and the like can be realized. Note that the memory circuit is desirably configured so that the upper electrode side becomes positive at the time of set and the lower electrode side becomes positive at the time of reset.

Effect of the Invention

The effects obtained by typical aspects of the present invention will be briefly described. That is, a semiconductor device having high heat resistance and a stable data retention property can be realized.

BRIEF DESCRIPTIONS OF THE DRAWINGS

FIG. 5 is an explanatory diagram showing a pulse applied to the memory element of FIG. 4, in which

FIG. 6 is an explanatory diagram schematically showing crystallization process of a chalcogenide material, in which

BEST MODE FOR CARRYING OUT THE INVENTION

In the embodiments described below, the invention will be described in a plurality of sections or embodiments when required as a matter of convenience. However, these sections or embodiments are not irrelevant to each other unless otherwise stated, and the one relates to the entire or a part of the other as a modification example, details, or a supplementary explanation thereof. Also, in the embodiments described below, when referring to the number of elements (including number of pieces, values, amount, range, and the like), the number of the elements is not limited to a specific number unless otherwise stated or except the case where the number is apparently limited to a specific number in principle. The number larger or smaller than the specified number is also applicable.

Further, in the embodiments described below, it goes without saying that the components (including element steps) are not always indispensable unless otherwise stated or except the case where the components are apparently indispensable in principle. Similarly, in the embodiments described below, when the shape of the components, positional relation thereof, and the like are mentioned, the substantially approximate and similar shapes and the like are included therein unless otherwise stated or except the case where it can be conceived that they are apparently excluded in principle. The same goes for the numerical value and the range described above.

Hereinafter, embodiments of the present invention will be described in detail with reference to the accompanying drawings. Note that components having the same function are denoted by the same reference symbols throughout the drawings for describing the embodiment, and the repetitive description thereof will be omitted.

First Embodiment

A semiconductor device of the first embodiment has a memory element including a phase-change material, and as described later in FIG. 4 and others, a structure of the memory element is a main characteristic thereof. In the following, an entire configuration example of a semiconductor device including the memory element will be described.

Figure 1:
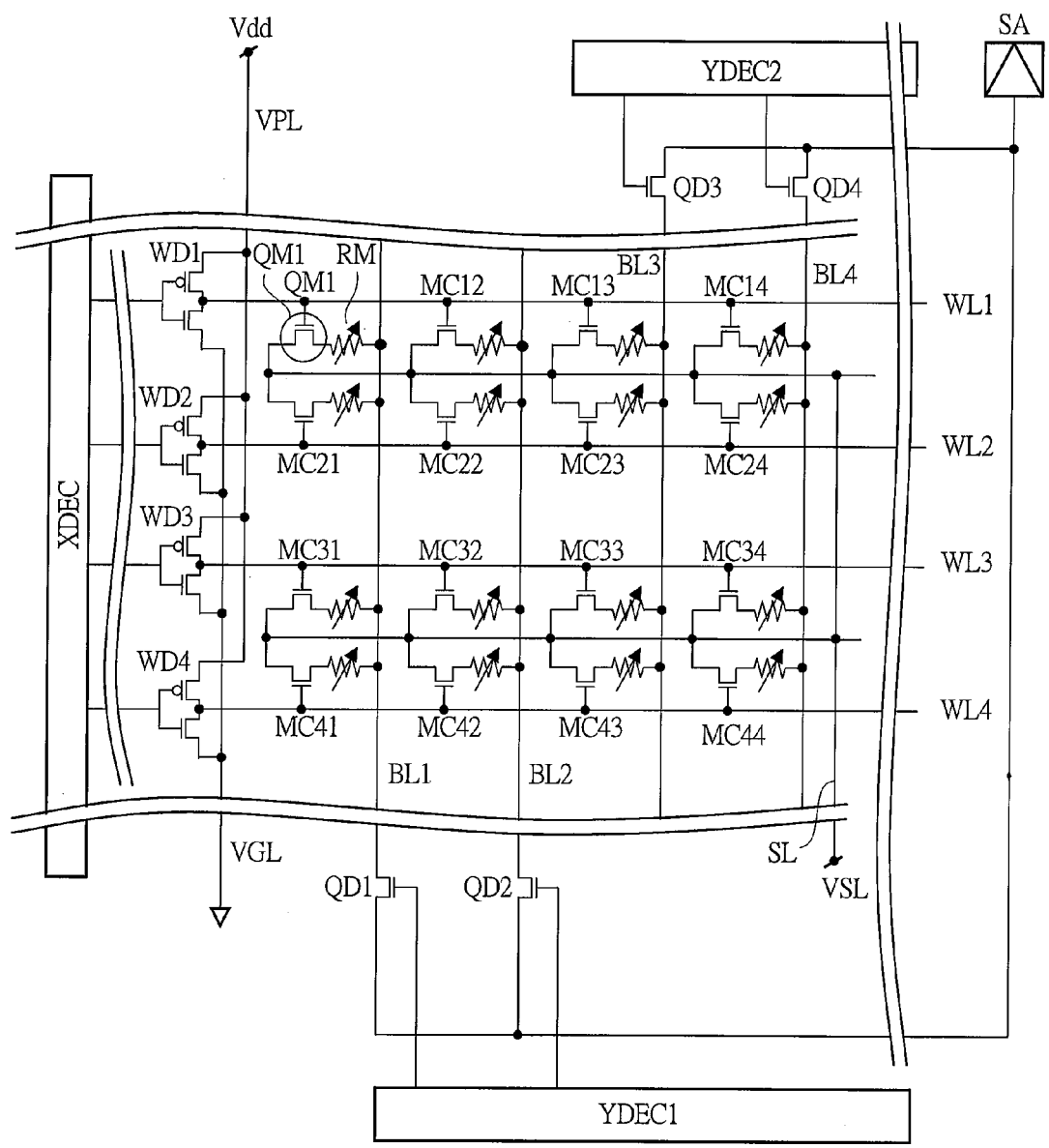
FIG. 1 is a circuit diagram showing a configuration example around a memory cell array included in a semiconductor device according to a first embodiment of the present invention.
Figure 2:
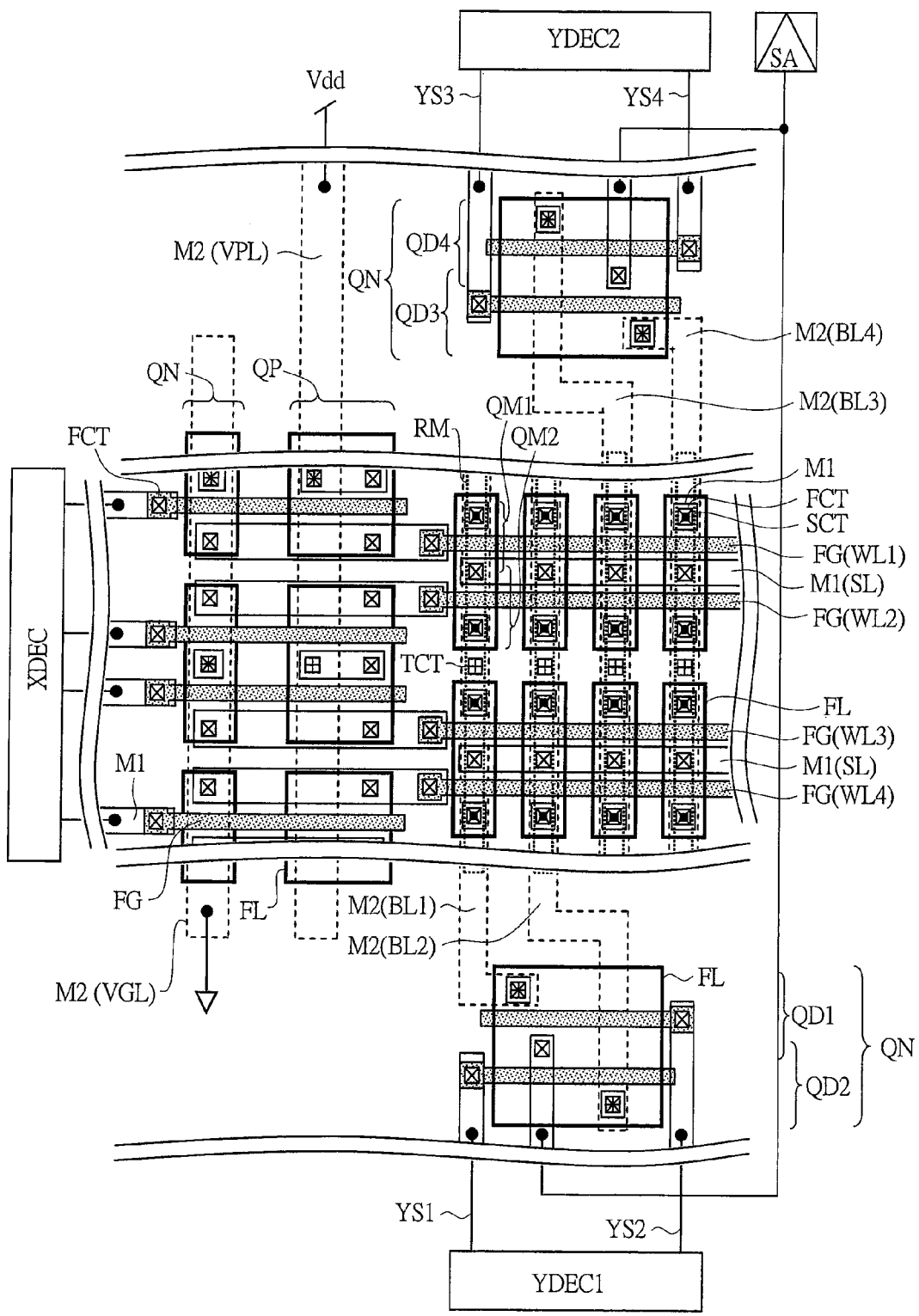
FIG. 2 is a layout diagram corresponding to the circuit of FIG. 1.

FIG. 1 is a circuit diagram showing a configuration example around a memory cell array included in a semiconductor device according to a first embodiment of the present invention. FIG. 2 is a layout diagram corresponding to the circuit of FIG. 1. In FIGS. 1 and 2, for preventing the description from being complicated, the illustration of word lines and bit lines which are generally disposed in large numbers is simplified, and four word lines WL1 to WL4 and four bit lines BL1 to BL4 are shown. Also, a memory cell array shown in FIGS. 1 and 2 is known as a NOR-type and can perform high-speed reading, and is therefore suitable for storage of system program and others. Accordingly, the memory cell array is used for a single memory chip or an embedded logic LSI such as a microcomputer.

In FIG. 1, memory cells MC11 to MC14 are electrically connected to the word line WL1. Similarly, memory cells MC21 to MC24, MC31 to MC34, and MC41 to MC44 are electrically connected to the word lines WL2, WL3 and WL4, respectively. Also, the memory cells MC11, MC21, MC31 and MC41 are electrically connected to the bit line BL1. Similarly, memory cells MC12 to MC42, MC13 to MC43, and MC14 to MC44 are electrically connected to the bit lines BL2, BL3 and BL4, respectively.

Each of the memory cells MC includes one memory cell transistor QM formed of a MIS (Metal Insulator Semiconductor) transistor and one memory element RM connected in series to the memory cell transistor. Each of the word lines WL is electrically connected to a gate of the memory cell transistor QM constituting each memory cell MC. Each of the bit lines BL is electrically connected to the memory element RM constituting each memory cell MC. Also, an end of each memory cell transistor QM on a side different from that of the memory element RM is electrically connected to a source line SL.

The word lines WL1 to WL4 are driven by word drivers WD1 to WD4, respectively. The signal from the X address decoder XDEC determines which word drivers WD are to be selected. Here, a reference symbol VPL denotes a power supply line, Vdd denotes power supply voltage, and VGL denotes a potential extraction line of each word driver. Note that, here, the potential extraction line VGL is fixed at ground voltage.

One ends of the bit lines BL1 to BL4 are connected to a sense amplifier SA through select transistors QD1 to QD4 formed of MIS transistors. Each of the select transistors QD is selected in accordance with an address input through a Y address decoder YDEC1 or YDEC2. In the configuration of the first embodiment, QD1 and QD2 are selected by YDEC1 and QD3 and QD4 are selected by YDEC2. The sense amplifier SA detects and amplifies a signal read from the memory cell MC through the select transistor QD. Note that, although not shown in the figure, circuits for providing voltage or current for reading and writing are connected to each of the select transistors QD in addition to the sense amplifier SA.

In FIG. 2, a reference symbol FL denotes an active region, M1 denotes a first layer wiring, M2 denotes a second layer wiring, and FG denotes a gate electrode layer used as a gate of a MIS transistor formed on a silicon substrate. Also, a reference symbol FCT denotes a contact hole which connects between an upper surface of the active region FL and a lower surface of the first layer wiring M1, SCT denotes a contact hole which connects between an upper surface of the first layer wiring M1 and a lower surface of the memory element RM, and TCT denotes a contact hole which connects between an upper surface of the first layer wiring M1 and a lower surface of the second layer wiring M2.

The memory element RM is extended to the second layer wiring M2 through the contact hole TCT between the memory cells electrically connected to the same bit line. The second layer wiring M2 is used as the bit lines BL. The word lines WL1 to WL4 are formed from a gate electrode layer FG. A stacked layer of polysilicon and silicide (alloy of silicon and high melting point metal) or the like is used for the gate electrode layer FG. Also, for example, the memory cell transistor QM1 constituting the memory cell MC11 shares a source region with the memory cell transistor QM2 constituting the memory cell MC21, and the source region is connected to a source line SL serving as the first layer wiring M1 through a contact hole.

The bit lines BL1 to BL4 are connected to source sides of the select transistors QD1 to QD4 disposed in the periphery of the memory cell array. The select transistors QD1 and QD2 share a drain region, and the select transistors QD3 and QD4 share a drain region. These select transistors QD have a function to select a specified bit line upon reception of a signal from the Y address decoder YDEC1 or YDEC2. Note that, for example, the select transistors QD are of n-channel type in the first embodiment.

Figure 3:
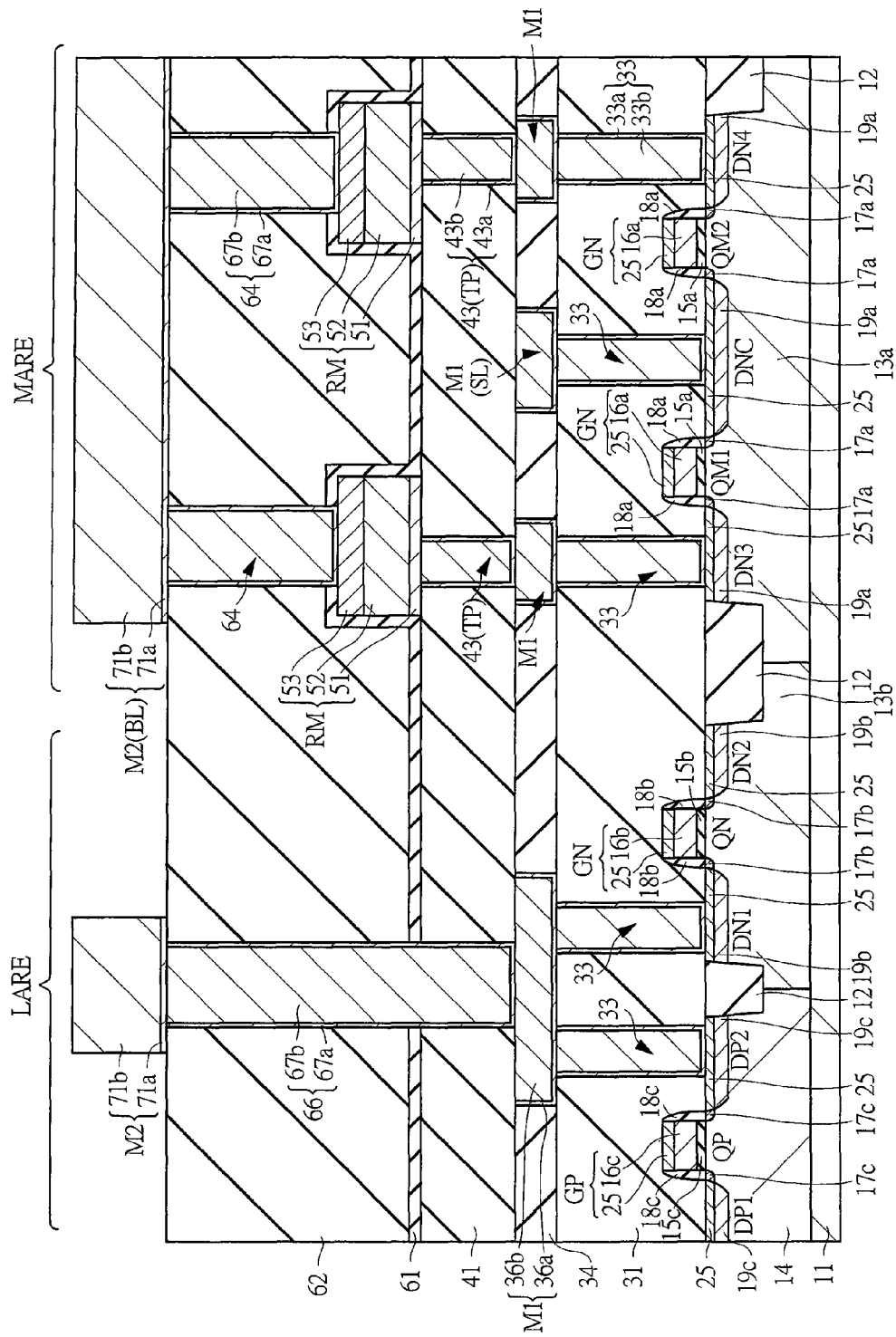
FIG. 3 is a cross sectional view schematically showing a configuration example of a main portion in the semiconductor device of FIG. 2.

FIG. 3 is a cross sectional view schematically showing a configuration example of a main portion in the semiconductor device of FIG. 2. In FIG. 3, a cross sectional configuration of a main portion of a memory cell region MARE and a logic circuit region LARE is shown schematically. In the memory cell region MARE, the memory cells MC including the memory cell transistor QM as shown in FIG. 2 are arranged in an array. In the logic circuit region LARE, for example, several types of memory peripheral circuits including the sense amplifier as shown in FIG. 2 and the like are disposed, and a plurality of several types of logic circuits are additionally disposed in the case of a semiconductor device in which a logic and a memory are disposed in combination. Note that, in FIG. 3, for the simplification of the understanding, the memory cell region MARE and the logic circuit region LARE are shown next to each other. However, a positional relation of the memory cell region MARE and the logic circuit region LARE in a cross section can be modified according to need.

As shown in FIG. 3, for example, element isolation regions 12 are formed on a main surface of a semiconductor substrate (semiconductor wafer) 11 made of a p-type single crystal silicon, and p-type wells 13$a$ and 13$b$ and a n-type well 14 are formed in the active regions isolated by the element isolation regions 12. Of these, the p-type well 13$a$ is formed in the memory cell region MARE, and the p-type well 13$b$ and the n-type well 14 are formed in the logic circuit region LARE. On the p-type well 13$a$ in the memory cell region MARE, memory cell transistors QM1 and QM2 formed of n-channel type MIS transistors are formed. On the p-type well 13$b$ in the logic circuit region LARE, a n-channel type MIS transistor QN is formed, and on the n-type well 14 in the logic circuit region LARE, a p-channel type MIS transistor QP is formed.

The memory cell transistors QM1 and QM2 are formed separately from each other on the p-type well 13$a$, and each of them has a gate insulator 15$a$ on a surface of the p-type well 13$a$ and the gate electrode 16$a$ on a gate insulator 15$a$. On a sidewall of the gate electrode 16$a$, a sidewall (sidewall spacer) 18$a$ made of a silicon oxide film, a silicon nitride film, or a stacked film thereof is formed. In the p-type well 13$a$, a semiconductor region (n-type impurity diffused layer) DN3 serving as a drain region of QM1, a semiconductor region (n-type impurity diffused layer) DN4 serving as a drain region of QM2, and a semiconductor region (n-type impurity diffused layer) DNC serving as a source region of QM1 and QM2 are formed.

Each of the semiconductor regions DN3, DN4 and DNC has LDD (Lightly Doped Drain) structure and is composed of a n$^-$-type semiconductor region 17$a$ and a n$^+$-type semiconductor region 19$a$ whose impurity concentration is higher than that of the semiconductor region 17$a$. The n$^-$-type semiconductor region 17$a$ is formed in the p-type well 13$a$ under the sidewall 18$a$, the n$^+$-type semiconductor region 19$a$ is formed in the p-type well 13$a$ outside the gate electrode 16$a$ and the sidewall 18$a$, and the n$^+$-type semiconductor region 19$a$ is formed in the p-type well 13$a$ at a position apart from a channel region by a width of the n$^-$-type semiconductor region 17$a$. The semiconductor region DNC is a common source region shared by the memory cell transistors QM1 and QM2 next to each other formed in the same element active region.

The MIS transistor QN formed in the logic circuit region LARE has almost the same configuration as those of QM1 and QM2. More specifically, QN includes a gate insulator 15$b$ on a surface of the p-type well 13$b$ and a gate electrode 16$b$ on the gate insulator 15$b$, and a sidewall (sidewall spacer) 18$b$ made of silicon oxide or the like is formed on a sidewall of the gate electrode 16$b$. A n$^-$-type semiconductor region 17$b$ is formed in the p-type well 13$b$ under the sidewall 18$b$, and a n$^+$-type semiconductor region 19$b$ whose impurity concentration is higher than that of the n$^-$-type semiconductor region 17$b$ is formed outside the n$^-$-type semiconductor region 17$b$. By the n$^-$-type semiconductor region 17$b$ and the n$^+$-type semiconductor region 19$b$, source-drain regions (semiconductor region) DN1 and DN2 having a LDD structure of QN are formed.

The MIS transistor QP formed in the logic circuit region LARE includes a gate insulator 15$c$ on a surface of the n-type well 14 and a gate electrode 16$c$ on the gate insulator 15$c$, and a sidewall (sidewall spacer) 18$c$ made of silicon oxide or the like is formed on a sidewall of the gate electrode 16$c$. A p$^-$-type semiconductor region 17$c$ is formed in the n-type well 14 under the sidewall 18$c$, and a p$^+$-type semiconductor region 19$c$ whose impurity concentration is higher than that of the p$^-$-type semiconductor region 17$c$ is formed outside the p$^-$-type semiconductor region 17$c$. By the p$^-$-type semiconductor region 17$c$ and the p$^+$-type semiconductor region 19$c$, source-drain regions (semiconductor region) DP1 and DP2 having a LDD structure of QP are formed.

A metal silicide layer (for example, cobalt silicide ($CoSi_2$) layer) 25 is formed on each surface of the gate electrodes 16$a$, 16$b$ and 16$c$, the n$^+$-type semiconductor regions 19$a$ and 19$b$ and the p$^+$-type semiconductor region 19$c$. By this means, the reduction of diffusion resistance and contact resistance of the n$^+$-type semiconductor regions 19$a$ and 19$b$ and the p$^+$-type semiconductor region 19$c$ can be achieved.

On the semiconductor substrate 11, an insulator (interlayer insulating film) 31 is formed so as to cover the gate electrodes 16$a$, 16$b$ and 16$c$. The insulator 31 is made of, for example, a silicon oxide film or the like, and an upper surface of the insulator 31 is flatly formed so that the insulator 31 has almost the same height in the memory cell region MARE and the logic circuit region LAKE. Contact holes (opening portion, connection hole) are formed in the insulator 31, and plugs (contact electrode) 33 are formed in the contact holes. The plug 33 is formed from a conductive barrier film 33$a$ made of a titanium film, a titanium nitride film or a stacked film thereof formed on a bottom portion and a sidewall of the contact hole and a tungsten (W) film (main conductor film) 33$b$ formed on the conductive barrier film 33$a$ so as to fill the inside of the contact hole. The contact hole and the plug 33 are formed on the semiconductor regions DN1 to DN4, DNC, DP1 and DP2, and though not shown in the figure, on the gate electrodes 16$a$, 16$b$ and 16$c$.

On the insulator 31 in which the plugs 33 are embedded, an insulator 34 made of, for example, a silicon oxide film is formed, and a wiring (first wiring layer) M1 serving as a first layer wiring is formed in a wiring trench (opening portion) formed in the insulator 34. The wiring M1 is formed from a conductive barrier film 36$a$ made of a titanium film, a titanium nitride film or a stacked film thereof formed on a bottom portion and a sidewall of the wiring trench and a main conductor film 36b made of a tungsten (W) film formed on the conductive barrier film 36a so as to fill the inside of the wiring trench. The wirings M1 are electrically connected through the plugs 33 to the semiconductor regions DN1 to DN4, DNC, DP1 and DP2 and the gate electrodes 16a, 16b and 16c and others. In the memory cell region MARE, the wiring M1 connected through the plug 33 to the semiconductor region DNC for a source of QM1 and QM2 is the source line SL.

On the insulator 34 in which the wirings M1 are embedded, an insulator (interlayer insulating film) 41 made of, for example, a silicon oxide film is formed. In the memory cell region MARE, through holes (opening portion, connection hole) are formed in the insulator 41, and plugs (contact electrode) 43 are formed in the through holes. The plug 43 is formed from a conductive barrier film 43a made of a titanium film, a titanium nitride film or a stacked film thereof formed on a bottom portion and a sidewall of the through hole and a tungsten (W) film (main conductor film) 43b formed on the conductive barrier film 43a so as to fill the inside of the through hole. The plug 43 is connected to the memory element RM described later and functions as the lower electrode TP thereof. The through holes and the plugs 43 (lower electrode TP) are formed on the wirings M1 connected through the plugs 33 to the semiconductor regions DN3 and DN4 for the drains of QM1 and QM2 in the memory cell region MARE, and are electrically connected thereto.

In the memory cell region MARE, on the insulator 41 in which the plugs 43 are embedded, the memory elements RM formed from a peeling-preventing film (interface layer) 51, a recording layer (phase-change film, chalcogenide layer) 52 on the peeling-preventing film 51 and an upper electrode film (upper electrode) 53 on the recording layer 52 are formed. More specifically, the memory element RM is formed from a stacked pattern including the peeling-preventing film 51, the recording layer 52 and the upper electrode film 53.

The peeling-preventing film 51 is interposed between the insulator 41 in which the plugs 43 are embedded and the recording layer 52 and has a function to improve the adhesion (adhesiveness) therebetween and to prevent the recording layer 52 from being peeled off. Also, the peeling-preventing film 51 can function as a resistive layer for heat generation to heat the recording layer 52. The peeling-preventing film 51 is made of, for example, tantalum oxide or the like (for example, $Ta_2O_5$), and a film thickness thereof can be, for example, about 0.5 to 5 nm. Note that the peeling-preventing film 51 is desired to be formed, but depending on a case, the formation thereof can be omitted. In this case, the recording layer 52 is directly formed on the insulator 41 in which the plugs 43 are embedded.

The recording layer 52 can make a transition between two states (phase-change) such as a crystalline state and an amorphous state and has a function to store information by using a difference in resistance value between the two states. The recording layer 52 is made of, for example, a phase-change material (chalcogenide) including at least either indium (In) or gallium (Ga), germanium (Ge), antimony (Sb), and tellurium (Te) with an appropriate composition ratio. Although a detail is described later, in this recording layer 52, for example, a concentration of indium (In) (or gallium (Ga)) is different between the upper electrode 53 side and the lower electrode TP side.

The upper electrode 53 is made of a conductor film such as a metal film and is formed from a tungsten (W) film, a tungsten alloy film or the like, and a film thickness thereof can be, for example, about 50 to 200 nm. The upper electrode film 53 has a function to reduce a contact resistance between a plug 64 described later and the recording layer 52 and to prevent the recording layer 52 from sublimating when a conductive barrier film 67a is formed after forming a through hole for the plug 64.

Lower portions of the memory elements RM (lower surface of the peeling-preventing film 51) are electrically connected to the plugs 43 and are electrically connected through the plugs 43, the wirings M1 and the plugs 33 to the drain regions DN3 and DN4 of the memory cell transistors QM1 and QM2 in the memory cell region MARE. Therefore, the plug 43 is electrically connected to a lower surface side of the recording layer 52.

Also, on the insulator 41, an insulator 61 and an insulator (interlayer insulating film) 62 on the insulator 61 are formed so as to cover the memory elements RM. More specifically, the insulator 61 is formed on an upper surface of the upper electrode film 53, a sidewall of the recording film 52 and others, and the insulator 62 is formed as the interlayer insulating film on the insulator 61. A film thickness of the insulator 61 is smaller than that of the insulator 62 (for example, about several hundreds nm) and can be, for example, about 5 to 20 nm. The insulator 61 is made of, for example, a silicon nitride film, and the insulator 62 is made of, for example, a silicon oxide film. An upper surface of the insulator 62 is flatly formed so that the insulator 62 has almost the same height in the memory cell region MARE and the logic circuit region LARE.

In the memory cell region MARE, through holes (opening portion, connection hole) are formed in the insulators 61 and 62, and at least a part of the upper electrode film 53 of the memory element RM is exposed on a bottom portion of the through holes and plugs (contact electrode) 64 are formed in the through holes. The plug 64 is formed from a conductive barrier film 67a made of a titanium film, a titanium nitride film or a stacked film thereof formed on a bottom portion and a sidewall of the through hole and a tungsten (W) film (main conductor film) 67b formed on the conductive barrier film 67a so as to fill the inside of the through hole 63. An aluminum film or the like can be used instead of the tungsten film 67b. The through holes and the plugs 64 are formed on upper portions of the memory elements RM, and the plugs 64 are electrically connected to the upper electrode films 53 of the memory elements RM.

Also, in the logic circuit region LARE, a through hole (opening portion, connection hole) is formed in the insulators 41, 61 and 62, and an upper surface of the wiring M1 is exposed on a bottom portion of the through hole, and a plug (contact electrode) 66 is formed in the through hole. The plug 66 is formed from a conductive barrier film 67a made of a titanium film, a titanium nitride film or staked film thereof formed on a bottom portion and a sidewall of the through hole and a tungsten (W) film (main conductor film) 67b formed on the conductive barrier film 67a so as to fill the inside of the through hole. The through hole and the plug 66 are electrically connected to the wiring M1.

On the insulator 62 in which the plugs 64 and 66 are embedded, wirings M2 (second wiring layer) serving as a second layer wiring are formed. The wiring M2 is formed from, for example, a conductive barrier film 71a made of a titanium film, a titanium nitride film or stacked film thereof and an aluminum (Al) film or an aluminum alloy film (main conductor film) 71b on the conductive barrier film 71a. Alternatively, a conductive barrier film similar to the conductive barrier film 71a may be formed on the aluminum alloy film 71b to form the wiring M2.

Here, the wiring M2 in the memory cell region MARE is a bit line BL, and the BL is electrically connected through the plugs 64 to the upper electrode films 53 of the memory elements RM. Therefore, the wiring M2 constituting the bit line BL in the memory cell region MARE is electrically connected through the plugs 64, the memory elements RM, the plugs 43, the wirings M1 and the plugs 33 to the drain regions DN3 and DN4 of the memory cell transistors QM1 and QM2.

Further, in the logic circuit region LARE, the wiring M2 is electrically connected through the plug 66 to the wiring M1, and further through the plugs 33 to the semiconductor region DN1 of the MIS transistor QN and the semiconductor region DP2 of the MIS transistor QP. Note that an insulator (not shown) serving as an interlayer insulating film is formed on the insulator 62 so as to cover the wirings M2, and upper wiring layers (wirings of third and subsequent layers) and others are formed thereon. However, the illustration and description thereof are omitted here.

In such a configuration, the memory cell of a phase-change memory is constituted of the memory elements RM and the memory cell transistors QM1 and QM2 connected thereto. The gate electrode 16a of each of the QM1 and QM2 is electrically connected to the word line WL (corresponding to word lines WL1 to WL4 in FIG. 2). One end of the memory element RM is electrically connected through the plug 64 to the bit line formed from the wiring M2 (corresponding to bit lines BL1 to BL4 in FIG. 2). The other end of the memory element RM is electrically connected through the plug 43 (lower electrode TP), the wiring M1, and the plug 33 to the semiconductor regions DN3 and DN4 for drains of the QM1 and QM2. Further, the semiconductor region DNC for drain of the QM1 and QM2 is electrically connected through the plug 33 to the source line SL of FIG. 2.

Note that the case where n-channel type MIS transistors are used for the memory cell transistors QM1 and QM2 of the phase-change memory has been described in the present embodiment. However, other field effect transistors such as p-channel type MIS transistors can be used instead. However, as memory cell transistors of a phase change memory, MIS transistors are preferably used in view of high integration, and n-channel type MIS transistors are more suitable compared with p-channel type MISFETs because n-channel type MIS transistors have a lower channel resistance in an ON state.

Figure 4:
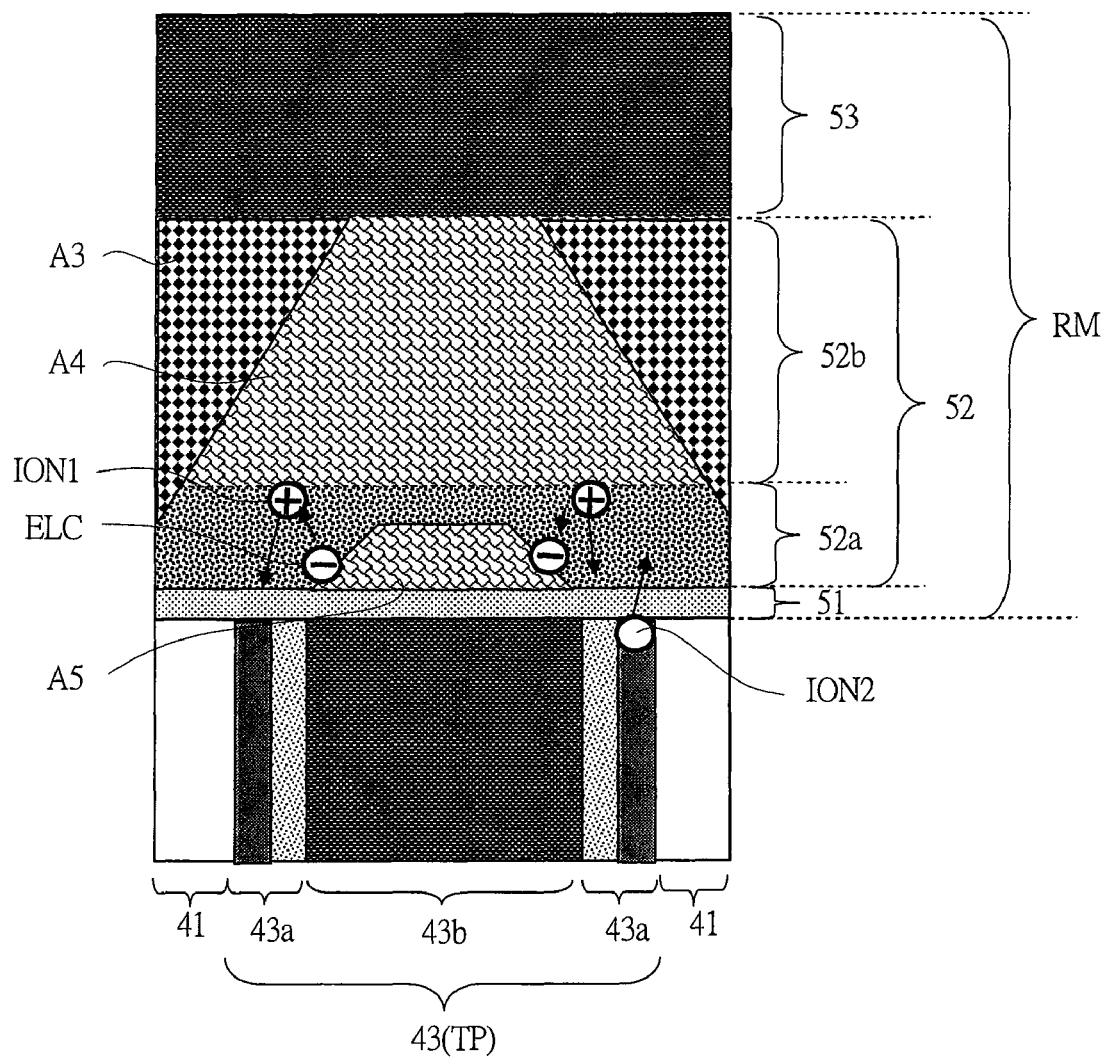
FIG. 4 is an explanatory diagram schematically showing one example of a detailed configuration around a memory element of FIG. 3 and its effect.
Figure 5A:
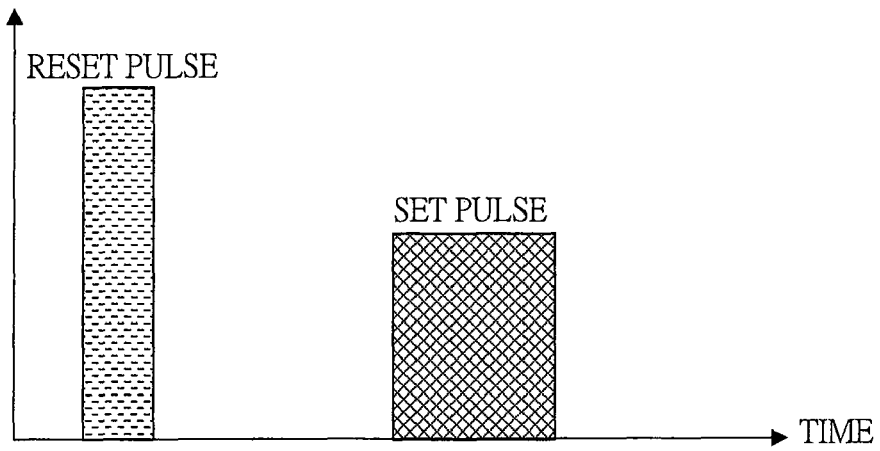
FIG. 5A shows an applied pulse shape and FIG. 5B shows temperature change in a recording layer by the applied pulse.
Figure 5B:
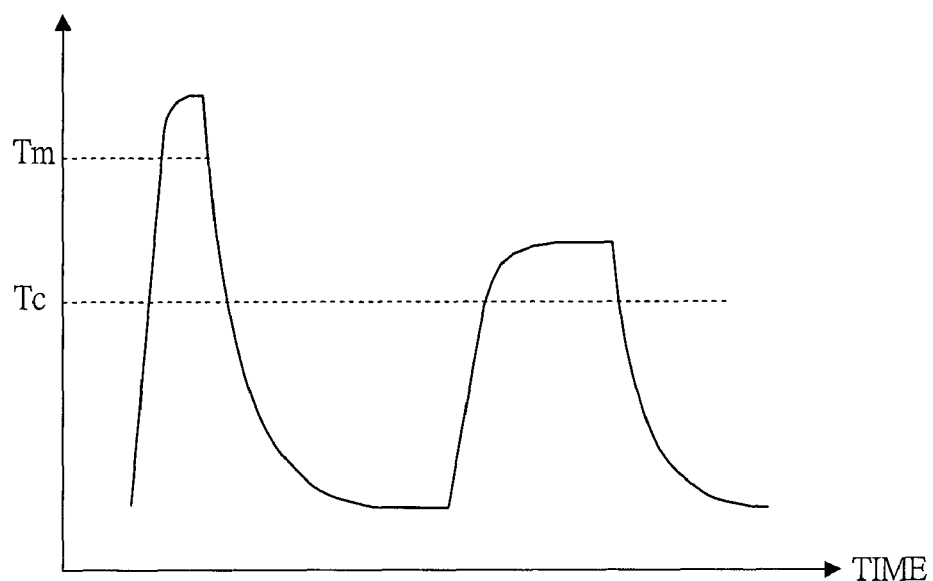

FIG. 4 is an explanatory diagram schematically showing an example of a detailed configuration around the memory element of FIG. 3 and an effect thereof. FIG. 5 is an explanatory diagram showing a pulse applied to the memory element of FIG. 4, and FIG. 5A shows an applied pulse shape and FIG. 5B shows temperature change in a recording layer by the applied pulse. As shown in FIG. 4, the memory element RM includes the recording layer (chalcogenide layer) 52 which stores information by causing a change in atomic arrangement, the upper electrode 53 formed on an upper surface of the recording layer 52, and the peeling-preventing film 51 formed below the recording layer 52. Also, the plug 43 (lower electrode TP) is connected to a lower surface of the peeling-preventing film 51 in the memory element RM.

As described with reference to FIG. 3, the upper electrode 53 is made of, for example, tungsten (W), and the peeling-preventing film 51 is made of, for example, tantalum oxide (for example, $Ta_2O_5$). Also, the lower electrode TP is formed from the conductive barrier film 43a and the main conductor film 43b, and the conductive barrier film 43a is made of, for example, a stacked film of titanium (Ti)/titanium nitride (TiN), and the main conductor film 43b is made of, for example, tungsten (W) or the like.

The recording layer 52 is made of, for example, a phase-change material (chalcogenide) containing at least either indium (In) or gallium (Ga), germanium (Ge), antimony (Sb), and tellurium (Te) with an appropriate composition ratio. Here, the recording layer 52 has a characteristic that a concentration of indium (In) (or gallium (Ga)) on the lower electrode TP side is higher than that on the upper electrode 53 side. As one example thereof, the recording layer 52 is formed to have a two layer structure, in which a first layer 52a on the lower electrode TP side is formed of a film having a high indium (In) concentration and a second layer 52b on the upper electrode 53 side stacked on the first layer 52a is formed of a film having an indium (In) concentration lower than that of the first layer 52a (or a film to which no indium (In) is added).

Note that the recording layer 52 is not limited to the two layer structure, and it may have more layer structure, that is, n ($\geq$2) layer structure. In this case, from the lower electrode TP side to the upper electrode 53 side, a first layer, . . . , a (n−1)-th layer, and a n-th layer are sequentially formed, and the concentration of indium (In) or others of the (n−1)-th layer is higher than that of the n-th layer. Alternatively, the recording layer 52 may have the structure that the concentration of indium (In) or others may be continuously lowered toward the upper electrode 53 side. In other words, this state is equivalent to the case where the n described above is quite large. Further, the group III element described above (indium (In) or gallium (Ga)) can be replaced with a group II element such as zinc (Zn) or cadmium (Cd) depending on cases.

In order for the recording layer 52 to make transition to a crystalline state (low-resistance state) or an amorphous state (high-resistance state), a reset pulse corresponding to the high-resistance state or a set pulse corresponding to the low-resistance state is applied (supplied) to the recording layer 52 through the lower electrode TP. Then, a chalcogenide material is heated by resultant Joule heat, so that atomic arrangement thereof is changed to be in a crystalline state or an amorphous state, thereby storing information. Note that an applied pulse generally has a specification in which the set pulse is longer in time and lower in voltage or current than the reset pulse as shown in FIG. 5A.

When the reset pulse is applied to form a high-resistance state, a chalcogenide material is heated to its melting point Tm or higher by Joule heat to be in a molten state. After stopping the pulse application, the molten chalcogenide material is rapidly cooled. As shown in the temperature change of the chalcogenide material at this time, when a cooling rate after stopping the pulse application is sufficiently large, a random atomic arrangement in liquid state is frozen, and a region except the region A3 including the regions A4 and A5 of FIG. 4 becomes an amorphous state. Note that, similar to the region A1 described in FIG. 35, the region A3 is a crystallized region from an initial state. In the amorphous state, the recording layer 52 has high resistance, and the memory element RM is in a high-resistance state.

On the other hand, when the set pulse is applied to form a low-resistance state and a chalcogenide material is heated to its crystallization temperature Tc or higher by Joule heat and retained for a certain period as shown in FIG. 5B, the region including the regions A4 and A5 in an amorphous state becomes a crystalline state. At this time, in a configuration example of FIG. 4, since a concentration of indium (In) is low in the second layer 52b, the atomic arrangement change (crystallization) occurs also in the region A4 therein at an early stage in time series. Further, in the recording layer 52, the atomic arrangement change (crystallization) occurs so as to expand from the region A5 on the lower electrode TP side where heat generation easily occurs to the upper electrode 53 side (so as to be connected to the region A4). In this crystalline state, the recording layer 52 has a low resistance compared with an amorphous state, and the memory element RM is in a low-resistance state.

Figure 35:
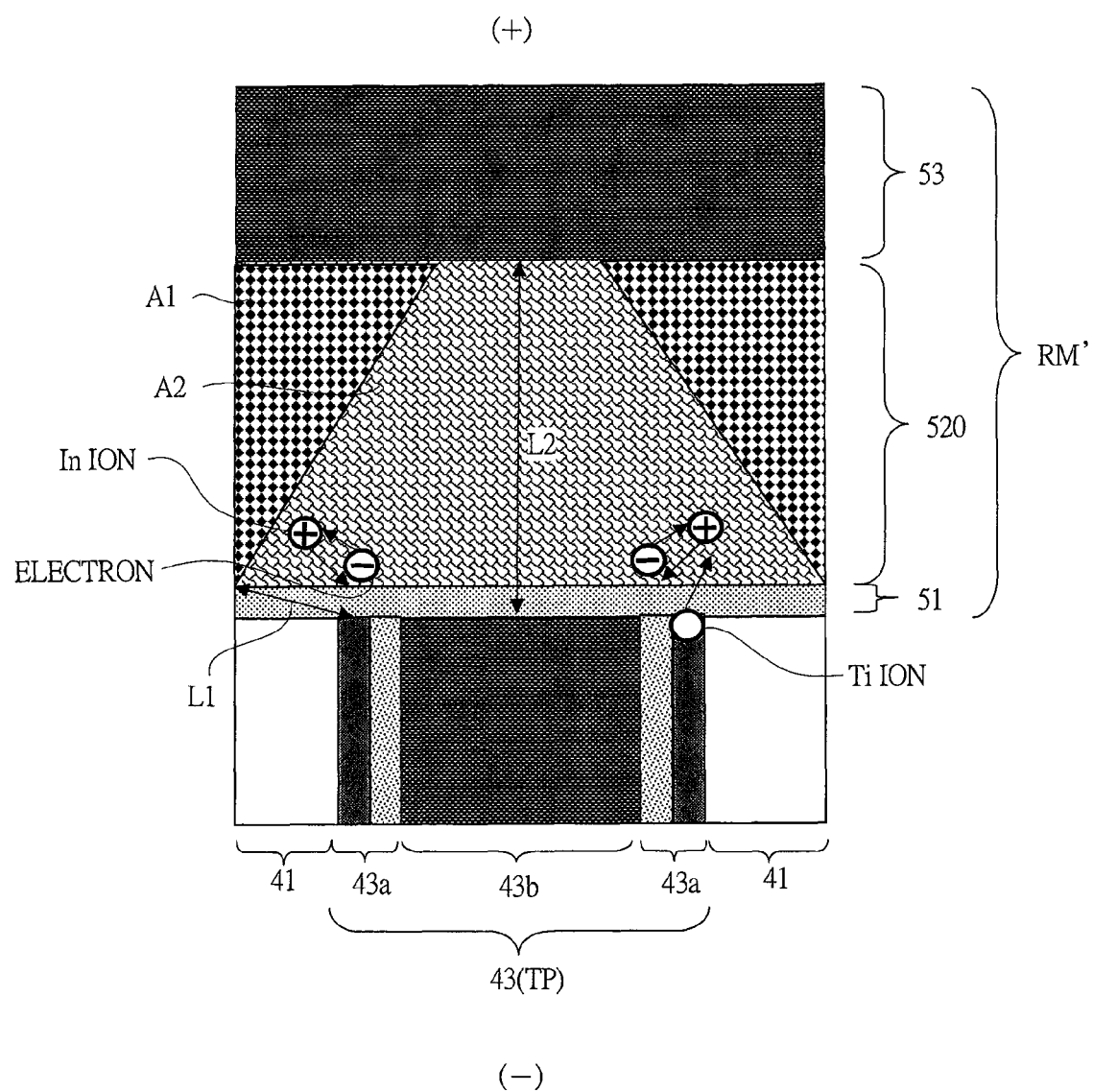
FIG. 35 is an explanatory diagram schematically showing a cross-sectional configuration example around a phase-change memory element and a problem thereof in a semiconductor device studied as a premise of the present invention.

Note that, when multicomponent crystals are minute and have different compositions from each other like in the recording layer 520 of FIG. 35 described above, a large disturbance of the atomic arrangement occurs at their interface, so that the resistance value in the crystalline state becomes relatively higher than that in the amorphous state in some cases. However, since the region A4 in the second layer 52b is formed with relatively large crystal grains in the configuration example of FIG. 4, such a situation hardly occurs.

By supplying a current (by applying a pulse) to the memory element RM to change the atomic arrangement of the chalcogenide material in this manner, information can be recorded. In the reading of the recorded information, a voltage or current at a level lower than that of the set pulse or reset pulse is applied so as not to change the state of the chalcogenide material, thereby reading the resistance value of the memory element RM. The resistance at the time of reset (high-resistance state) is higher than that at the time of set (low-resistance state), and the ratio thereof is, for example, 10 to 1 to 1000 to 1 or more.

As described above, by changing the concentration of indium (In) in the recording layer 52 as shown in FIG. 4, for example, the following effects can be obtained. First, since the concentration of indium (In) on the upper electrode 53 side is low, at the time of set, crystallization occurs also in the region A4 in addition to the region A5 at an early stage in time series. Therefore, at the time of set, current flows easily between the regions A5 and A4 closest to each other (that is, in film thickness direction (longitudinal direction)), so that a failure caused by the current flowing in a film surface direction (horizontal direction) as described in FIG. 35 can be reduced, and a stable data retention property can be realized.

Also, as described in FIG. 35, the further resistance increase occurs at high temperature due to the change in the atomic arrangement of the recording layer, and there is a possibility that a next set operation is affected. However, in the configuration example of FIG. 4, a portion where the change of the atomic arrangement occurs easily is limited to the first layer 52a whose indium (In) concentration is high. Therefore, even if the atomic arrangement is changed at this portion of the first layer 52a, since the region itself is smaller compared with the case of FIG. 35 and the region is on the lower electrode TP side which is heated easily at the time of set, the next set operation is not affected so much. Further, in the transition from an amorphous state to a crystalline state, since the region A4 is crystallized early and thus the resistance value is decreased early compared with the case of FIG. 35, the application of high voltage for a relatively long time between the upper electrode 53 and the lower electrode TP can be prevented. Therefore, movement of In ions (positive ion) ION1 is hard to occur, and the occurrence of resistance increase due to the segregation and structure disturbance can be suppressed.

In the manner as described above, a stable data retention property can be realized. Also, since indium (In) is added to the first layer 52a of the recording layer 52, even if the second layer 52b is crystallized at high temperature, the first layer 52a can maintain its amorphous state. Therefore, the upper electrode 53 and the lower electrode TP are not connected by low resistance, thereby being able to realize high heat-resistance property.

Next, the mechanism of the occurrence of a phase change in the chalcogenide material will be described with reference to FIG. 6. FIG. 6 is an explanatory diagram schematically showing the crystallization process of the chalcogenide material, in which FIG. 6A shows a crystal nucleation type and FIG. 6B shows a crystal growth type.

Figure 6A:
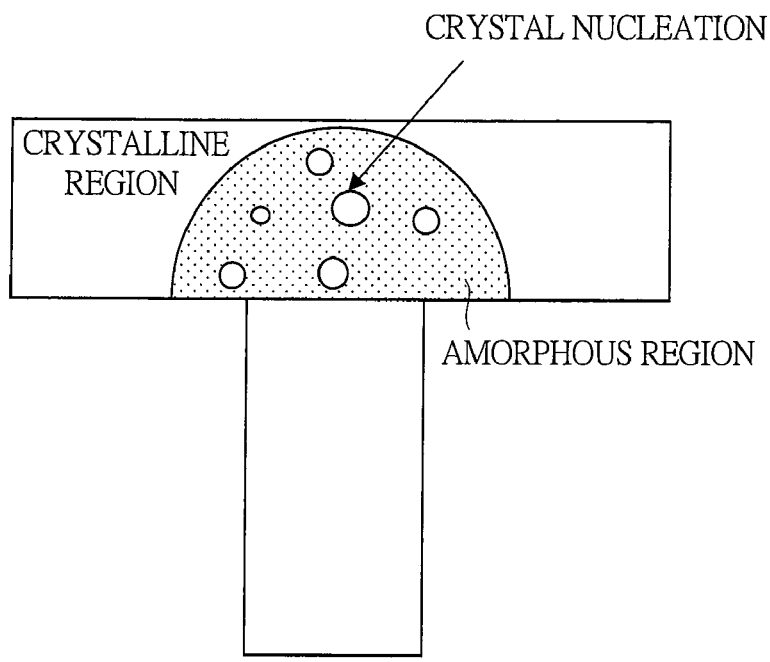
FIG. 6A shows a crystal nucleation type and FIG. 6B shows a crystal growth type.
Figure 6B:
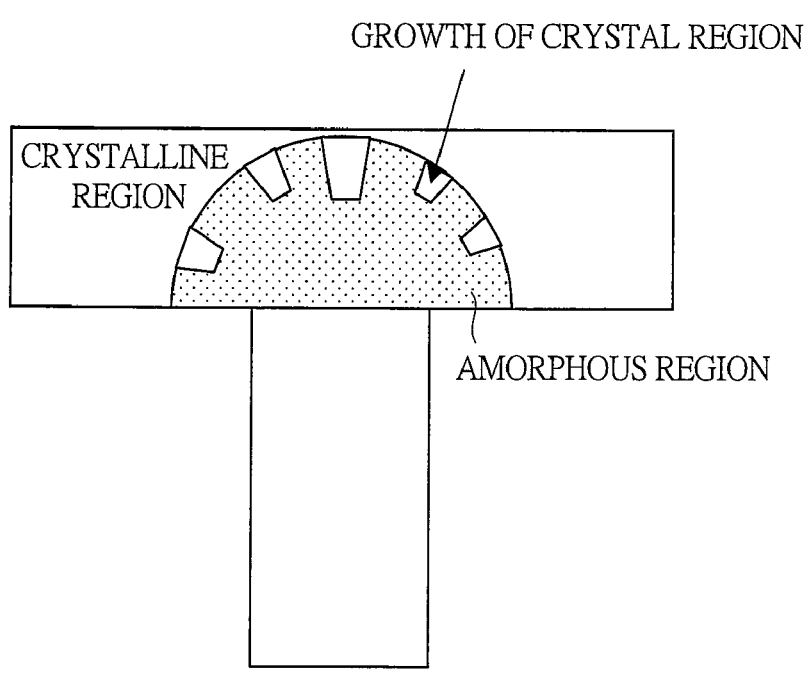

The crystal nucleation type shown in FIG. 6A is a type of a material in which many crystal nuclei are generated though the growth rate thereof is slow and many crystal grains are generated therefrom. Typical examples of the crystal-nucleation-type material include a material based on a pseudo-binary-system composition of GeTe—$Sb_2Te_3$ such as $Ge_2Sb_2Te_5$. On the other hand, in the crystal growth type shown in FIG. 6B, new crystal nuclei are hardly generated and crystal grains are extended from the crystalline region near the amorphous region because of the high crystal growth rate, whereby crystallization proceeds. The materials belonging to this crystal growth type are based on a $Sb_{70}Te_{30}$ eutectic material, and include Ag—In—Sb—Te, for example. Although both the crystal nucleation type and the crystal growth type include Sb (antimony) and Te (tellurium), the former contains Te as a main component and the latter contains Sb as a main component, and the crystallization mechanism significantly differs by this difference in composition.

Since the physics of a phase-change material determines a property as a memory in a phase-change memory and a phase-change optical disc, a lot of inventions for improving the material physics have been disclosed before. The Ag—In—Sb—Te as exemplified above is used widely as a phase-change recording material for an optical disc, and the material is based on $Sb_{70}Te_{30}$ eutectic alloy and improvement such as the addition of Ag and In is performed thereto for improving an optical property and the like.

Figure 7:
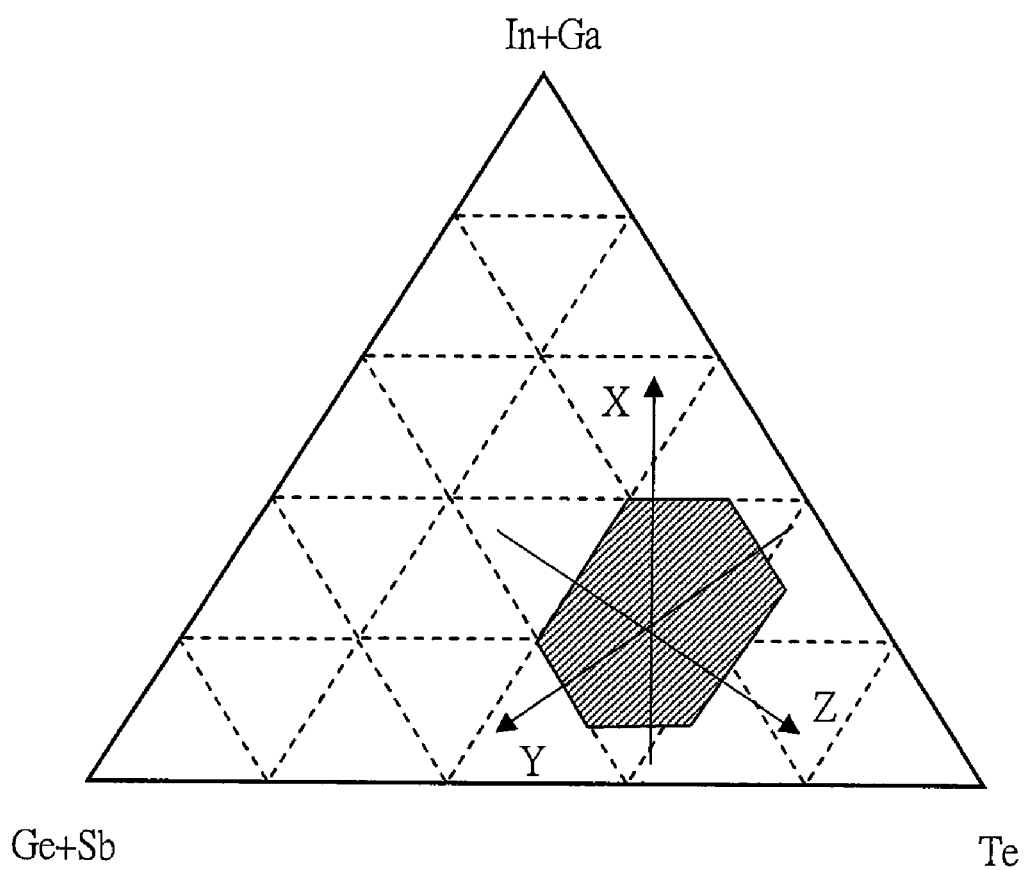
FIG. 7 is an explanatory diagram showing one example of a composition range of the recording layer in FIG. 4.
Figure 8:
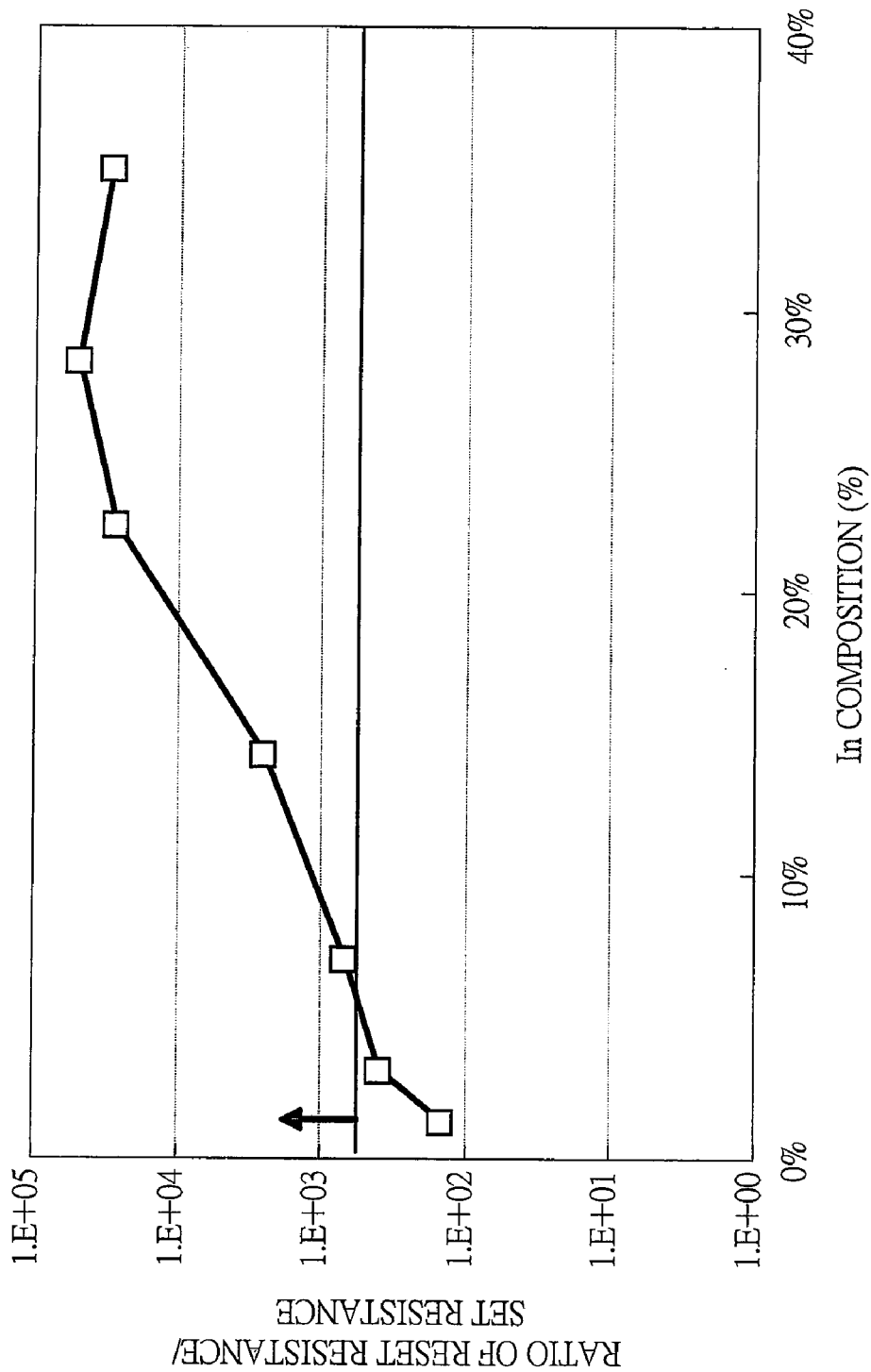
FIG. 8 is an explanatory diagram showing composition dependency of a reset resistance/set resistance ratio of the memory element in FIG. 4.
Figure 9:
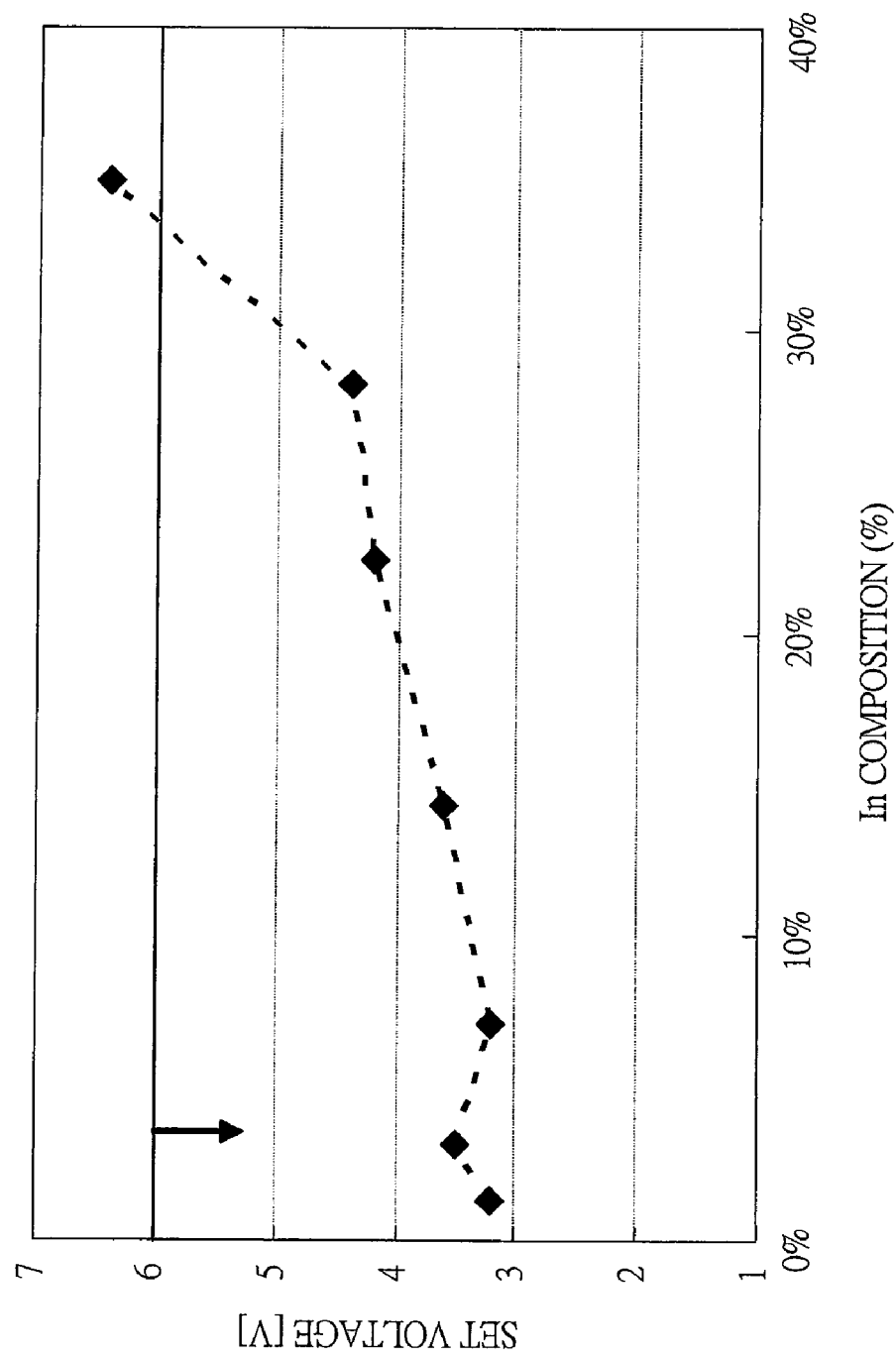
FIG. 9 is an explanatory diagram showing composition dependency of a set voltage of the memory element in FIG. 4.
Figure 10:
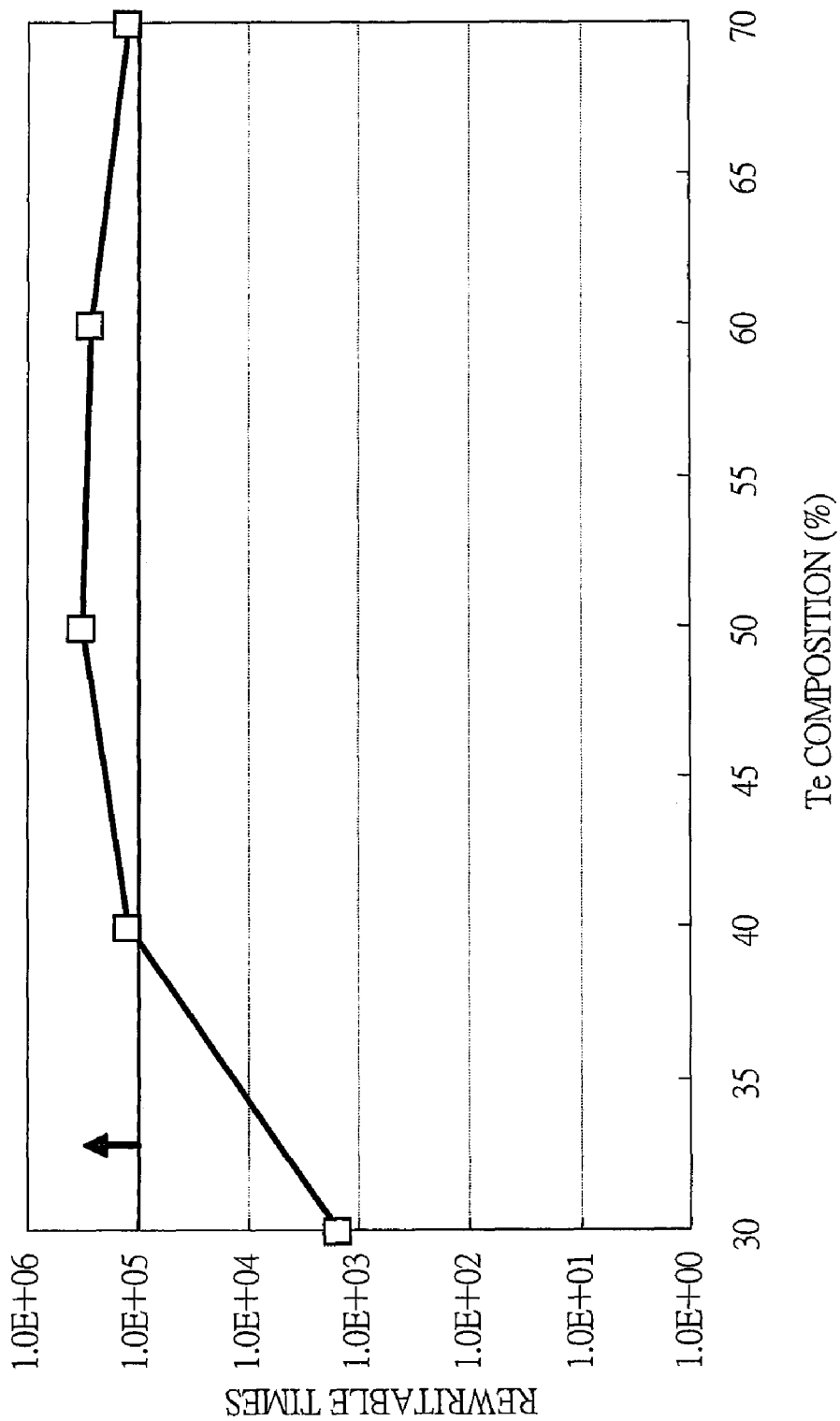
FIG. 10 is an explanatory diagram showing composition dependency of the number of rewritable times of the memory element in FIG. 4.
Figure 11:
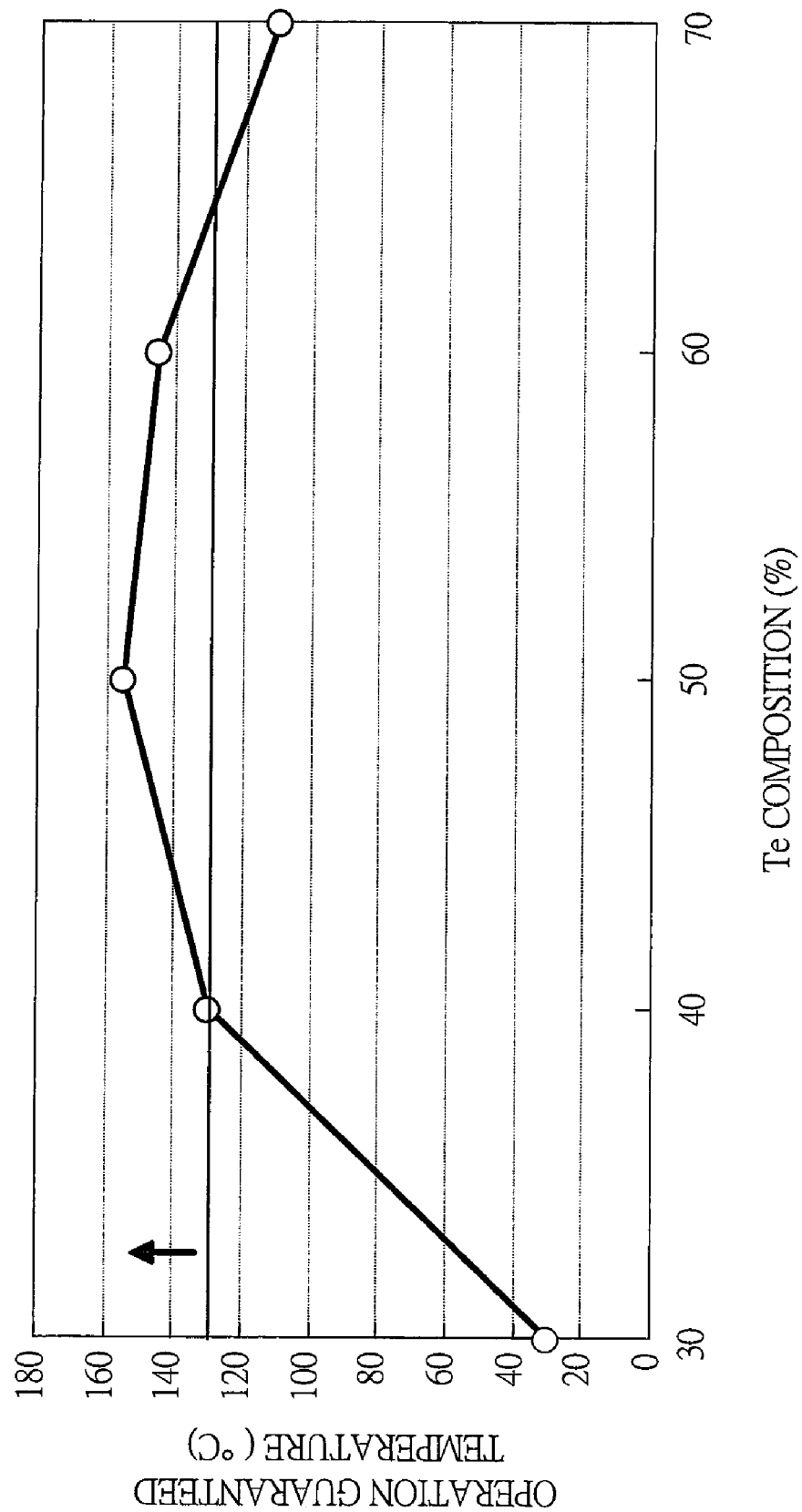
FIG. 11 is an explanatory diagram showing composition dependency of an operation guaranteed temperature of the memory element in FIG. 4.
Figure 12:
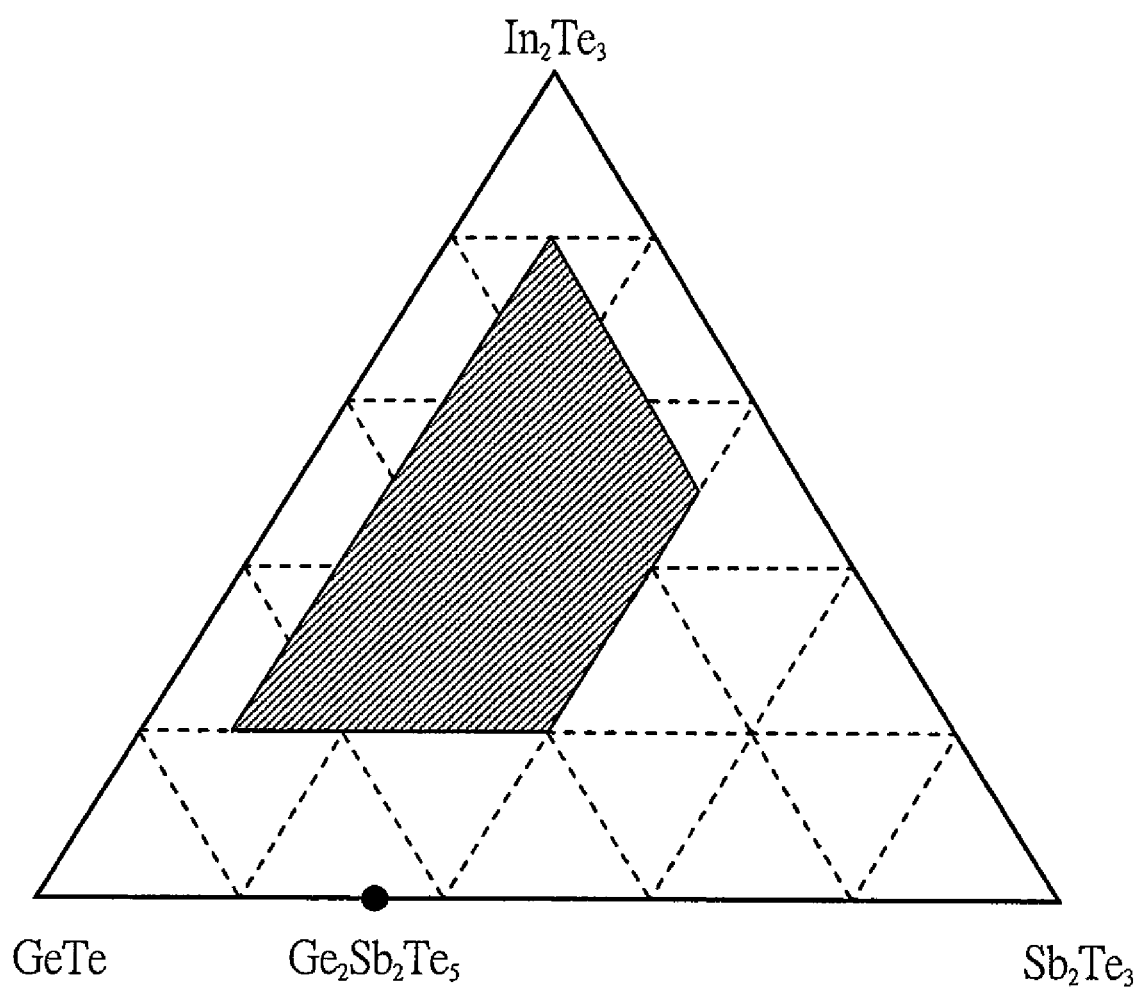
FIG. 12 is an explanatory diagram showing another example of a composition range of the recording layer in FIG. 4.

Next, the result of the studies for a preferable composition range of the recording layer 52 will be described with using an example in the case where the recording layer 52 is constituted of two chalcogenide layers having different compositions as shown in FIG. 4. First, in order to determine a composition range in which heat-resistance property of the first layer 52a is high and its memory property is good, a preferable composition range is studied for the case where the recording layer has a single layer structure. FIG. 7 is an explanatory diagram showing an example of a composition range of the recording layer in FIG. 4. FIG. 8 is an explanatory diagram showing composition dependency of a ratio of reset resistance/set resistance of the memory element in FIG. 4. FIG. 9 is an explanatory diagram showing composition dependency of a set voltage of the memory element in FIG. 4. FIG. 10 is an explanatory diagram showing composition dependency of the number of rewritable times of the memory element in FIG. 4. FIG. 11 is an explanatory diagram showing composition dependency of operation guaranteed temperature of the memory element in FIG. 4. FIG. 12 is an explanatory diagram showing another example of composition range the recording layer in FIG. 4. Note that composition dependencies of FIGS. 8 to 10 are those at room temperature.

A recording layer used in the studies is made of a phase-change material (chalcogenide material) containing, for example, at least either indium (In) or gallium (Ga), germanium (Ge), antimony (Sb) and tellurium (Te) with an appropriate composition ratio. When a memory element RM including such a recording layer is fabricated, composition dependencies of each of the properties are as those shown below, and a hatched range in FIG. 7 is obtained as a desirable composition.

The case where an In content is varied, that is, the composition dependency in an x-axis direction of FIG. 7 will be described. As shown in FIG. 8, a ratio of reset resistance/set resistance is increased as the amount of In increases. This is because the reset resistance (resistance value in amorphous state) is increased but an increasing effect of the set resistance (resistance value in crystalline state) is hardly observed. More particularly, when an In composition is 7% or more, the ratio of reset resistance/set resistance at room temperature exceeds 500 to 1. When In is not contained, the resistance ratio is about 100 to 1, but if In is added and the reset resistance at room temperature is increased 500 times or more, a resistance large ratio of 100 to 1 or higher can be maintained even when a value of the reset resistance is remarkably decreased in the use environment at high temperature of 130° C. or higher. In other words, high heat-resistance property can be obtained. Note that an electric resistance value in a high-resistance state is 5 MΩ or more at room temperature and is 500 kΩ or more at 130° C.

On the other hand, when the In composition is increased to 40%, as shown in FIG. 9, a set voltage required for a set operation is rapidly increased, which causes a problem in an actual operation. As described above, when the In concentration is 7 atomic % or lower, the reset resistance value is not increased, and also, since a data retention property is insufficient, an effect of an operation reliability at high temperature (heat-resistance property) cannot be obtained. On the other hand, when the In concentration is 40 atomic % or higher, resistance reduction becomes difficult and time and current amount required for the set operation are increased, and therefore, is not suitable for use.

The case where Ge and Sb contents are varied, that is, composition dependency in a y-axis direction of FIG. 7 will be described. When a total amount of Ge and Sb is 10 atomic % or less, heat-resistance property in a manufacturing process thereof is significantly decreased to sublime a chalcogenide material in the manufacturing process, thereby being impossible to continue the process. When Ge and Sb are small in amount, since In—Te bonding with strong ionicity is increased, Te tends to be sublimated. However, when Ge and Sb are present appropriately, since Ge—Te and Sb—Te bondings with strong covalent bond are formed, it is expected that the sublimation of Te is suppressed.

On the other hand, if the total amount of Ge and Sb is larger than 40 atomic %, there occur problems that the number of rewritable times is decreased and the amount of current required for a reset operation is increased. In particular, the number of rewritable times is decreased when the content of Ge is large, and the amount of current required for a reset operation is increased when the content of Sb is large. Further, if the total amount exceeds 40 atomic % even when the content of Ge and the content of Sb are approximately the same, the ratio of the reset resistance to the set resistance is disadvantageously decreased.

The case where a Te content is varied, that is, composition dependency in a z-axis direction of FIG. 7 will be described. The results showing in FIGS. 10 and 11 are those in the case where the Ge and Sb contents are adjusted to be equal to each other. As shown in FIG. 10, when Te is 40 atomic % or less, the reset operation is disabled by rewriting one hundred thousand times or less. On the other hand, as shown in FIG. 11, when Te is 65 atomic % or more, an operation guaranteed temperature thereof is lower than 130° C. and a requirement is not satisfied. As described above, when the Te content is small, phase-separation proceeds together with the rewriting, thereby being unable to perform the reset operation, and when it is too much, stability in a high-resistance state becomes insufficient, and a sufficient data retention property cannot be obtained.

Therefore, according to the detailed studies for the composition dependencies of the operation guaranteed temperature and the rewriting property described above, the conclusion that the hatched range shown in FIG. 7 is desired has been obtained. More specifically, a desirable composition range of the first layer 52a in the chalcogenide layer (recording layer 52) is that at least either indium or gallium is 7 atomic % or more and 40 atomic % or less, germanium is 5 atomic % or more and 35 atomic % or less, antimony is 5 atomic % or more and 25 atomic % or less, and tellurium is 40 atomic % or more and 65 atomic % or less. In this manner, in the first embodiment, it is possible to realize a memory element using a chalcogenide material having an excellent data retention property and a proper resistance value even in the use environment and manufacturing process at high temperature.

Also, a total amount obtained by summing the concentration of two elements of Ge and Sb is shown in FIG. 7. However, since both the elements provide different actions, these amounts can be adjusted so that both the elements can be contained within appropriate ranges. For example, in the case where a total amount of the Ge and Sb compositions is constant in the entire constituent elements, when a ratio of Ge is high, volume change due to the phase change is large, and peeling occurs at an interface between an electrode and a phase-change region by rewriting many times, and therefore, there occurs a problem that the number of rewritable times is limited. On the other hand, when a ratio of Sb is high, there occur problems that a current required for the rewriting is increased, the reset resistance is lowered, and the data retention property is decreased due to the instable amorphous state. FIG. 12 shows a more desirable composition range obtained in light of these points.

FIG. 12 shows an optimum composition in the case where the compositions of each vertex are set to GeTe, $Sb_2Te_3$, and $In_2Te_3$. As a matter of course, a part of each element can be replaced with an element of the same group element in the periodic table. For example, a part of In can be replaced with Ga or a part of Te can be replaced with Se. A composition range of FIG. 12 shows a preferable range in a composition of Ge, Sb, and In when a concentration of Te is about 50 to 60 atomic %. Since a framework of the NaCl structure is constituted of Te having a large atomic radius, if a Te concentration is near this composition, precipitation and phase separation of other components are hard to occur even if rewriting is performed many times, and therefore, it can be expected that high reliability can be obtained.

In the composition range shown in FIG. 12, when GeTe concentration is increased, a peeling occurs at an interface between a chalcogenide material and an electrode by rewriting many times, and the number of rewritable times is limited to one hundred thousand times, and thus this concentration is inappropriate. When $Sb_2Te_3$ concentration is increased, there occur the problems that the reset-resistance is lowered, a current amount required for the reset operation is increased, and the data retention property is decreased. Also, when $Sb_2Te_3$ concentration is lowered, there occurs a problem that a current amount required for the set operation is increased. Further, When $In_2Te_3$ concentration is lowered, the resistance ratio is decreased to 500 to 1 or less, and when it is increased, time and current amount required for the set operation are increased. By taking into consideration these points, the hatched region shown in FIG. 12 is obtained as a desirable range. A lowest and rightmost point of the composition range in FIG. 12 represents a composition in which the In content is lowest, and the content thereof is about 10.5 atomic %.

Note that, in the description above, the result of studies in the case of using the recording layer of the single layer structure has been shown. However, the result of studies can be applied also to the case of a two layer structure as shown in FIG. 4. More specifically, it is confirmed that the composition range determined in the single layer structure described above is optimum in the first layer 52a in the recording layer 52 of FIG. 4. Also, the In concentration in the recording layer is changed in the film thickness direction, the first layer 52a on the lower electrode TP side of FIG. 4 is adapted to have the optimum composition in the description above, and the In concentration of the second layer 52b thereon is set to be lower than that of the first layer 52a by 5 atomic % or more, whereby a heat-resistance property at 260° C. for 3 minutes can be obtained. At this time, the heat-resistance property described above can be obtained when the first layer 52a has a film thickness in the range of 10 nm or more and 40 nm or less. When the film thickness of the first layer 52a is much thinner than the range described above, since a crystallized region reaches the most part in a chalcogenide layer including the second layer 52b, there is a possibility that the heat-resistance property becomes insufficient, and when it is much thicker, a current readily flows in the film surface direction like in the case where no second layer 52b is provided, which becomes a cause of a failure such as a property variation between elements. When a boundary between the first layer and the second layer is clear, a preferable result can be obtained if a film thickness ratio between the first layer and the second layer is 1 to 0.5 or more and 5 or less. When the film thickness ratio of the second layer is smaller than this, an effect obtained by the two layer structure is not remarkable. Also, when the film thickness ratio of the second layer is larger than this, an excessive current is applied to the first layer when the second layer is crystallized, and a breakage thereof occurs in many cases.

A preferable range of a whole film thickness including the first layer 52a and the second layer 52b is 30 nm or more and 150 nm or less. It does not matter if the boundary between the first layer 52a and the second layer 52b is clear or not (that is, a composition thereof may be gradually changed). It is preferable that the average content of a group II or group III element in the upper second layer 52b in the film thickness direction is set to 0 to 15 atomic %, and the difference of the both average contents is set to 5 atomic % or more. When the In content in the second layer 52b is larger than 15 atomic % or the difference in the contents is smaller than that described above, various effects obtained by the two layer structure as described in FIG. 4 cannot be remarkably obtained.

Also, from a viewpoint of an average composition in the whole recording layer 52 of FIG. 4, since the second layer 52b with Ge—Sb—Te composition in which the In concentration is low or In is not contained is provided, the In content is lowered compared with the optimum composition range of the first layer 52a described above, and therefore, it can be said that the following range is particularly preferable. More specifically, in the average composition, In is in a range of 3 atomic % or more and 20 atomic % or less, Ge is in a range of 10 atomic % or more and 25 atomic % or less, Sb is in a range of 10 atomic % or more and 25 atomic % or less, and Te is in a range of 45 atomic % or more and 65 atomic % or less. Further, a more preferable range of the In average content is 7 atomic % or more and 15 atomic % or less. These ranges are almost the same even when In is replaced by Ga. However, the difficulty when Ga is used is that Ge is liquefied due to its low melting point when it is liberated in a film forming apparatus.

Also, according to another study result, by providing a high melting point material layer with a thickness of 1 nm or more and 5 nm or less at the interface between the first layer 52a and the second layer 52b to prevent an interdiffusion between the layers, a gentle decrease of a heat-resistance property caused by rewriting many times can be prevented. As the high melting point material layer, for example, an oxide such as tantalum pentoxide, a nitride such as tantalum nitride or silicon nitride, a carbonized material such as silicon carbide and others can be applied.

In the present embodiment, the chalcogenide material containing at least either Ga or In, Ge, Sb, and Te is shown. However, it is possible to replace a part of these elements by other elements. For example, a part of Te may be replaced by Se (selenium). Se has such effects that a data retention property is improved, it withstands for a longer period in a soldering process, and it can prevent oxidation in a manufacturing process. On the other hand, when the Se content exceeds one fifth of Te, the time required for the set operation becomes longer to 5 μs or more. Therefore, it is necessary to select and use the appropriate content in accordance with the usage within a range where such problems do not occur.

Also, for the purpose of speed-up of the set operation, at least one element of either Sn or Pb may be contained to replace a part or all of Ge, and Bi may be contained to replace a part or all of Sb. Since these elements can achieve the speed-up of the set operation while maintaining a solder-reflow resistance in a reset state, they do not hinder the effects described above. However, a retention lifetime in the reset state is slightly shortened. In addition, H, B, C, O, Si, P, S, As, Au, Ag, Cu, Ti, Zr, Hf, V, Nb, Ta, Cr, Mn, Fe, Co, Ni, Rh, and Pd of 10 atomic % or less may be contained. An improvement in the number of rewritable times can be expected by the addition of these elements.

Figure 13:
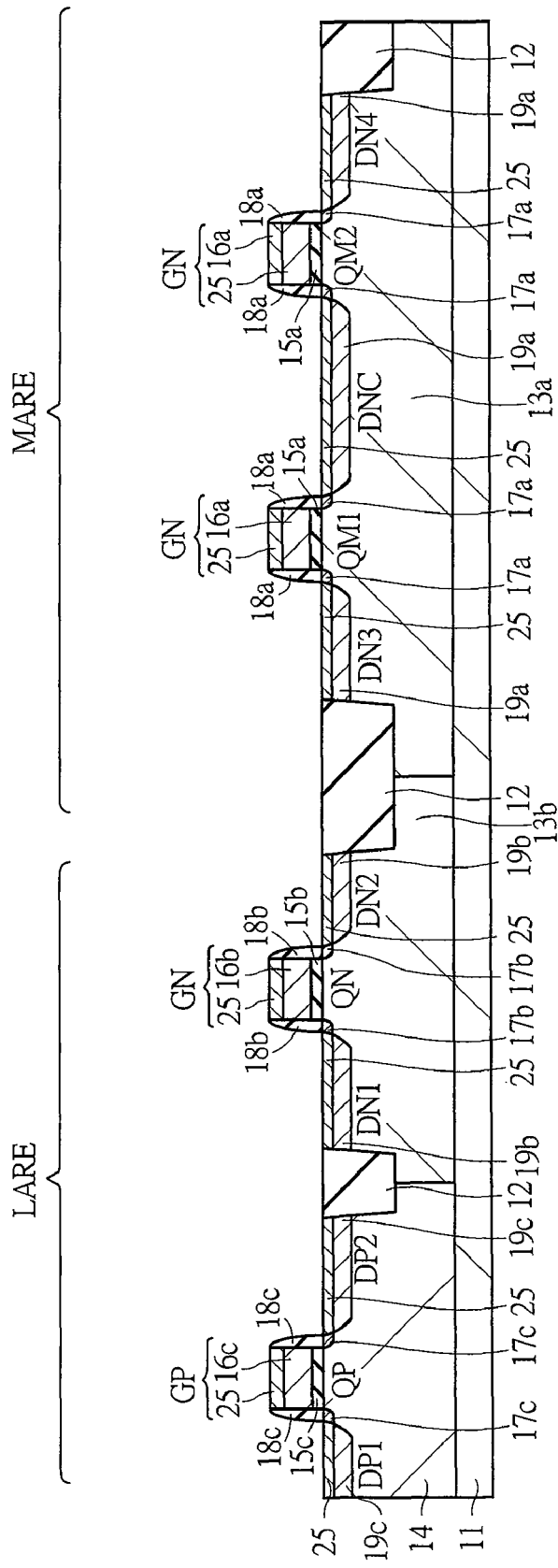
FIG. 13 is a cross sectional view schematically showing a configuration example of a main portion in a manufacturing process of the semiconductor device according to the first embodiment of the present invention.

Next, a manufacturing process of a semiconductor device of FIG. 3 will be described with reference to the drawings. FIGS. 13 to 23 are cross sectional views showing the main portions in a manufacturing process of a semiconductor device according to the first embodiment. First, MIS transistors as shown in FIG. 13 are formed by using a well-known manufacturing process. In FIG. 13, on a main surface of a semiconductor substrate (semiconductor wafer) 11 made of, for example, a p-type single crystal silicon, element isolation regions 12 made of an insulator are formed by STI (Shallow Trench Isolation) method, LOCOS (Local Oxidization of Silicon) method or the like. By the formation of the element isolation regions 12, active regions whose periphery is defined by the isolation regions 12 are formed on the main surface of the semiconductor substrate 11.

On the main surface of the semiconductor substrate 11, p-type wells 13a and 13b and a n-type well 14 are formed. Of these, the p-type well 13a is formed in the memory cell region MARE, and the p-type well 13b and the n-type well 14 are formed in the logic circuit region. Also, for example, by using thermal oxidation method and the like, an insulator 15 for a gate insulator made of a thin silicon oxide film or a silicon nitride film is formed on front surfaces of the p-type wells 13a and 13b and the n-type well 14. A film thickness of the insulator 15 can be, for example, about 5 to 10 nm. On the insulator 15, gate electrodes 16a, 16b and 16c made of a polycrystalline silicon film with low resistance are formed. Note that, by doping impurities in the film formation or after the film formation, the gate electrodes 16a and 16b become polysilicon films doped with a n-type impurity, and the gate electrode 16c becomes a polysilicon film doped with a p-type impurity.

Also, by the ion implantation of an n-type impurity or the like, the n⁻-type semiconductor regions 17a are formed in the regions on both sides of the gate electrode 16a of the p-type well 13a, and the n⁻-type semiconductor regions 17b are formed in the regions on both sides of the gate electrode 16b of the p-type well 13b. Also, by the ion implantation of a p-type impurity or the like, the p⁻-type semiconductor regions 17c are formed in the regions on both sides of the gate electrode 16c of the n-type well 14. On the sidewalls of the gate electrodes 16a, 16b and 16c, the sidewalls 18a, 18b and 18c are formed by, for example, depositing an insulator made of a silicon oxide film, a silicon nitride film, or a stacked film thereof on the semiconductor substrate 11 and then performing anisotropic etching to this insulator.

Further, by the ion implantation of a n-type impurity or the like, the $n^+$-type semiconductor regions 19a are formed in the regions on both sides of the gate electrode 16a and the sidewalls 18a of the p-type well 13a, and the $n^+$-type semiconductor regions 19b are formed in the regions on both sides of the gate electrode 16b and the sidewalls 18b of the p-type well 13b. Further, by the ion implantation of a p-type impurity or the like, the $p^+$-type semiconductor regions 19c are formed in the regions on both sides of the gate electrode 16c and the sidewalls 18c of the n-type well 14. Then, front surfaces of the gate electrodes 16a, 16b and 16c, the $n^+$-type semiconductor regions 19a and 19b, and the $p^+$-type semiconductor region 19c are exposed and a metal film such as a cobalt (Co) film is deposited and thermal process is performed thereto, whereby metal silicide layers 25 are formed on each of the front surfaces thereof. In this manner, a structure of FIG. 13 is obtained.

Figure 14:
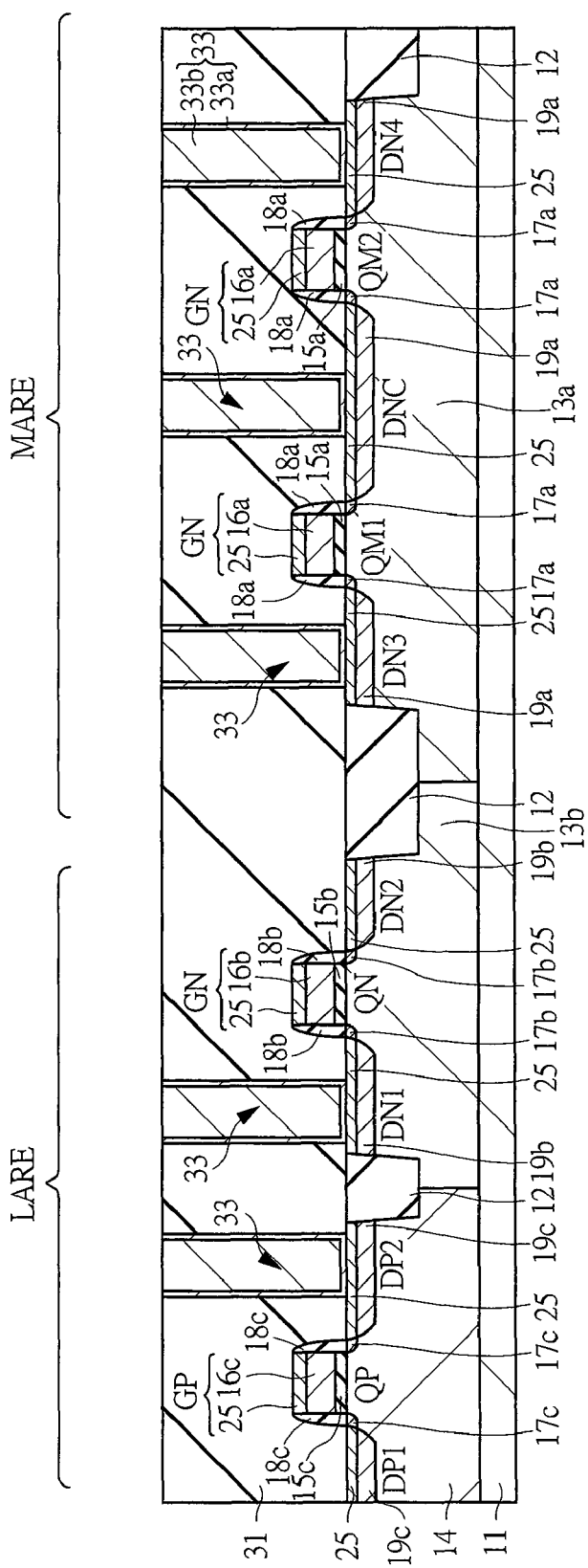
FIG. 14 is a cross sectional view schematically showing the semiconductor device in the manufacturing process continued from FIG. 13.

Next, as shown in FIG. 14, the insulator (interlayer insulating film) 31 is formed on the semiconductor substrate 11 so as to cover the gate electrodes 16a, 16b and 16c. The insulator 31 is made of, for example, a silicon oxide film or the like. The insulator 31 can be formed from a stacked layer of a plurality of insulators. After forming the insulator 31, CMP process or the like is performed according to need to planarize an upper surface of the insulator 31. Next, dry etching is performed to the insulator 31 with using a photoresist pattern (not shown) formed on the insulator 31 by a photolithography method as an etching mask, thereby forming contact holes in the insulator 31. At the bottom portion of the contact holes, a part of the main surface of the insulator 31, for example, a part of the semiconductor regions DN1 to DN4, DNC, DP1 and DP2 (metal silicide layers 25 thereof), a part of the gate electrodes 16a, 16b and 16c (metal silicide layers 25 thereof) or others are exposed.

Next, the plugs 33 are formed in the contact holes. At this time, for example, the conductive barrier film 33a is formed by sputtering or the like on the insulator 31 including the inside of the contact holes, and then the tungsten film 33b is formed by CVD or the like on the conductive barrier film 33a. Then, unnecessary portions of the tungsten film 33b and the conductive barrier film 33a on the insulator 31 are removed by CMP, an etch-back technique, and the like. In this manner, the plugs 33 formed of the tungsten film 33b and the conductive barrier film 33a left and embedded in the contact holes can be formed.

Figure 15:
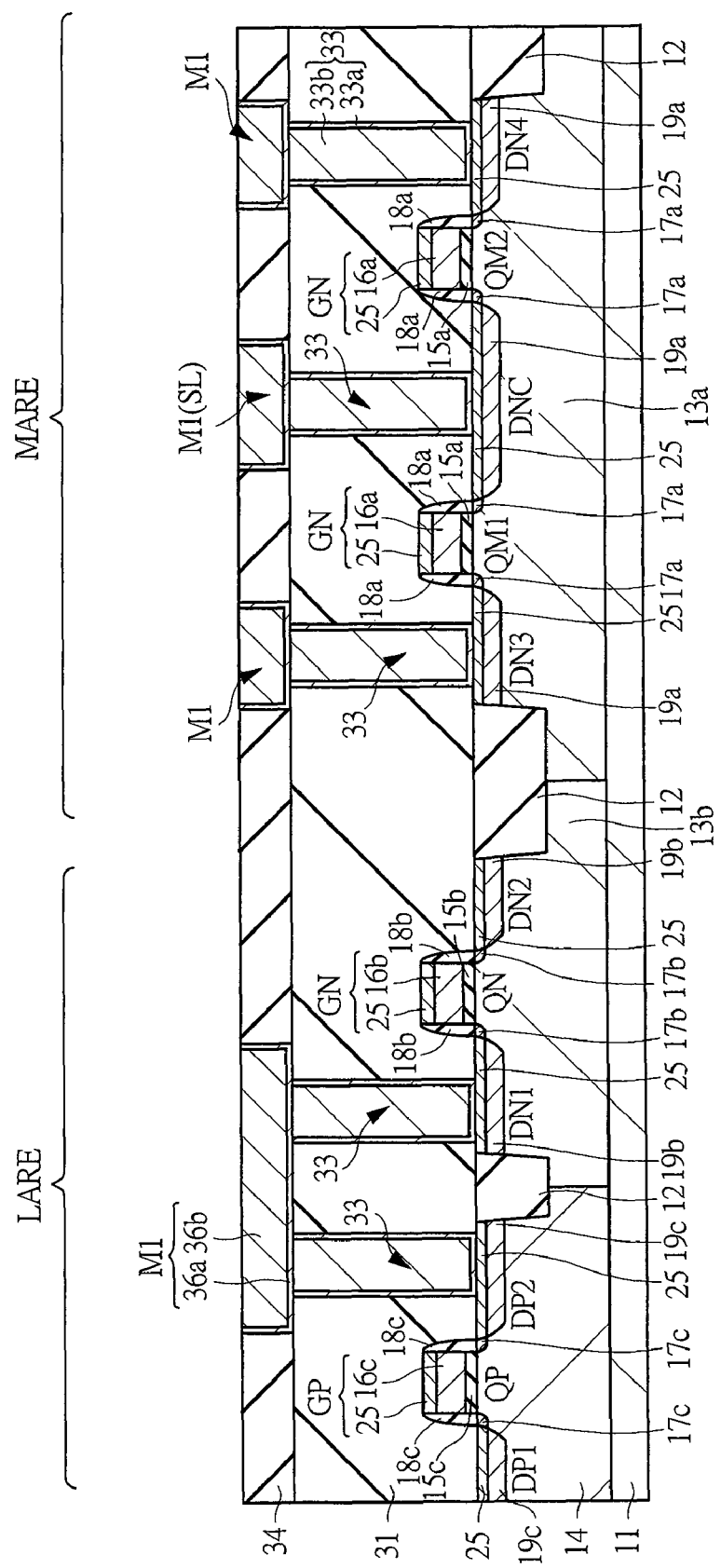
FIG. 15 is a cross sectional view schematically showing the semiconductor device in the manufacturing process continued from FIG. 14.

Next, as shown in FIG. 15, the insulator 34 is formed on the insulator 31 in which the plugs 33 are embedded. Then, with using a photoresist pattern (not shown) formed by using photolithography on the insulator 34 as an etching mask, dry etching is performed to the insulator 34, thereby forming wiring trenches in the insulator 34. At the bottom portion of the wiring trenches 35, the upper surfaces of the plugs 33 are exposed. Note that, of the wiring trenches, the wiring trenches which expose the plugs 33 formed on the drain regions (semiconductor regions DN3 and DN4) of the QM1 and QM2 in the memory cell region MARE can be formed as hole-shaped (connection-hole-shaped) patterns having planar dimensions larger than those of the plugs 33 exposed therefrom instead of trench-shaped patterns.

Next, the wirings M1 are formed in the wiring trenches. At this time, for example, after the conductive barrier film 36a is formed on the insulator 34 including the inside (bottom portion and sidewalls) of the wiring trenches by sputtering or the like, the main conductor film 36b made of a tungsten film or the like is formed thereon by CVD or the like, and then, unnecessary portions of the main conducive film 36b and the conductive barrier film 36a on the insulator 34 are removed by CMP, an etch-back technique, and the like. In this manner, the wirings M1 formed of the main conductor film 36b and the conductive barrier film 36a left and embedded in the wiring trenches 35 can be formed. Note that the wiring M1 is not limited to the above-described embedded tungsten wiring, and various modifications and alterations can be made. For example, a tungsten wiring other than the embedded tungsten wiring or an aluminum wiring can be used.

Figure 16:
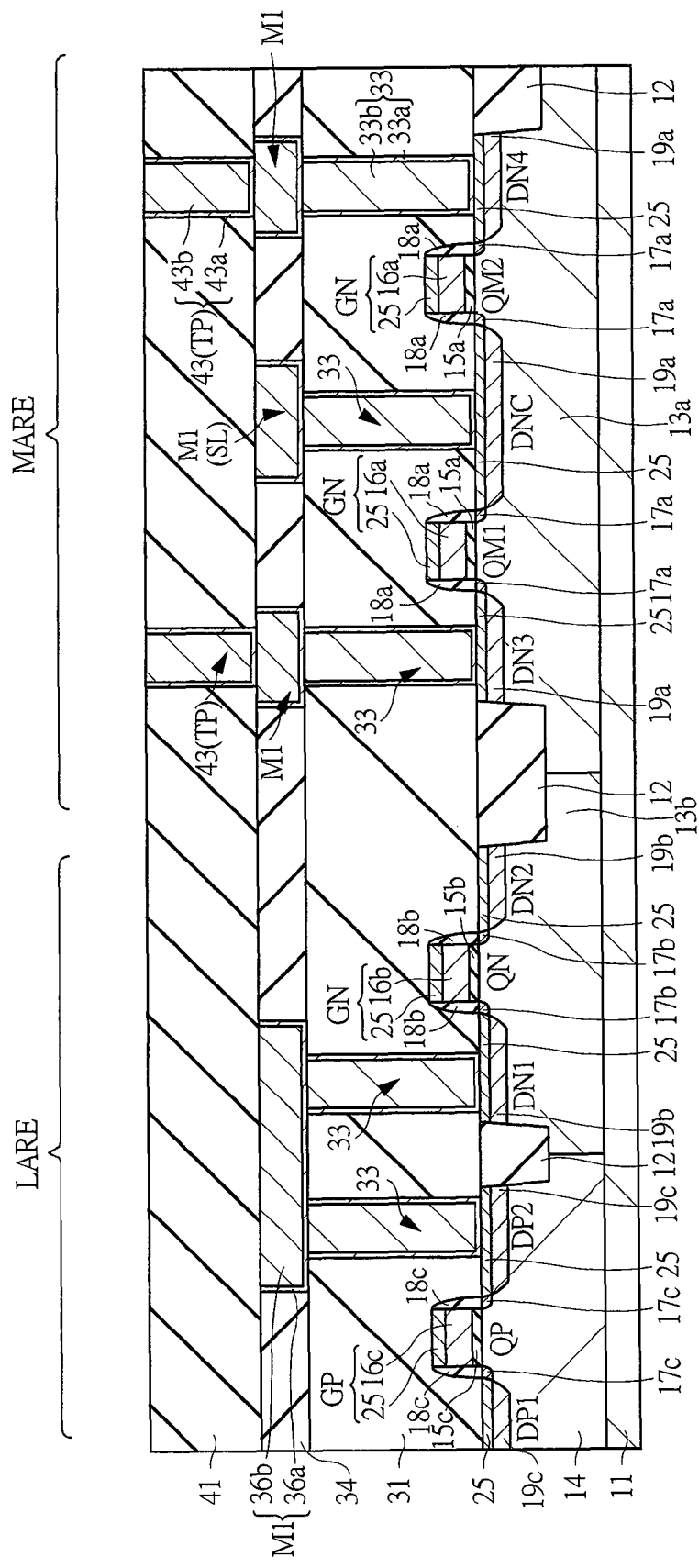
FIG. 16 is a cross sectional view schematically showing the semiconductor device in the manufacturing process continued from FIG. 15.

Next, as shown in FIG. 16, on the insulator 34 in which the wirings M1 are embedded, an insulator (interlayer insulating film) 41 is formed. Subsequently, with using a photoresist pattern (not shown) formed by using photolithography on the insulator 41 as an etching mask, dry etching is performed to the insulator 41, thereby forming through holes (opening portion, connection hole) in the insulator 41. The through holes are formed in the memory cell region MARE, and at the bottom portion of the through holes, an upper surface of the wiring M1 corresponding to the semiconductor regions DN3 and DN4 of the QM1 and QM2 is exposed.

Next, the plugs 43 are formed in the through holes. At this time, for example, after the conductive barrier film 43a is formed on the insulator 41 including the inside of the through holes by sputtering or the like, the tungsten film 43a is formed thereon by CVD or the like, and then, unnecessary portions of the tungsten film 43b and the conductive barrier film 43a on the insulator 41 are removed by CMP, an etch-back technique, and the like. In this manner, the plugs 43 formed of the tungsten film 43b and the conductive barrier film 43a left and embedded in the contact holes can be formed. As described above, the plugs 43 are formed by filling the opening portions (through hole) formed in the insulator 41 with a conductor material.

Note that, in the present embodiment, the plugs 43 are formed by filling the through holes with the tungsten film 43b. However, a metal film capable of improving the planarity of an upper surface of the plug 43 after the CMP process (metal with good CMP planarity) can be used instead of the tungsten film 43b. For example, as the metal with good CMP planarity, a molybdenum (Mo) film whose crystal grain size is small can be used instead of the tungsten film 43b. The metal with good CMP planarity has an effect to prevent a local phase-change in the recording layer 52 due to electric field concentration caused by an unevenness of the upper surface of the plug 43. As a result, uniformity of electric property, reliability of the number of rewritable times, and high-temperature-operation resistance property of a memory cell element can be further improved.

Figure 17:
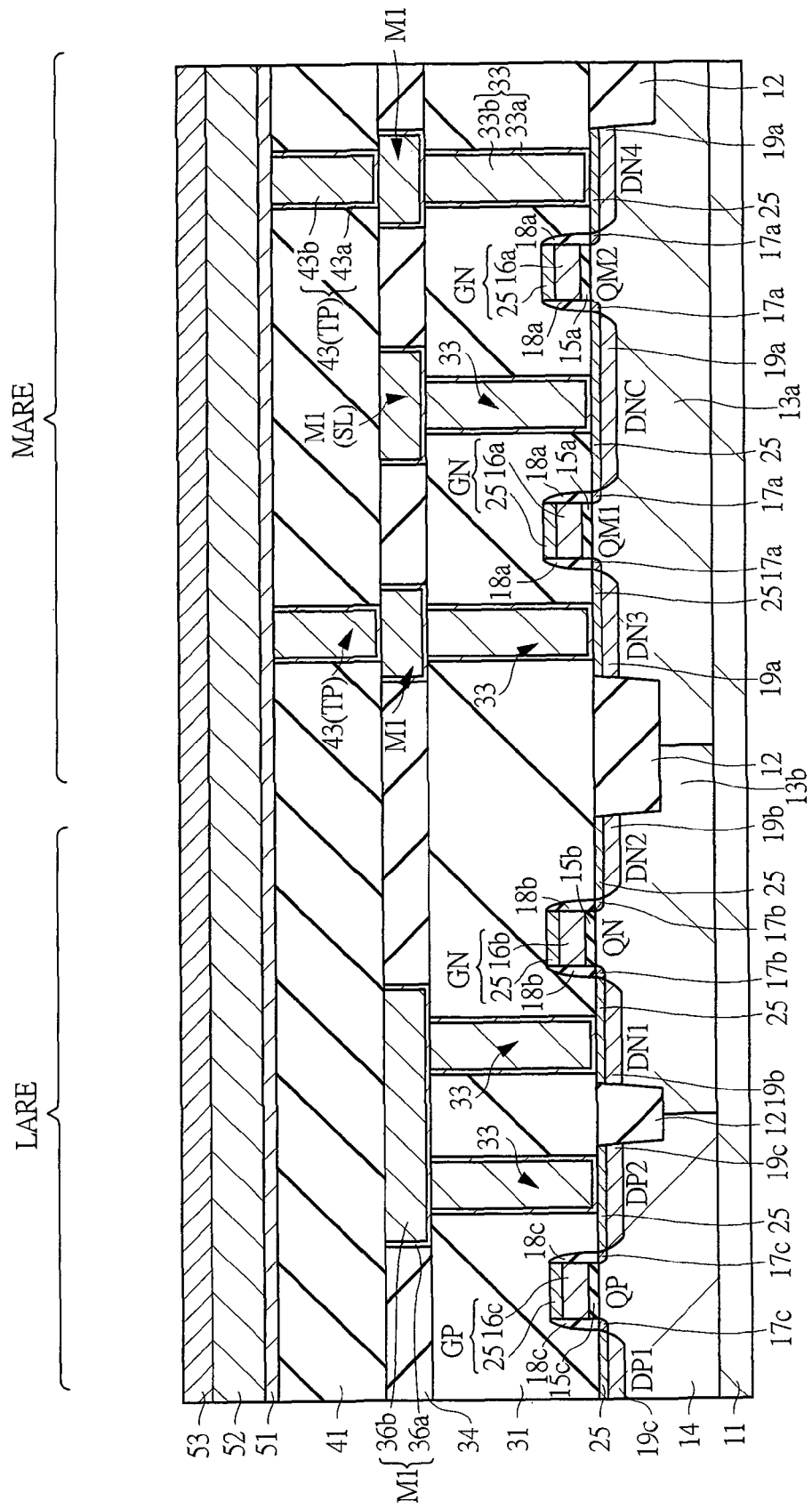
FIG. 17 is a cross sectional view schematically showing the semiconductor device in the manufacturing process continued from FIG. 16.

Next, as shown in FIG. 17, on the insulator 41 in which the plugs 43 are embedded, the peeling-preventing film 51, the recording layer 52, and the upper electrode film 53 are formed (deposited) in order. A film thickness (deposition thickness) of the peeling-preventing film 51 is, for example, about 0.5 to 5 nm, a film thickness (deposition thickness) of the recording layer 52 is, for example, about 50 to 150 nm, and a film thickness (deposition thickness) of the upper electrode film 53 is, for example, about 50 to 200 nm.

Here, when the recording layer 52 is formed, for example, the sputtering method using inert gas such as Ar, Xe and Kr and two kinds of targets is applied. First, for example, an $In_{30}Ge_{10}Sb_{10}Te_{50}$ layer with a film thickness of about 10 to 40 nm is formed as a first layer, and a $Ge_2Sb_2Te_5$ layer with a film thickness of about 40 to 110 nm is formed thereon as a second layer. Note that, instead of the $Ge_2Sb_2Te_5$ layer, a layer with an In concentration lower than that of the $In_{30}Ge_{10}Sb_{10}Te_{50}$ layer, for example, an $In_{10}Ge_{15}Sb_{20}Te_{55}$ layer can be formed for the second layer. In this case, there is a possibility that crystallization in an upper portion becomes difficult to some extent. However, an effect similar to the case of using the $Ge_2Sb_2Te_5$ layer can be obtained. Also, in the case of using sputtering equipment capable of sputtering two targets at the same time, a composition may be smoothly varied at a boundary portion of two layers.

Figure 18:
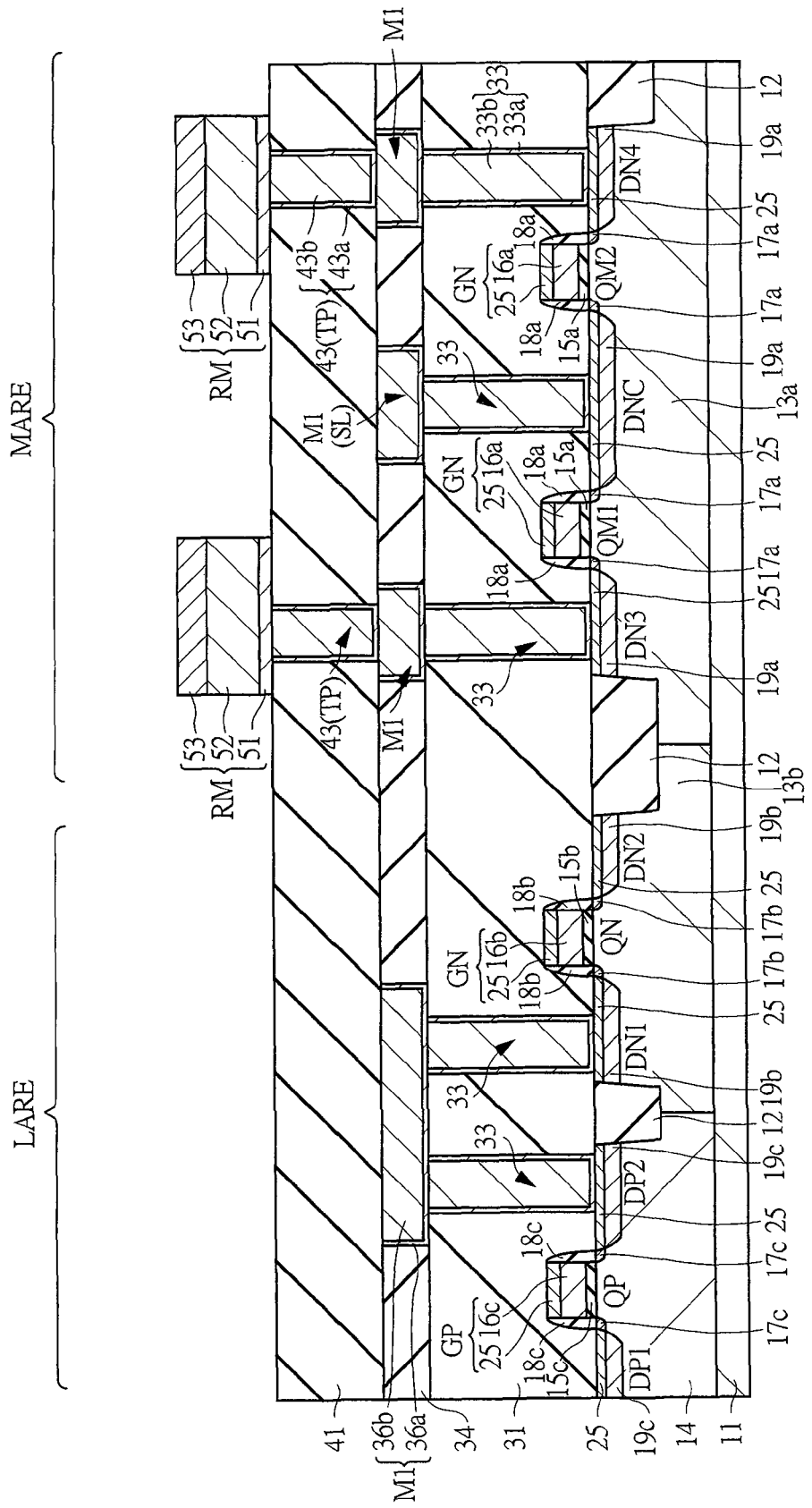
FIG. 18 is a cross sectional view schematically showing the semiconductor device in the manufacturing process continued from FIG. 17.

Next, as shown in FIG. 18, by using a photolithography method and a dry etching method, the stacked film including the peeling-preventing film 51, the recording layer 52 and the upper electrode film 53 is patterned. By this means, the memory elements RM including the stacked pattern of the upper electrode film 53, the recording layer 52 and the peeling-preventing film 51 are formed on the insulator 41 in which the plugs 43 are embedded. The peeling-preventing film 51 can be also used as an etching-stopper film when the upper electrode film 53 and the recording layer 52 are dry-etched.

Figure 19:
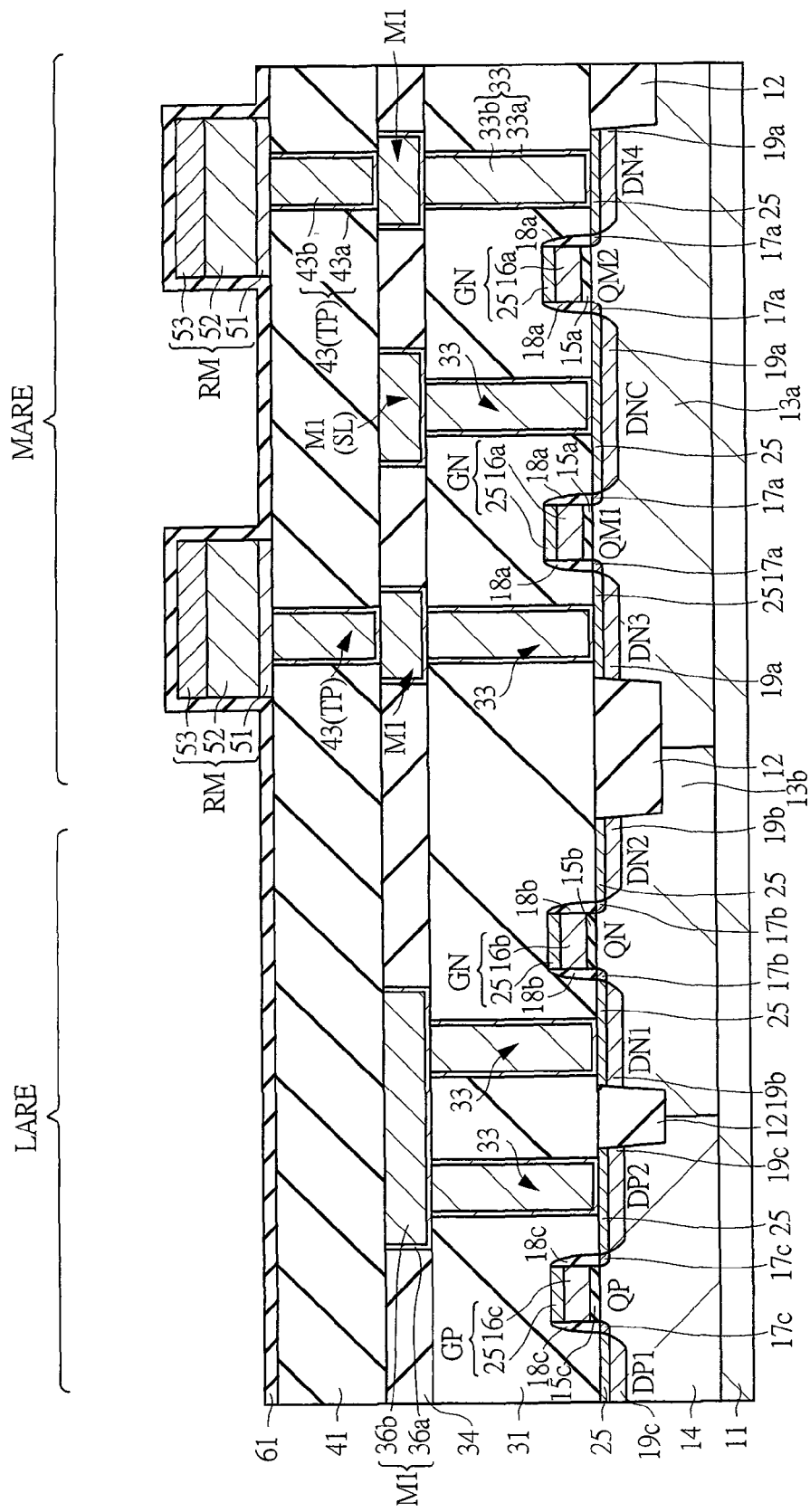
FIG. 19 is a cross sectional view schematically showing the semiconductor device in the manufacturing process continued from FIG. 18.

Next, as shown in FIG. 19, the insulator (etching stopper film) 61 is formed on the insulator 41 so as to cover the memory elements RM. In this manner, the insulator 61 is formed on an upper surface of the upper electrode film 53, a sidewall (side surface) of the recording layer 52 and the insulator 41 other than those. A material film that can be formed at the temperature at which the recording layer 52 does not sublimate (for example 400° C. or lower) is preferably used as the insulator 61. For example, when a silicon nitride film is used as the insulator 61, the silicon nitride film can be preferably formed at the temperature at which the recording layer 52 does not sublimate (for example 400° C. or lower) by using the plasma CVD or the like, whereby the sublimation of the recording layer 52 at the time of the formation of the insulator 61 can be prevented.

Figure 20:
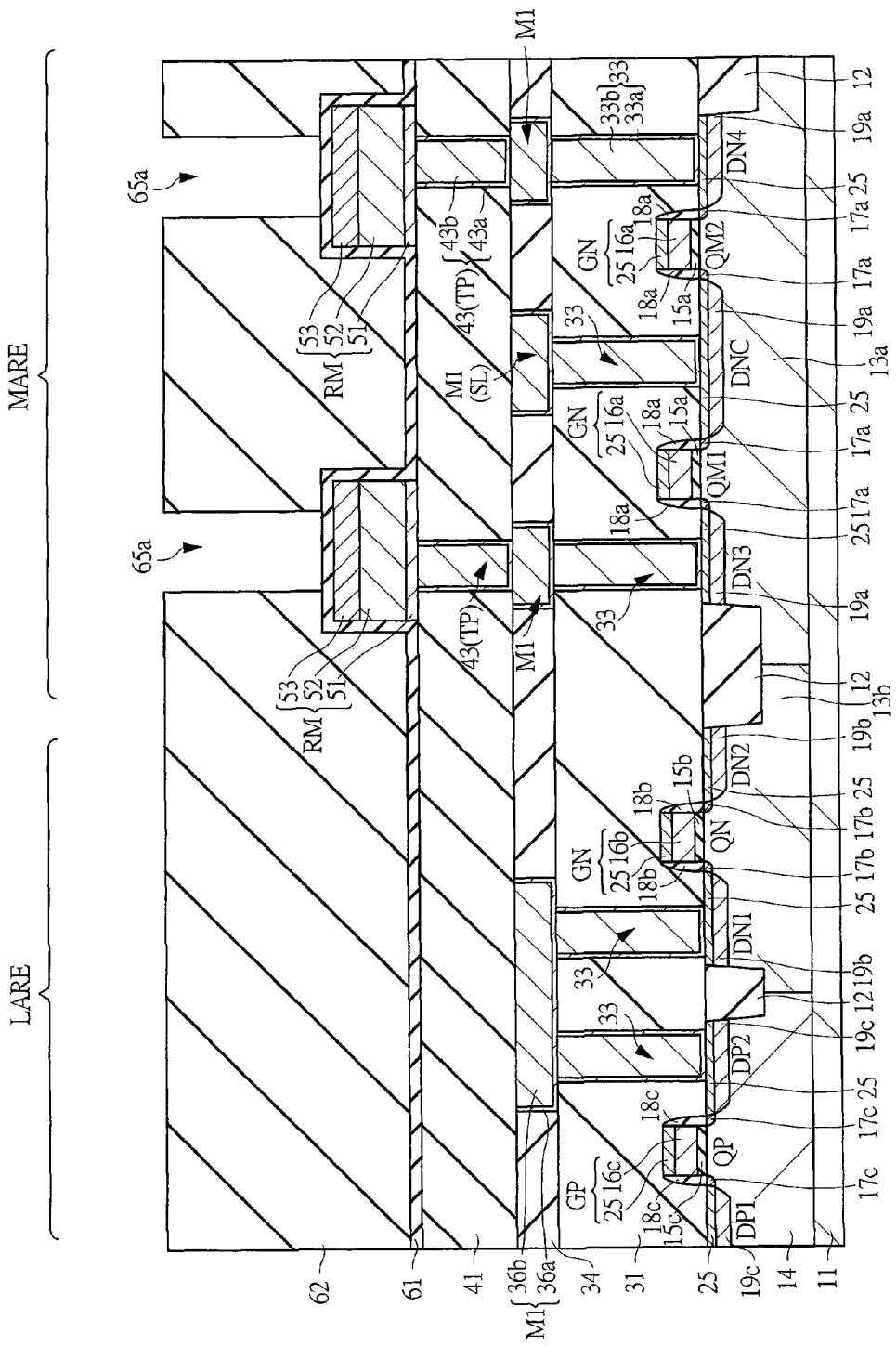
FIG. 20 is a cross sectional view schematically showing the semiconductor device in the manufacturing process continued from FIG. 19.

Next, as shown in FIG. 20, the insulator (interlayer insulating film) 62 is formed on the insulator 61 as an interlayer insulating film. Therefore, the insulator 62 is formed on the insulator 61 so as to cover the stacked pattern (memory element 54) of the upper electrode film 53, the recording layer 52, and the peeling-preventing film 51. After forming the insulator 62, an upper surface of the insulator 62 can be planarized by performing the CMP process and the like according to need. Thereafter, a photoresist pattern is formed on the insulator 62 by using a photolithography method. Then, the insulator 62 is dry-etched with using the photoresist pattern as an etching mask, thereby forming through holes (opening portion, connection hole) 65a in the insulator 62.

In the dry etching to the insulator 62, the dry etching is performed under the condition that the insulator 62 (silicon oxide) is easier to be etched than the insulator 61 (silicon nitride) (that is, condition that an etching speed (etching rate) of the insulator 62 is higher than that of the insulator 61) so as to make the insulator 61 function as the etching stopper film. In this dry etching, for example, an etching method with a selectivity of 10 or more, in which the insulator 62 made of silicon oxide is etched but the insulator 61 serving as the etching stopper is not etched, is used. At this stage, the insulator 61 is exposed at the bottom portion of the through hole 65a. However, since the insulator 61 functions as the etching stopper, the etching stops in the state where the insulator 61 is exposed at the bottom portion of the through hole 63, and the upper electrode film 53 of the memory element 54 is not exposed.

Figure 21:
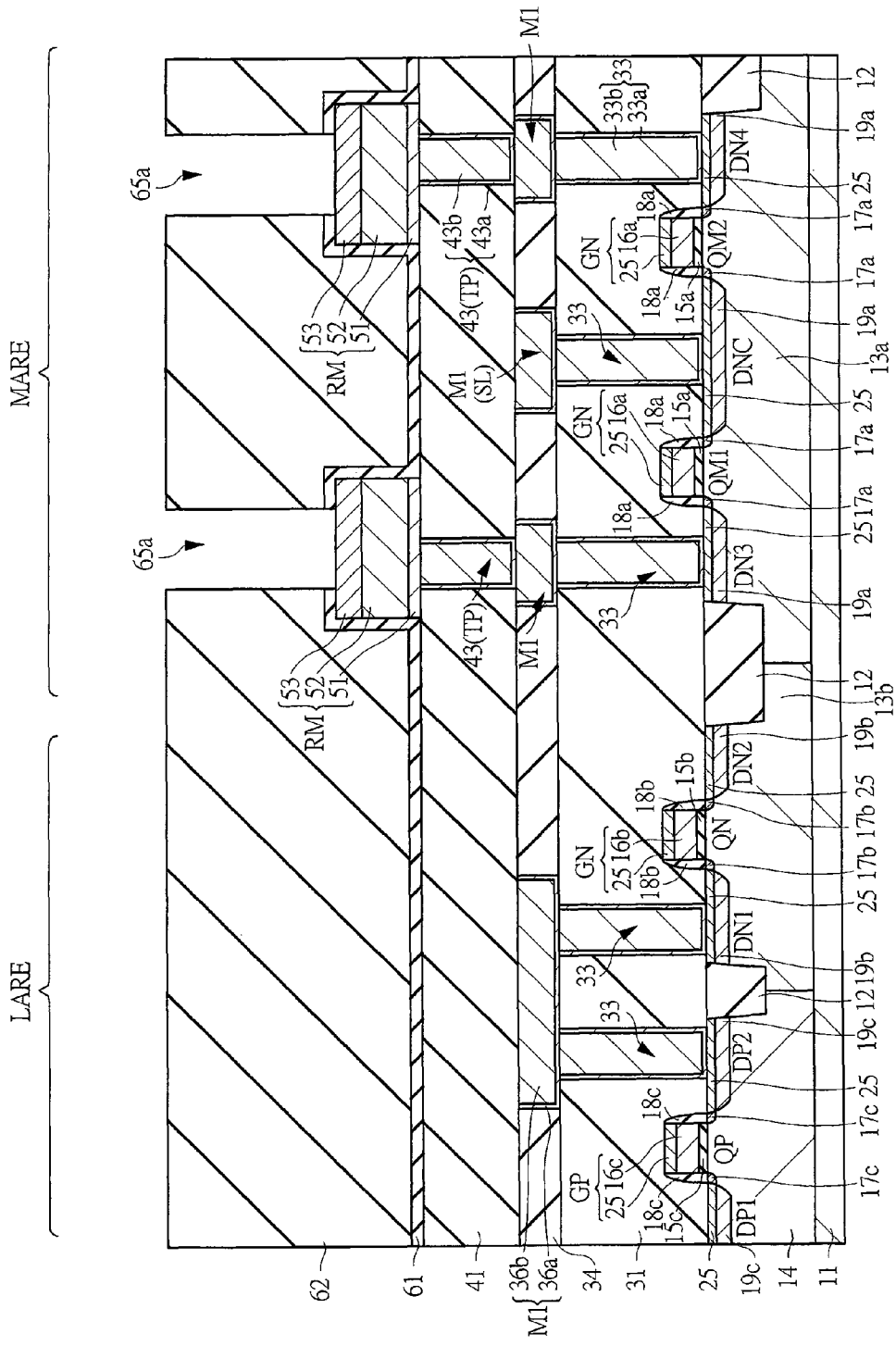
FIG. 21 is a cross sectional view schematically showing the semiconductor device in the manufacturing process continued from FIG. 20.

Then, as shown in FIG. 21, a dry etching is performed under the condition that the insulator 61 (silicon nitride) is easier to be dry-etched than the insulator 62 (silicon oxide) (that is, condition that an etching speed of the insulator 61 is higher than that of the insulator 62), and the insulator 61 exposed at the bottom portion of the through hole 65a is dry-etched and removed. By this means, at the bottom portion of the through hole 65a, at least a part of the upper electrode 53 of the memory element RM is exposed. This dry etching is preferably performed by anisotropic dry etching. Thereafter, the photoresist pattern is removed.

Figure 22:
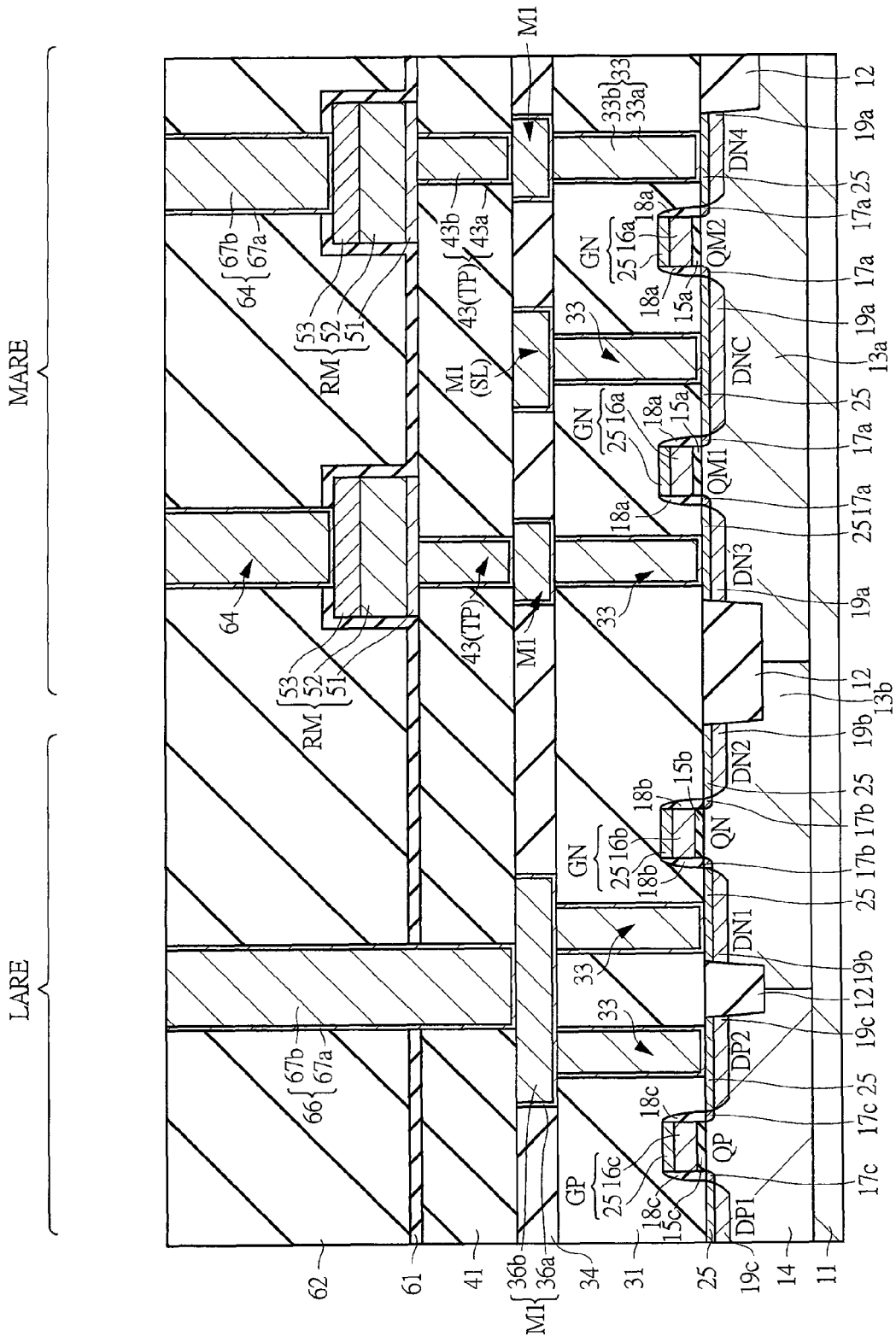
FIG. 22 is a cross sectional view schematically showing the semiconductor device in the manufacturing process continued from FIG. 21.

Next, as shown in FIG. 22, the insulators 62, 61 and 41 are dry-etched with using a photoresist pattern (not shown) formed on the insulator 62 by using a photolithography method as an etching mask, thereby forming a through hole (opening portion, connection hole) and exposing an upper surface of the wiring M1 formed in the logic circuit region LARE. Thereafter, the photoresist pattern is removed. Next, the plugs 64 and 66 are formed in the through hole of the LARE and the through holes 65a described above. At this time, for example, after forming the conductive barrier film 67a on the insulator 62 including the inside of the through holes by the sputtering method and the like, the tungsten film 67b is formed thereon by the CVD method and the like, and then, the unnecessary portions of the tungsten film 67b and the conductive barrier film 67a on the insulator 62 are removed by the CMP, an etch-back technique or the like. In this manner, the plugs 64 and 66 embedded in each of the through holes can be formed. Note that an aluminum (Al) film, an aluminum alloy film (main conductor film) or the like can be also used instead of the tungsten film 67b.

Figure 23:
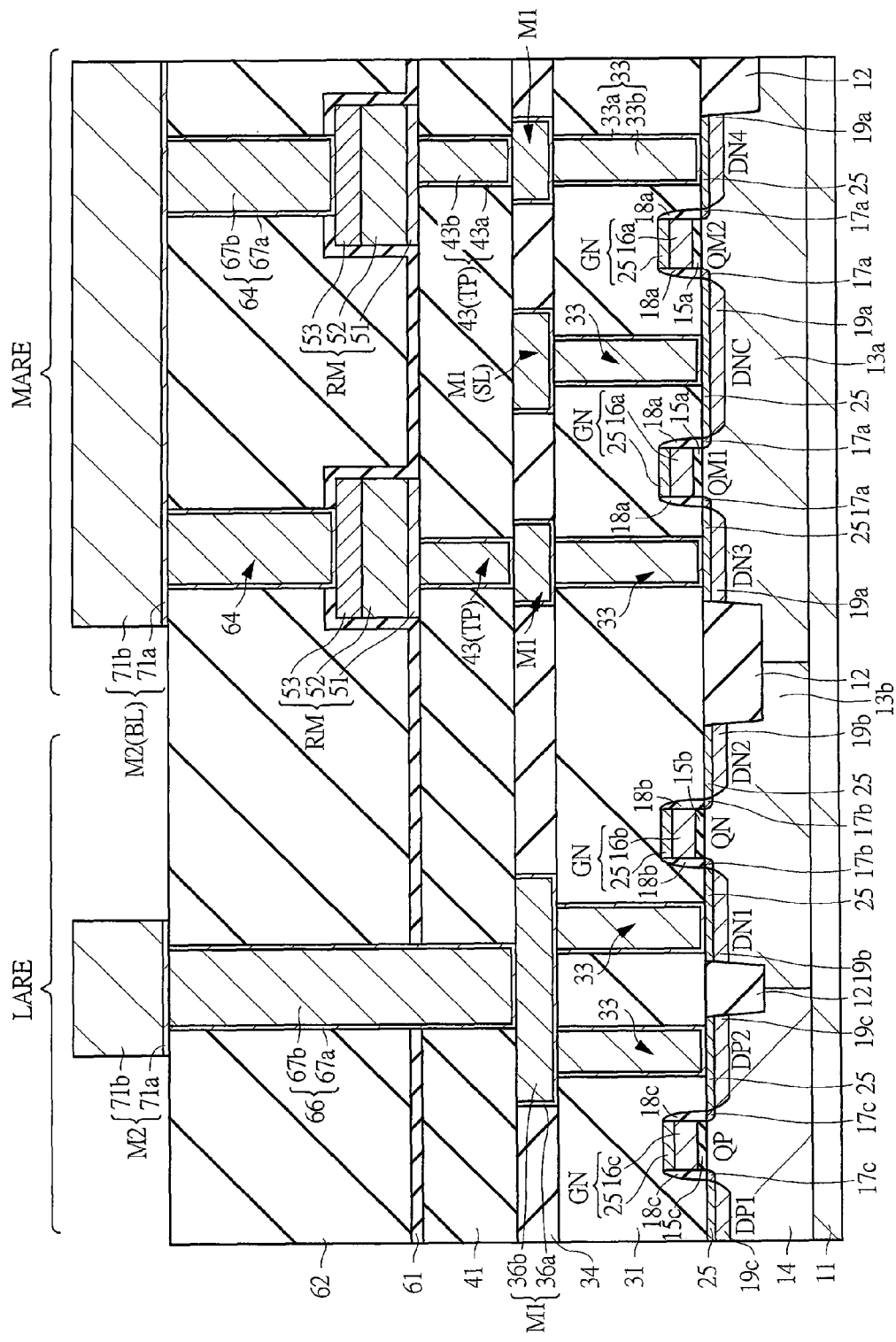
FIG. 23 is a cross sectional view schematically showing the semiconductor device in the manufacturing process continued from FIG. 22.

Next, as shown in FIG. 23, the wirings M2 are formed as a second layer wiring on the insulator 62 in which the plugs 64 and 66 are embedded. For example, on the insulator 62 in which the plugs 64 and 66 are embedded, the conductive barrier film 71a and the aluminum (Al) film or aluminum alloy film 71b are formed in order by sputtering method or the like, and then patterned by using photolithography method and dry etching method, thereby forming the wirings M2. The wiring M2 is not limited to the above-described aluminum wiring, and various modifications and alterations can be made. For example, a tungsten wiring or a copper wiring (implanted copper wiring) can be used instead.

Thereafter, an insulator (not shown) serving as an interlayer insulating film is formed on the insulator 62 so as to cover the wirings M2, and upper wiring layers (wirings of third and subsequent layers) and others are formed thereon. However, the illustration and description thereof are omitted here. Then, after performing the hydrogen annealing at about 400° C. to 450° C., a semiconductor device (semiconductor memory device) is completed.

By the way, as a method for ensuring the heat-resistance property different from the first embodiment, there is a method in which a film thickness of a chalcogenide layer is reduced so as to suppress the occurrence of a problem of resistance increase even when high temperature in the reset state is maintained. It is believed that, when this method is used, a current readily flows in a film thickness direction, and an influence of atomic arrangement change except for a normal crystallization at an upper portion of an outer edge of a plug is hard to appear. However, in the case of film thickness reduction, there is a tendency that a yield of an operable element decreases more as the thickness becomes thinner. In the case of the first embodiment, since an upper portion of the chalcogenide layer (for example, the second layer 52b) is easily crystallized and the resistance thereof is decreased, an effect similar to the case of film thickness reduction can be obtained, and the decrease in an operation yield does not occur because its film thickness is large.

Also, in the above-described method in which a film thickness of a chalcogenide layer is reduced, the reduction of a set voltage is expected, but practically, the reduction is hardly achieved. On the other hand, in the case of the first embodiment, an additive-free GeSbTe film serving as an example of the second layer 52b is crystallized earlier because of its low set voltage, and potential gradient is increased by an accumulation of holes at an interface thereof, so that highly efficient impact ionization which triggers the low-voltage set operation is induced to the first layer 52a containing a lot of In. Therefore, it is expected to achieve the low-voltage set.

Moreover, another manufacturing method is known, in which right after forming the chalcogenide material layer or after forming a tungsten or a tungsten alloy layer of 2 nm or more and 15 nm or less on a front surface of the chalcogenide layer, high-power laser optical beam of about 1 to 4 W is irradiated thereto while scanning the same with an oval shaped beam spot, thereby performing the crystallization. In this case, in the recording layer 52 of the first embodiment, an upper portion to which light is incident has a composition to crystallize easily, and a clear crystal of cubic lattice is formed to a lower portion in accordance with the crystallization at an upper portion, and therefore, the time required for an initial crystallization by a current can be reduced. Note that, after the laser irradiation, an upper electrode layer equivalent to the film thickness of the rest is formed.

The typical effects obtained by using the semiconductor device of the first embodiment described above will be briefly described below. As shown in FIG. 4, the recording layer 52 is formed of at least two layers or more, and a concentration of a group II or group III element contained in a layer on an lower electrode side of the recording layer 52 is made higher than that in a layer on an upper electrode side, whereby a semiconductor device provided with a high heat-resistance property and a stable data retention property can be realized.

Second Embodiment

The recording layer 52 in the memory element RM according to the first embodiment described above is made of the phase-change material containing at least either indium (In) or gallium (Ga), germanium (Ge), antimony (Sb), and tellurium (Te) with an appropriate composition ratio. In the second embodiment, the case where a constituent element of 10% or less of the recording layer 52 is replaced by nitrogen will be described. Note that, except for that the constituent element of 10% or less is replaced by nitrogen, the second embodiment is the same as the first embodiment described above, and therefore, the description of an overlapping part is omitted.

In the case where the constituent element of the chalcogenide material (phase-change material) containing at least either indium or gallium, germanium, antimony, and tellurium is replaced by nitrogen, such advantages as that data retention property at high temperature is improved, characteristic variation is reduced because of fine crystal grain, and others can be obtained.

Figure 24:
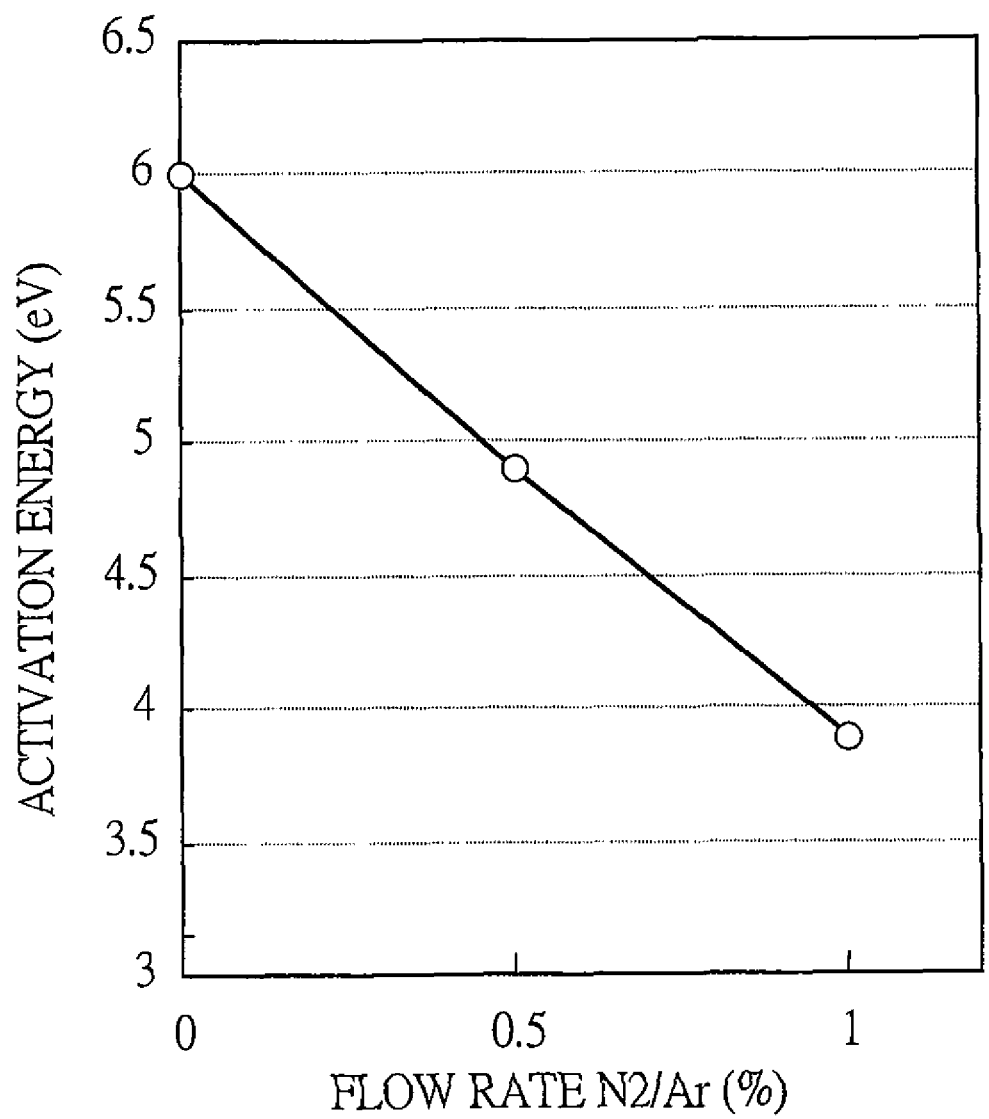
FIG. 24 is an explanatory diagram showing an activation energy for crystallization of a recording layer accompanying a manufacturing process of a semiconductor device according to a second embodiment of the present invention.

The recording layer included in the semiconductor device of the second embodiment is formed by, for example, a sputtering method using inert gases such as Ar, Xe and Kr as described in the first embodiment, but in the formation of the recording layer in the second embodiment, nitrogen gas is mixed into these inert gases. FIG. 24 shows activation energy for crystallization when a film is formed by mixing nitrogen gas into Ar gas in the sputtering of the chalcogenide material. As shown in FIG. 24, when nitrogen is added, the activation energy for crystallization is decreased. This is because the crystallization at high temperature is suppressed. Note that data retention property in an operation temperature region is not deteriorated.

Therefore, in the recording layer, while maintaining the data retention property in a normal operation temperature region, data retention life at a temperature higher than that is improved. Accordingly, for example, an effect to withstand the heat load in a packaging process in which temperature is increased higher than actual use environmental temperature is brought. However, since characteristic variation by rewriting is large if an amount of nitrogen is too much, it is appropriate to set it to 10% or less. Note that, although a nitrogen content in the first layer of the recording layer may be the same as that in the second layer, if making a difference therebetween, the content in the first layer is preferably set to 1.5 times or more and 5 times or less the content in the second layer in terms of the heat-resistance property.

Third Embodiment

Figure 25:
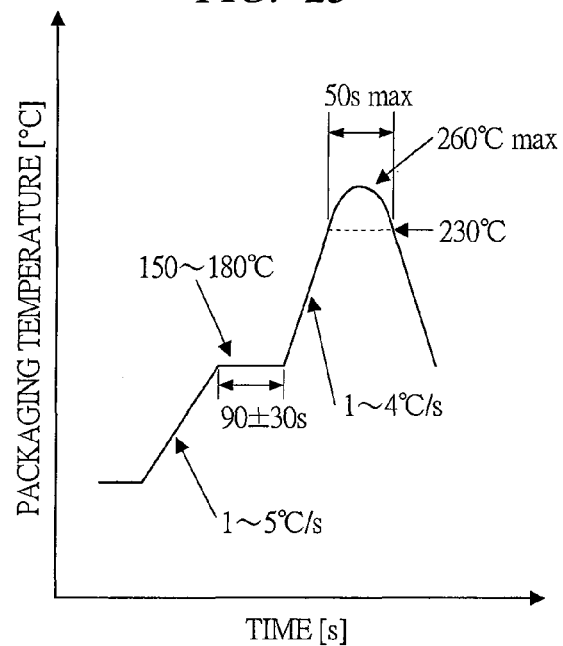
FIG. 25 is an explanatory diagram showing a temperature profile in solder reflow process in a semiconductor device according to a third embodiment of the present invention.
Figure 26:
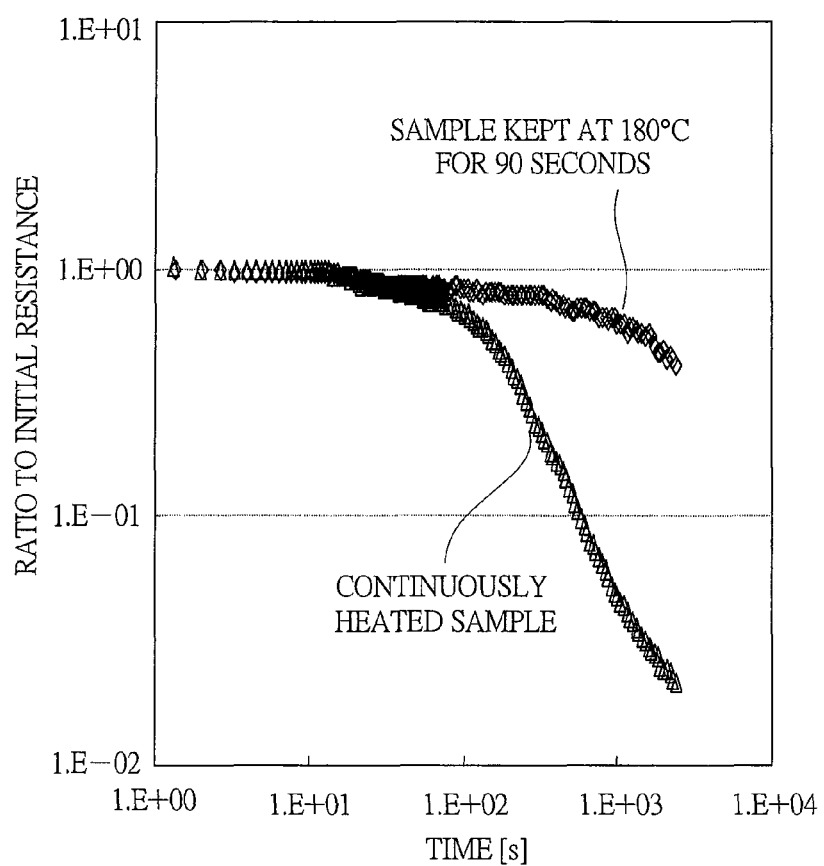
FIG. 26 is an explanatory diagram showing a data retention property when preheat treatment for the solder reflow process of FIG. 25 is performed.

In a semiconductor device according to a third embodiment, thermal process is performed to the semiconductor devices according to the first and second embodiments described above. Here, thermal process in a packaging process will be described with reference to FIGS. 25 and 26. FIG. 25 is an explanatory diagram showing a temperature profile in solder reflow process. FIG. 26 is an explanatory diagram showing data retention property when preheat treatment for the solder reflow process is performed.

When packaging a semiconductor device such as a microcomputer provided with the memory element RM, for example, solder reflow process is performed. When lead-free solder is used, a temperature of solder reflow process is about 260° C. at a maximum, and the semiconductor device provided with the memory element RM is exposed to a high-temperature environment much beyond a normal operation environment.

However, as shown in FIG. 25, when a relatively high temperature is maintained for a certain period in a range not over a crystallization temperature of a chalcogenide material (phase-change material), the high-resistance state is further stabilized. This is probably because the crystal nucleation site becomes inactive and the crystallization is difficult to proceed, and this has a characteristic that the data retention property is further improved.

FIG. 26 shows the decrease of the resistance in a reset state from an initial value with respect to the two samples including one which is temporarily kept at 180° C. for 90 seconds and then heated to 260° C. and the other which is directly heated to 260° C. without being kept, in the packaging process by the lead-free soldering reflow. According to the results shown in FIG. 26, the resistance of the sample through the preheat treatment is hard to be lowered. Therefore, the semiconductor device that has been placed under an environment of a temperature profile in which the temperature is kept for a predetermined period of time at a relatively low temperature considered to be lower than the crystallization temperature of the recording layer and is then increased to a peak temperature higher than the crystallization temperature is provided with the memory elements RM suitable for the packaging process.

According to the third embodiment, a highly reliable semiconductor device which can maintain a memory state even in a soldering reflow process and has a high resistance ratio and an excellent data retention property even at high temperature can be achieved. Further, the semiconductor device according to the third embodiment can also be used even under such a high-temperature environment as in a microcomputer for controlling an automobile engine.

Fourth Embodiment

Figure 27:
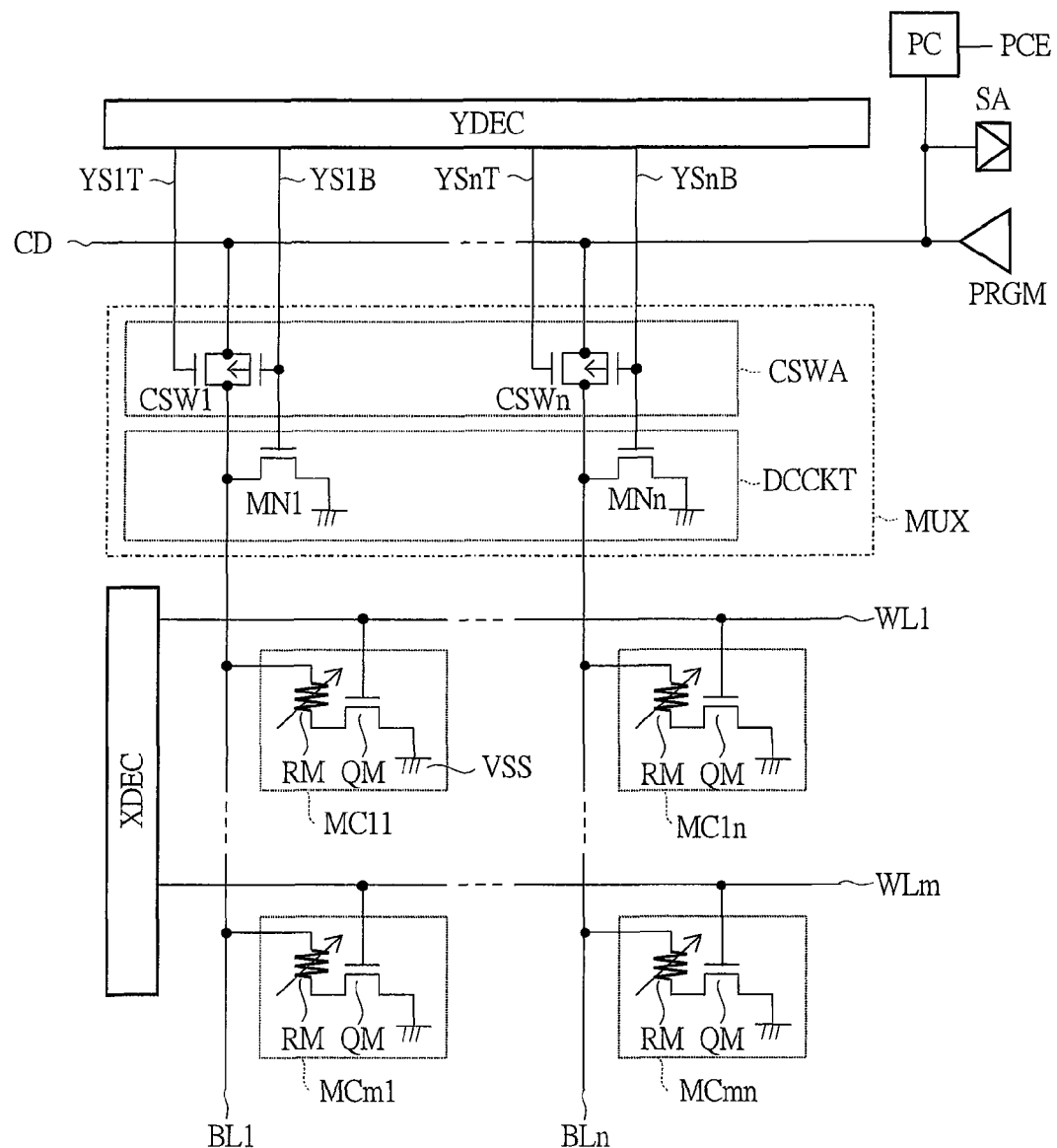
FIG. 27 is a circuit diagram showing a configuration example of a semiconductor device according to a fourth embodiment of the present invention.

FIG. 27 is a circuit diagram showing a configuration example in a semiconductor device according to a fourth embodiment of the present invention. The circuit configuration of the fourth embodiment is one example of a memory array configuration using the recording layer made of the chalcogenide material described in the first and second embodiments and the manufacturing process thereof, and it has a characteristic that it is operated by applying a high voltage to an upper electrode side compared with a lower electrode. The semiconductor device of FIG. 27 includes a memory array, a multiplexer MUX, a row (row) decoder XDEC, a column (column) decoder YDEC, a pre-charge circuit PC, a sense amplifier SA, and a rewriting circuit PRGM.

In the memory array, memory cells MC11 to MCmm are disposed at each of the intersections of word lines WL1 to WLm and bit lines BL1 to BLn. Each memory cell has a configuration in which a memory element RM and a memory cell transistor QM connected in series are interposed between the bit line BL and a ground voltage VSS terminal and one end of the memory element RM is connected to the bit line BL. Here, the memory element RM has a configuration as described in FIG. 4 and others. More specifically, the upper electrode 53 of FIG. 4 is connected to the bit line BL, and the lower electrode TP of FIG. 4 is connected to one end of the memory cell transistor QM.

The word line WL serving as an output signal of the row decoder XDEC is connected to a gate of the memory cell transistor QM. The pre-charge circuit PC, the sense amplifier SA, and the rewriting circuit PRGM are connected to a common data line CD. The pre-charge circuit PC is activated by a pre-charge activation signal PCE of high level (here, a power supply voltage VDD) to drive the common data line CD to a reading voltage VRD (voltage level thereof will be described later).

The multiplexer MUX includes a column selecting switch row CSWA and a discharging circuit DCCKT. The column selecting switch row CSWA is composed of a plurality of CMOS transfer gates (column selecting switch) CSW1 to CSWn each interposed between the bit lines BL1 to BLn and the common data line CD. Column select line pairs (YS1T and YS1B) to (YSnT and YSnB) serving as output signals of the column decoder YDEC are connected to the gate electrodes of the CMOS transfer gates CSW1 to CSWn. By activating one of the column select line pairs (YS1T and YS1B) to (YSnT and YSnB), the corresponding CMOS transfer gate is activated, and one of the bit lines BL1 to BLn is connected to the common data line CD.

The discharging circuit DCCKT is composed of NMOS transistors MN1 to MNn each interposed between the bit lines BL1 to BLn and the ground voltage VSS terminal. Column select lines YS1B to YSnB are connected to the gate electrodes of the NMOS transistors MN1 to MNn, respectively. In a stand-by state, the column select lines YS1B to YSnB are maintained at the power supply voltage VDD, whereby the NMOS transistors MN1 to MNn are turned on, and the bit lines BL1 to BLn are driven to the ground voltage VSS.

Figure 28:
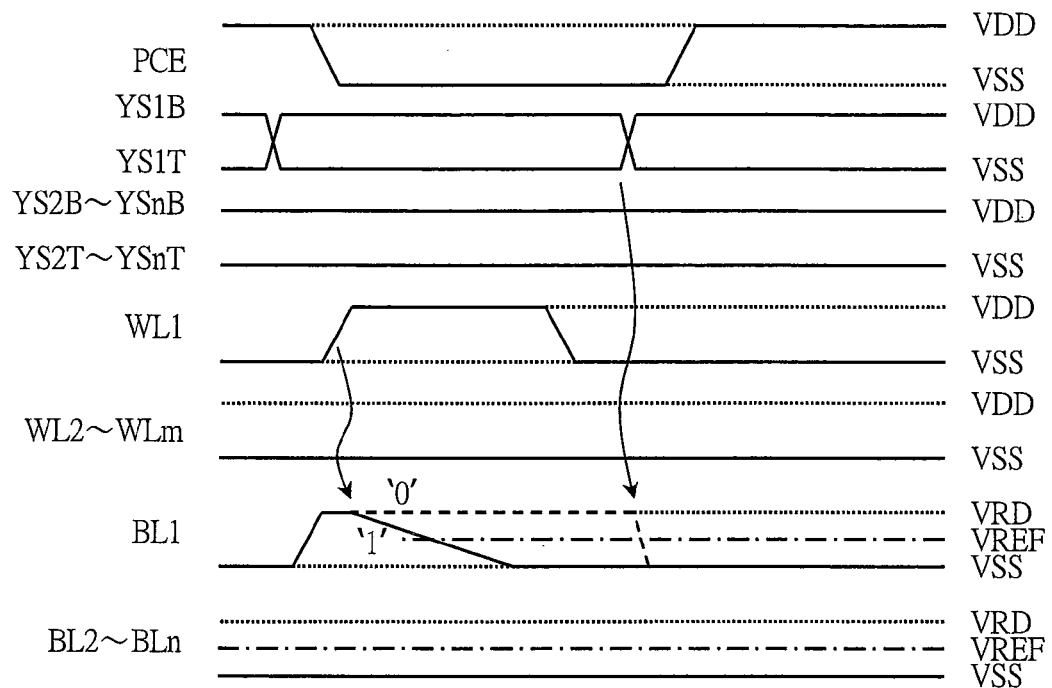
FIG. 28 is a waveform diagram showing one example of a reading operation in the semiconductor device of FIG. 27.

In the configuration described above, the reading operation as shown in FIG. 28 is performed. Hereinafter, description will be made on the assumption that the memory cell MC11 is selected. First, the column selecting switch CSW1 corresponding to the column select line pair (YS1T and YS1B) selected by the column decoder YDEC is turned on, so that the bit line BL1 and the common data line CD are connected. At this time, by the activated pre-charge circuit PC, the bit line BL1 is pre-charged to the reading voltage VRD through the common data line CD. This reading voltage VRD is designed to a voltage level between the power supply voltage VDD and the ground voltage VSS so as not to cause a damage to stored information.

Next, the pre-charge activation signal PCE of the power supply voltage VDD is driven to the ground voltage VSS to put the pre-charge circuit PC into an inactive state. Further, a memory cell transistor QM on the word line (WL1) selected by the row decoder XDEC is turned on, so that a current path is formed in the memory cell MC11 and a read signal is generated to the bit line BL1 and the common data line CD.

Since a resistance value in the selecting memory cell differs depending on the stored information, the voltage outputted to the common data line CD differs depending on the stored information. In this case, in the case where the stored information is '1', the resistance value in the memory cell is low, so that the bit line BL1 and the common data line CD are discharged toward the ground voltage VSS to be a voltage lower than a reference voltage VREF. On the other hand, in the case where the stored information is '0', the resistance value in the memory cell is high, so that the bit line BL1 and the common data line CD are held in a pre-charge state, that is, at the reading voltage VRD. By specifying this difference by the sense amplifier SA, the stored information of the selecting memory cell is read. Lastly, the column select line (YS1T and YS1B) is put into an inactive state to turn on the transistor MN1, so that the bit line BL1 is driven to the ground voltage VSS, and at the same time, the pre-charge activation signal PCE of the ground voltage VSS is driven to the power supply voltage VDD to activate the pre-charge circuit PC, thereby returning to the stand-by state.

Figure 29:
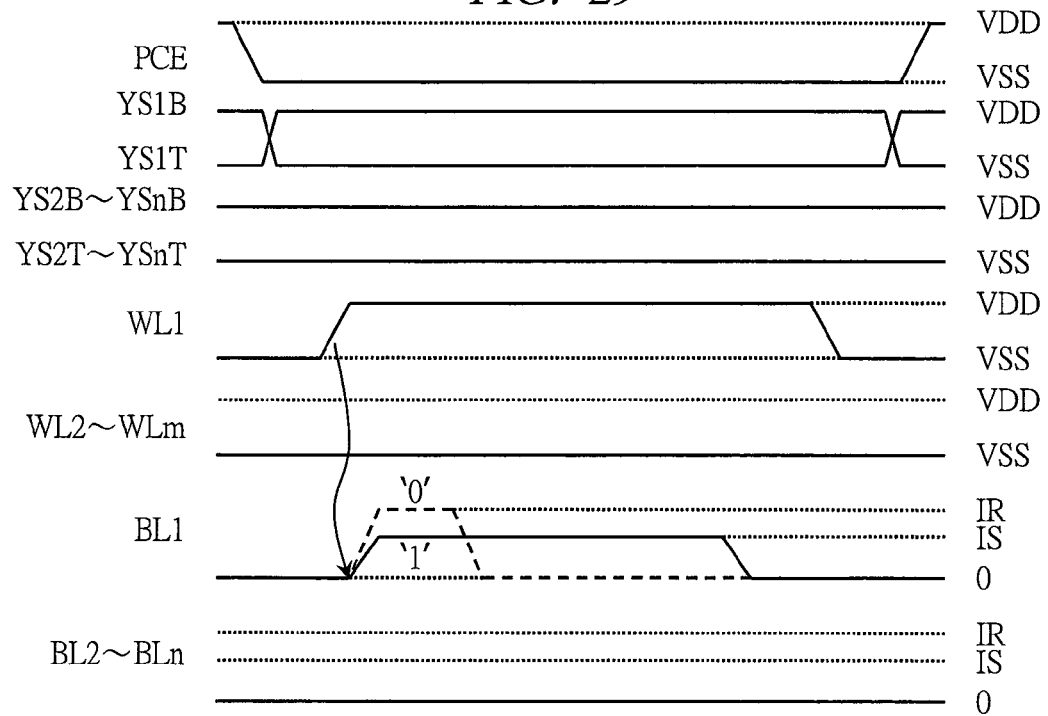
FIG. 29 is a waveform diagram showing one example of a rewriting operation in the semiconductor device of FIG. 27.

FIG. 29 shows a writing operation of the memory array shown in FIG. 27. Also in this case, similar to FIG. 28, description will be made on the assumption that the memory cell MC11 is selected. Firstly, the pre-charge activation signal PCE of the power supply voltage VDD is driven to the ground voltage VSS to put the pre-charge circuit into an inactive state. Then, the column selecting switch CSW1 corresponding to the column select line pair (YS1T and YS1B) selected by the column decoder YDEC is turned on, so that the bit line BL1 and the writing circuit PRGM are connected through the common data line CD. Next, the memory cell transistor QM on the word line (WL1) selected by the row decoder XDEC is turned on, so that a current path is formed in the memory cell MC11 and the writing current flows in the bit line BL1.

The writing circuit PRGM is designed so that the writing current and an application time thereof take the values corresponding to the stored information. In this case, a large reset current IR is applied for a short period when the stored information is '0'. On the other hand, when the stored information is '1', a set current IS smaller than the reset current IR is applied for a longer period than that of the reset current. Lastly, the column select line pair (YS1T and YS1B) is put into an inactive state to turn on the transistor MN1, so that the bit line BL1 is driven to the ground voltage VSS, and at the same time, the pre-charge activation signal PCE of the ground voltage VSS is driven to the power supply voltage VDD to activate the pre-charge circuit PC, thereby returning to the stand-by state.

In the foregoing, in the fourth embodiment, the semiconductor device as shown in FIG. 27 is formed by using the memory element RM described in the first and second embodiments, so that a semiconductor device provided with a high heat-resistance property and a stable data retention property can be realized. Also, like in the configuration and the operation described above, rewriting for the memory element RM is preferably performed by applying an electric field from the upper electrode 53 toward the lower electrode TP. The reason thereof is that positive ions (for example, In ion) can be kept in a lower layer (first layer 52a). Accordingly, since a composition distribution in a film thickness direction in the recording layer 52 is stably maintained, the number of rewritable times can be improved, and a more stable data retention property can be realized.

Fifth Embodiment

Figure 30:
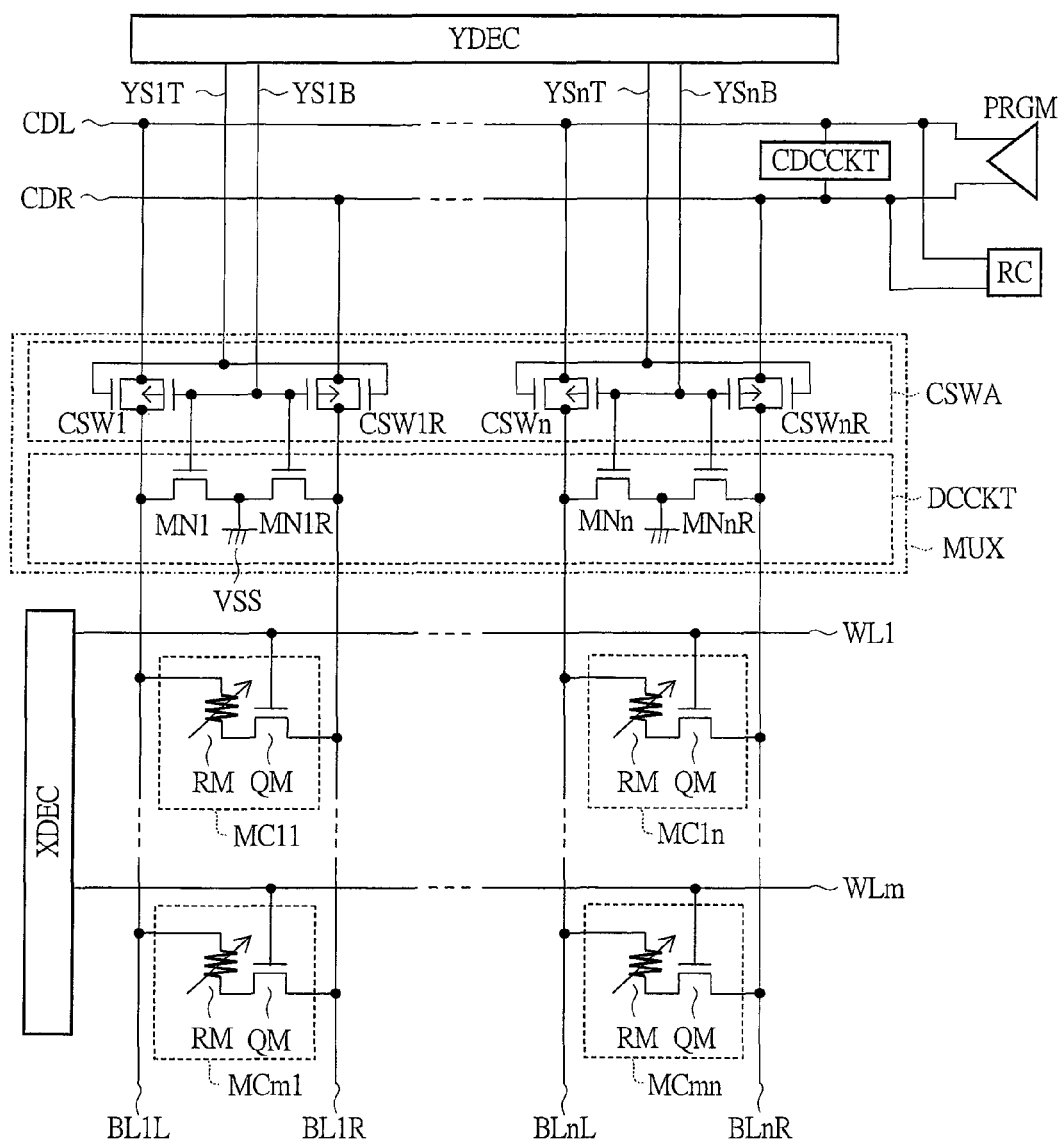
FIG. 30 is a circuit diagram showing a configuration example of a semiconductor device according to a fifth embodiment of the present invention.

In a fifth embodiment, one example of a circuit configuration and an operation thereof different from the fourth embodiment described above will be described. FIG. 30 is a circuit diagram showing a configuration example in the semiconductor device according to the fifth embodiment of the present invention. In the semiconductor device shown in FIG. 30, similar to FIG. 27 described above, a memory array configuration having a memory cell of n×m bits is shown. Similarly, the elements constituting the memory cell are also the memory cell transistor QM and the memory element RM by the variable resistance using a chalcogenide material. The fifth embodiment has a characteristic that one more bit line is added to the one bit line in FIG. 27 and memory cells are disposed at the intersections of the bit line pairs and word lines, so that a voltage in a reverse direction can be applied to the memory element. Hereinafter, as focusing on a different point from the FIG. 27, a configuration of a semiconductor device shown in FIG. 30 will be described.

The semiconductor device shown in FIG. 30 includes a common discharge circuit CDCCKT in addition to a memory array, a multiplexer MUX, a row (row) decoder XDEC, a column (column) decoder YDEC, a reading circuit RC, and a rewriting circuit PRGM. The memory array has a configuration in which memory cells MC11 to MCmn are disposed at the intersections of the word lines WL1 to WLm and the bit line pairs (BL1L and BL1R) to (BLnL and BLnR). Each memory cell has a configuration in which a memory element RM and a selecting transistor QM connected in series are interposed between the bit lines BL1L to BLnL and the bit lines BL1R to BLnR. In this case, the memory element RM has a configuration described in FIG. 4 and others, in which the upper electrode 53 of FIG. 4 is connected to bit lines BL1L to BLnL sides and the lower electrode TP of FIG. 4 is connected to one end of the memory cell transistor QM.

The reading circuit RC, the rewriting circuit PRGM, and the common discharging circuit CDCCKT are connected to the common data line pair (CDL and CDR). Portions corresponding to the bit lines BL1R to BLnR are added to a column selecting switch row CSWA and a discharging circuit DCCKT in the multiplexer MUX. More specifically, CMOS transfer gates (column selecting switch) CSW1R to CSWnR interposed between the bit lines BL1R to BLnR and the common data line CDR are added to the column selecting switch row CSWA. Column select line pairs (YS1T and YS1B) to (YSnT and YSnB) serving as output signals of the column decoder YDEC are connected to the gate electrodes of the CMOS transfer gates CSW1 to CSWn and CSW1R to CSWnR, respectively. By activating one of the column select line pairs (YS1T and YS1B) to (YSnT and YSnB), a corresponding pair of the CMOS transfer gates is activated, and one pair of the bit line pairs (BL1L and BL1R) to (BLnL and BLnR) is connected to the common data line pair (CDL and CDR).

NMOS transistors MN1R to MNnR interposed between the bit lines BL1R to BLnR and the ground voltage VSS are added to the discharging circuit DCCKT. Column select lines YS1B to YSnB are connected to the gate electrodes of the NMOS transistors MN1R to MNnR, respectively. In a stand-by state, the column select lines YS1B to YSnB are maintained at the power supply voltage VDD, whereby the NMOS transistors MN1L to MNnL and MN1R to MNnR are turned on, and the bit line pairs (BL1L and BL1R) to (BLnL and BLnR) are driven to the ground voltage VSS.

Figure 31:
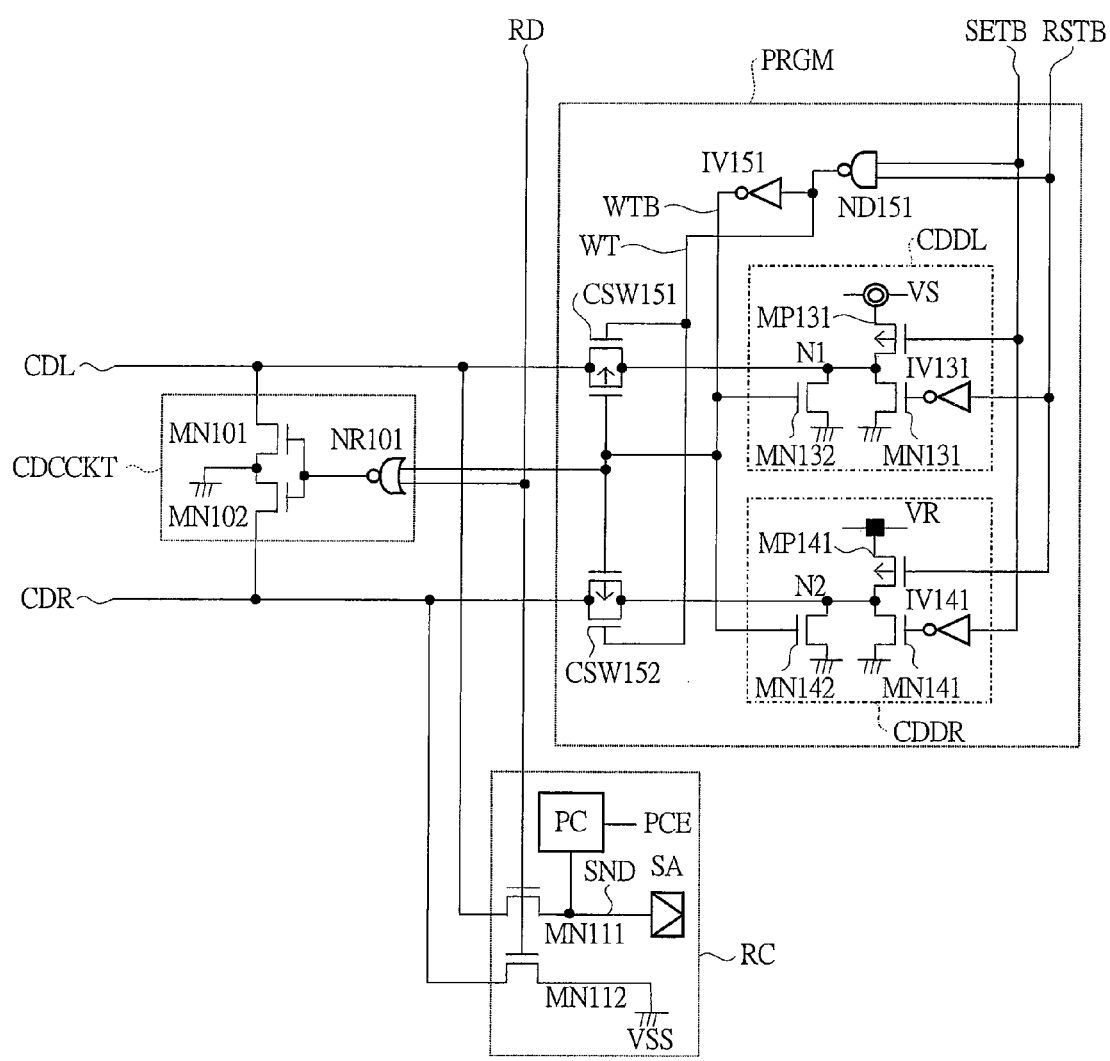
FIG. 31 is a circuit diagram showing a detailed configuration example of a part of a circuit in the semiconductor device of FIG. 30.

FIG. 31 is a circuit diagram showing a detailed configuration example of the common discharging circuit CDCCKT, the reading circuit RC, and the rewriting circuit PRGM of FIG. 30. The discharging circuit DCCKT includes NMOS transistors MN101 and MN102 and a NOR circuit NR101. The MN101 is interposed between the common data line CDL and the ground voltage VSS, and the MN102 is interposed between the common data line CDR and the ground voltage VSS. Also, an output terminal of the NOR circuit NR101 is connected to each of gate electrodes of the NMOS transistors MN101 and MN102.

A reading activation signal RD and a rewriting activation signal WT described later are inputted to input terminals of the NOR circuit NR101, respectively. Since these signals are maintained at the ground voltage VSS in a stand-by state, when the transistors MN101 and MN102 are turned on, the common data line pair (CDL and CDR) is driven to the ground voltage VSS. On the other hand, since the reading activation signal RD is driven to the power supply voltage VDD in a reading operation and the rewriting activation signal WT is driven to the power supply voltage VDD in a rewriting operation, the transistors MN101 and MN102 are cut off in these operations.

The reading circuit RC is constituted of NMOS transistors MN111 and MN112, the pre-charge circuit PC, and the sense amplifier SA. The pre-charge circuit PC is connected to the sense amplifier SA by a node SND. The pre-charge circuit PC is activated by a pre-charge activation signal PCE of high level (here, the power supply voltage VDD) to drive the node SND and others to the reading voltage VRD. The transistor MN111 is interposed between the common data line CDL and the sense amplifier SA, and the transistor MN112 is interposed between the common data line CDR and the ground voltage VSS, respectively. The reading activation signal RD is inputted to the gate electrodes of these transistors.

Since the reading activation signal RD is maintained at the ground voltage VSS in a stand-by state as described above, in this case, the transistors MN111 and MN112 are cut off. On the other hand, since the reading activation signal RD which is at the ground voltage VSS is driven to the power supply voltage VDD in a reading operation, the transistors MN111 and MN112 are turned on, whereby the common data line CDL is connected to the pre-charge circuit PC and the sense amplifier SA, and the common data line CDR is connected to the ground voltage VSS. In the configuration described above, a source electrode of the transistor QM in a selected memory cell is driven to the ground voltage VSS from the common data line CDR through the bit lines BL1R to BLnR in the reading operation. Also, a reading signal corresponding to the stored information is inputted to the sense amplifier SA from the bit lines BL1L to BLnL through the common data line CDL, thereby being able to perform the reading operation similar to that of FIG. 28.

The rewriting circuit PRGM is constituted of common data line driver circuits CDDL and CDDR, COMS transfer gates CSW151 and CSW152, a NAND circuit ND151, and an inverter circuit IV151. The CSW151 is interposed between the common data line CDL and the common data line driver circuit CDDL, and the CSW152 is interposed between the common data line CDR and the common data line driver circuit CDDR. The rewriting activation signals WT and WTB obtained by performing an AND operation of a set activation signal SETB and a reset activation signal RSTB by using the NAND circuit ND151 and the inverter circuit IV151 are respectively connected to these gate electrodes.

Here, since the set activation signal SETB and the reset activation signal RSTB are maintained at the power supply voltage VDD in a stand-by state, the rewriting activation signal WT is maintained at the ground voltage VSS and the rewriting activation signal WTB is maintained at the power supply voltage VDD, whereby the common data lines CDL and CDR and the common data line driver circuits CDDL and CDDR are cut off. On the other hand, since the set activation signal SETB or the reset activation signal RSTB is driven to the ground voltage VSS in a rewriting operation, the WT is driven to the power supply voltage VDD and the WTB is driven to the ground voltage VSS to turn on the CSW151 and CSW152, respectively, whereby the common data lines CDL and CDR and the common data line driver circuits CDDL and CDDR are connected to each other.

The common data line driver circuit CDDL is constituted of a PMOS transistor MP131, NMOS transistors MN131 and MN132, and an inverter circuit IV131. The transistor MP131 and the NMOS transistor MN131 are interposed between the set voltage VS and the ground voltage VSS, and a drain electrode thereof is a node N1. The node N1 and the transfer gate CSW151 are connected, and at the same time, the transistor MN132 is interposed between the node N1 and the ground voltage VSS.

The set activation signal SETB is connected to a gate electrode of the transistor MP131. When the set activation signal SETB which is at the power supply voltage VDD is driven to the ground voltage VSS in the set operation, the transistor MP131 is turned on, whereby the set voltage VS is applied to the common data line CDL through the transfer gate CSW151. A signal obtained by inverting the reset activation signal RSTB at the inverter circuit IV131 is connected to a gate electrode of the transistor MN131. When the reset activation signal RSTB which is at the power supply voltage VDD is driven to the ground voltage VSS in the reset operation, the transistor MN131 is turned on, whereby the ground voltage VSS is applied to the common data line CDL through the transfer gate CSW151. The rewriting activation signal WTB is connected to a gate electrode of the transistor MN132. Since the rewriting activation signal WTB is maintained at the power supply voltage VDD in a stand-by state, the transistors MN132 is turned on, whereby the ground voltage VSS is applied to the node N1.

The common data line driver circuit CDDR is constituted of a PMOS transistor MP141, NMOS transistors MN141 and MN142, and an inverter circuit IV141. The transistor MP141 and the NMOS transistor MN141 are interposed between the reset voltage VR and the ground voltage VSS, and a drain electrode thereof is a node N2. The node N2 and the transfer gate CSW152 are connected, and at the same time, the transistor MN142 is interposed between the node N2 and the ground voltage VSS.

The reset activation signal RSTB is connected to a gate electrode of the transistor MP141. When the reset activation signal RSTB which is at the power supply voltage VDD is driven to the ground voltage VSS in the reset operation, the transistor MP141 is turned on, whereby the reset voltage VR is applied to the common data line CDR through the transfer gate CSW152. A signal obtained by inverting the set activation signal SETB at the inverter circuit IV141 is connected to a gate electrode of the transistor MN141. When the set activation signal SETB which is at the power supply voltage VDD is driven to the ground voltage VSS in the set operation, the transistor MN141 is turned on, whereby the ground voltage VSS is applied to the common data line CDR through the transfer gate CSW152. The rewriting activation signal WTB is connected to a gate electrode of the transistor MN142. Since the rewriting activation signal WTB is maintained at the power supply voltage VDD in a stand-by state, the transistors MN142 is turned on, whereby the ground voltage VSS is applied to the node N2.

Figure 32:
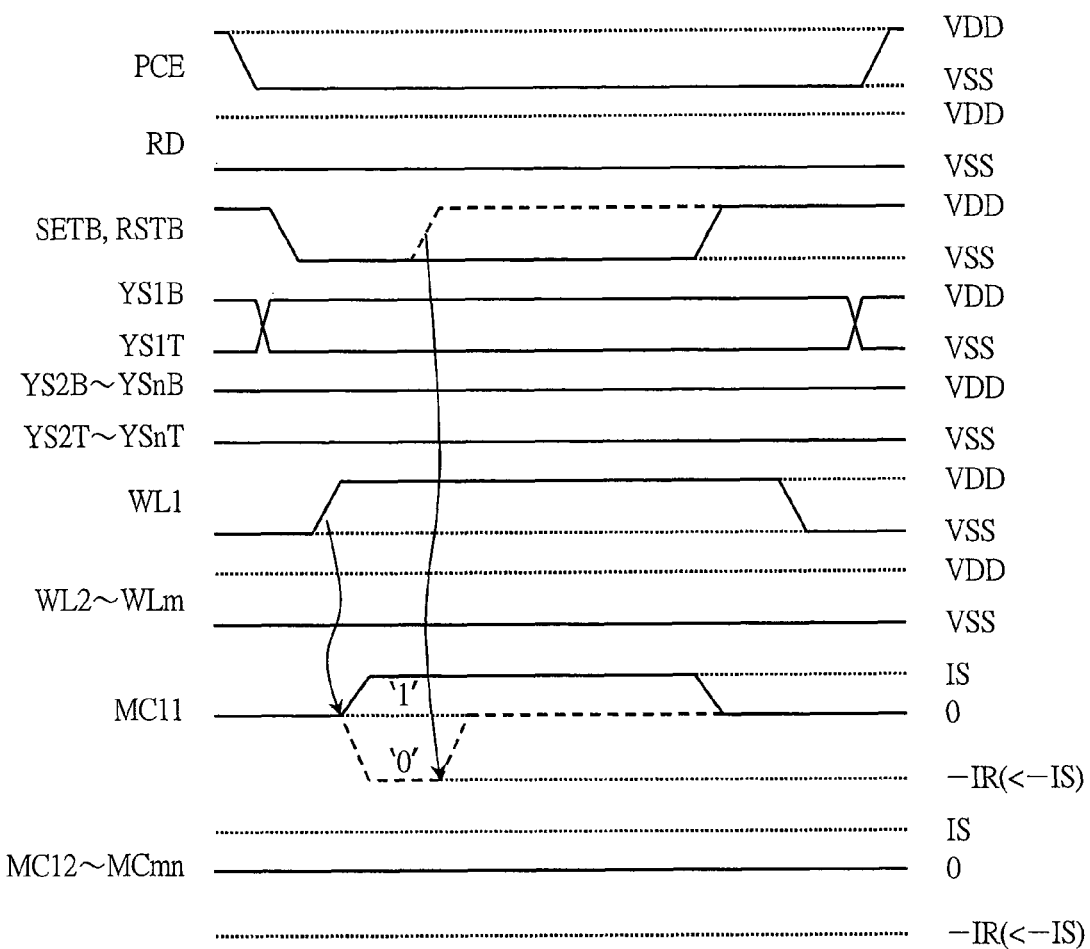
FIG. 32 is a waveform diagram showing one example of a rewriting operation in the semiconductor device of FIG. 30.

FIG. 32 is a waveform diagram showing one example of the rewriting operation using the rewriting circuit PRGM of FIG. 31. As shown in FIG. 32, in the rewriting operation, a current in a direction in accordance with the stored information can be supplied to the selected memory cell. More specifically, in the case of the set operation for writing the stored information '1', when the set activation signal SETB which is at the power supply voltage VDD is driven to the ground voltage VSS, the transistors MP131 and MN141 are turned on, whereby a current can be supplied in a direction from the memory element RM to the transistor QM in the selected memory call. Contrary to this, in the case of the reset operation for writing the stored information '0', when the reset activation signal RSTB which is at the power supply voltage VDD is driven to the ground voltage VSS, the transistors MP141 and MN131 are turned on, whereby a current can be supplied in a direction from the transistor QM to the memory element RM in the selected memory call.

Here, it is necessary to generate a larger Joule heat in the reset operation than in the set operation. Also, since the memory element RM side becomes a source electrode, it is necessary to consider the substrate bias effect of the memory cell transistor. For this reason, the reset voltage VR is designed to be equal to the power supply voltage VDD, or it is designed to be lower than the power supply voltage VDD but higher than the set voltage VS so that an absolute value of a reset current is larger than that of a set current. In such a reset operation, similar to FIG. 29, a reset current (−IR) opposite in direction to the set current (IS) flows in the select memory cell MC11 even for a short period. The absolute value of the reset current (|−IR|) is larger than the set current (IS).

In the foregoing, in the fifth embodiment described above, the semiconductor device as shown in FIG. 30 and FIG. 31 is formed by using the memory element RM as described in the first embodiment and the second embodiment, so that a semiconductor device provided with high a heat-resistance property and a stable data retention property can be realized. Further, since a current is supplied by applying a voltage in a direction in accordance with the stored information in the rewriting operation, segregation of indium ion can be prevented, and a more stable data retention property can be realized.

More specifically, for example, since the bit line BL1L is applied with high voltage and the bit line BL1R is applied with low voltage in the set operation, electric field is generated in a direction from the upper electrode 53 to the lower electrode TP of the memory element RM in FIG. 4. Therefore, positive ions such as impacted-ionized indium are attracted to the vicinity of the lower electrode TP. Contrary to this, for example, since the bit line BL1R is applied with high voltage and the bit line BL1L is applied with low voltage in the reset operation, electric field is generated in a direction from the lower electrode TP to the upper electrode 53 in FIG. 4. Therefore, a positively ionized element including an element such as indium is attracted in a direction toward the upper electrode 53 along the line of electric force. On the other hand, positive ions may diffuse in an anode direction by the thermal diffusion caused by melting. By these means, localization of an element due to the rewriting operation can be prevented, and therefore, the number of rewritable times can be improved. In other words, by these effects, a composition distribution in a film thickness direction in the present invention is stably maintained even if rewriting is repeated many times. Note that the composition distribution in which a metal element such as In is much contained in the first layer can be stably maintained by selecting a voltage polarity by which the upper electrode 53 is turned to be positive in the set, in which thermal diffusion is small and the ions relatively tend to be on one side of the film thickness direction, and the upper electrode 53 is turned to be negative in the reset.

Also, when reverse voltage is applied in resetting from the set state as described above (that is, the lower electrode TP side is turned to be positive in the reset), since electrons are accelerated in an upper region of aligned atomic arrangement and entered to the lower portion, it is advantage for increasing the temperature of the lower portion, and therefore, an effect of reduction of the reset current can be also expected. When high temperature in the reset state is maintained, the second layer in an upper portion in the film thickness direction is crystallized, but since the full crystallization and further resistance increase are prevented in a region close to the lower electrode (that is, the first layer and others), the heat-resistance property can be maintained.

Note that, in the description above, a specification of a memory cell transistor is not particularly limited. However, it is also possible to boost the gate voltage by using a transistor having a thick gate oxide film as the memory cell transistor. By the configuration and operation as described above, the deterioration of driving capability of the memory cell transistor QM due to the substrate bias effect caused by the memory element RM can be suppressed, and a sufficient large reset current can be supplied also in the direction reverse to conventional one.

Sixth Embodiment

Figure 33:
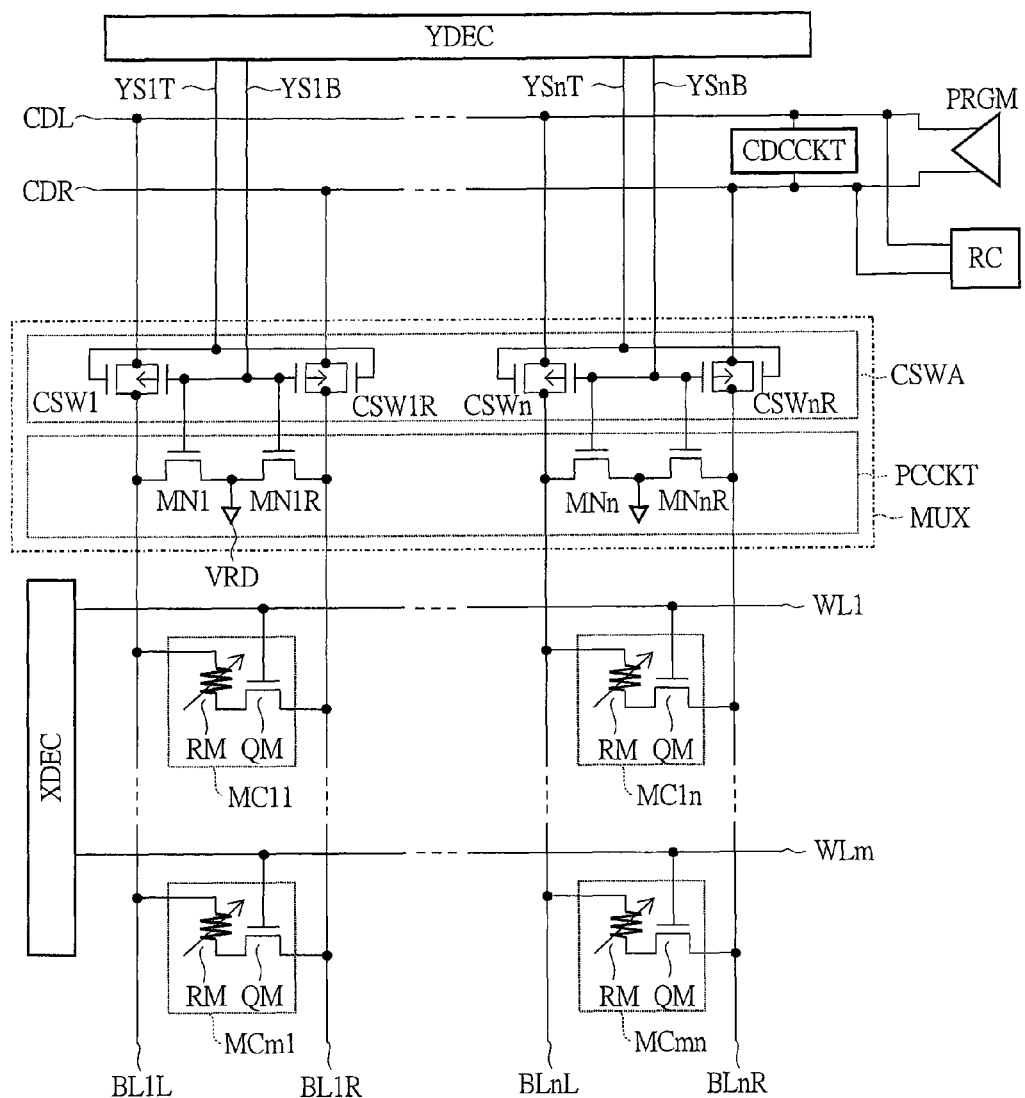
FIG. 33 is a circuit diagram showing a configuration example of a semiconductor device according to a sixth embodiment of the present invention.

In a sixth embodiment, the configuration and operation in which the semiconductor device of the fifth embodiment described above is modified will be described. FIG. 33 is a circuit diagram showing a configuration example of a semiconductor device according to the sixth embodiment of the present invention. The semiconductor device according to the sixth embodiment has a characteristic in its reading method, in which the discharge circuit DCCKT shown in FIG. 30 is replaced by the pre-charge circuit PCCKT as shown in FIG. 33 and source voltages of NMOS transistors MN1 to MNn and MN1R to MNnR in the pre-charge circuit PCCKT are set to a reading voltage VRD.

Figure 34:
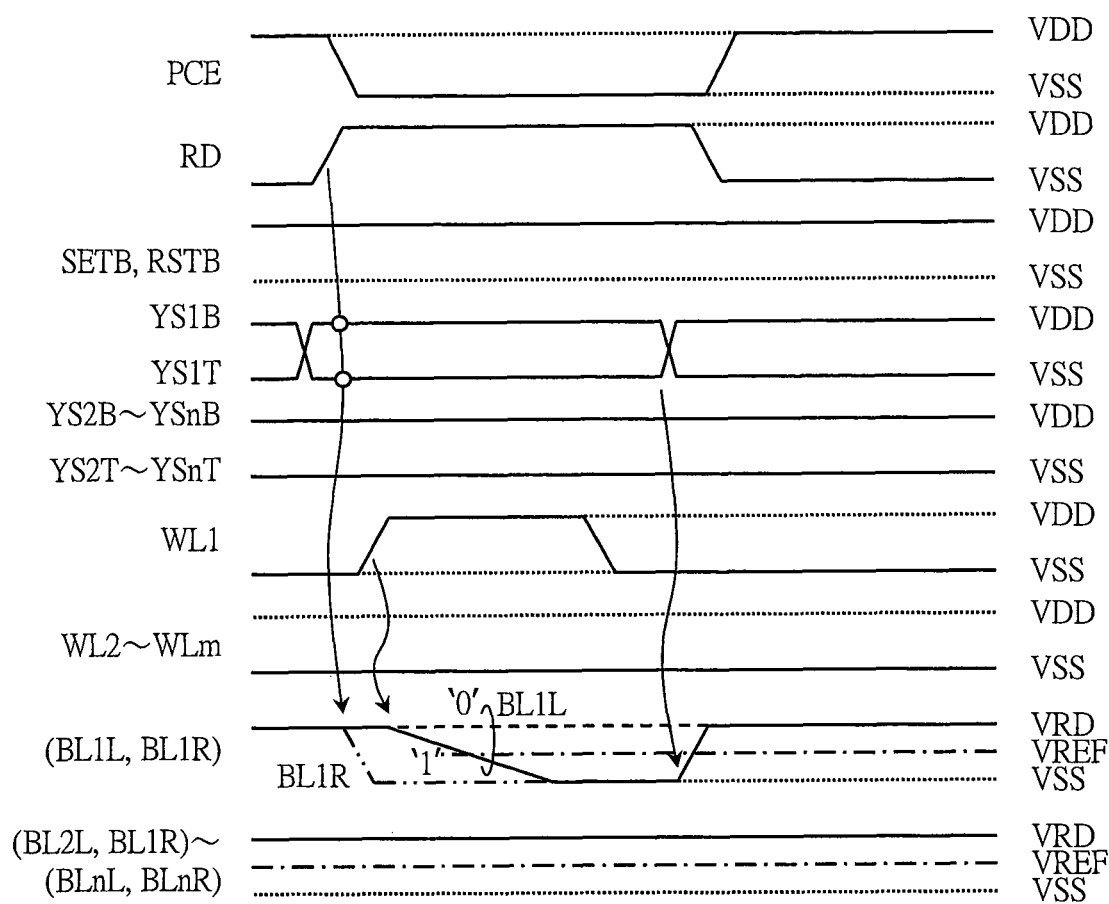
FIG. 34 is a waveform diagram showing one example of a reading operation in the semiconductor device of FIG. 33.

The reading operation in such a configuration is shown in FIG. 34. In a stand-by state, the bit line pairs (BL1L and BL1R) to (BLnL and BLnR) are maintained at the reading voltage VRD by the pre-charge circuit PCCKT. When the reading activation signal RD which is at the ground voltage VSS is driven to the power supply voltage VDD after the activation of the column select line pair (YS1T and YS1B), the bit line BL1R is discharged from the common data line CDR through the transistor MN112 in the reading circuit RC. Next, when the word line WL1 is activated, a current path in the memory cell MC11 is formed, and a reading signal in accordance with the stored information is inputted to the sense amplifier SA from the bit line BL1L through the common data line CDL and the transistor MN111 in the reading circuit RC. After sufficient reading signals are generated, the word line WL1 and the column select line pair (YS1T and YS1B) are put into an inactive state, whereby the bit line pair (BL1L and BL1R) is driven to the reading voltage VRD by the pre-charge circuit PCCKT. Lastly, the reading activation signal RD which is at the power supply voltage VDD is driven to the ground voltage VSS, thereby returning to the stand-by state.

By the configuration and operation as described above, a reading time can be shortened in addition to the effects described in the fifth embodiment. More specifically, for example, right after the generation of the reading signal, that is, right after the inactivation of the column select line pair (YS1T and YS1B), a pre-charge operation of the bit line pair (BL1L and BL1R) can be performed in parallel with the operation of the sense amplifier SA, and therefore, it is possible to sufficiently ensure the time assigned to the pre-charge operation. Also, since the bit line BL1R is discharged by using the NMOS transistor MN112 in the reading circuit RC, a time for generating a potential difference in the bit line pair (BL1L and BL1R) can be shortened. Further, since it is not necessary to ensure the margin between the activation timing of the column select line pair (YS1L and YS1L) and the activation timing of the word line WL1, the select operation time of the memory cell MC11 can be shortened. By the effects above, an access time and a cycle time in the reading operation can be shortened, and therefore, a high-speed semiconductor device (phase-change memory) can be realized.

In the foregoing, the invention made by the inventors of the present invention has been concretely described based on the embodiments. However, it is needless to say that the present invention is not limited to the foregoing embodiments and various modifications and alterations can be made within the scope of the present invention.

For example, as for the amorphous state and the crystalline state described in the first embodiment, a whole region performing a memory operation is not required to be uniformly in these states, and a crystal grain may exist inside the region of the amorphous state, or an amorphous part may exist inside the region of the crystalline state. More specifically, it is sufficient if changes between a state in which a lot of amorphous portions are present and a state in which few amorphous portions are present are caused and the resistance value is varied therebetween.

Also, it can be understood from the film structure that the chalcogenide material (recording layer) with a composition described in the first embodiment is a material in which crystallization accompanied with a crystal nucleation occurs instead of the crystal growth from the amorphous region. The chalcogenide material can be determined as a material in which crystallization accompanied with a crystal nucleation occurs when the chalcogenide material layer is observed as three or more granular pieces at a maximum in the film thickness direction, more preferably six or more granular pieces at a maximum with scanning electron microscope (SEM) or transmission electron microscope (TEM). Also, even if the material has a composition within a composition range of the present invention, the resistance change may occur therein in addition to the phase change depending on the composition, due to the formation and disappearance of conductive paths made from a high concentration region of metal or metalloid atoms or an atomic group containing them moved by an electric field. More specifically, if crystal growth from outside to inside which becomes difficult by the addition of indium (In) is not employed as a mechanism of a set, it is not always necessary to employ only the phase-change by the crystal nucleation and the growth from the nucleus as the mechanism of the set.

INDUSTRIAL APPLICABILITY

A semiconductor integrated circuit device according to the present invention can be widely applied to a high-density integrated memory circuit including a memory cell using a phase-change material or a logic embedded memory in which a memory circuit and a logic circuit are provided on the same semiconductor substrate, and it becomes further beneficial when such products are used under a high-temperature condition.

The invention claimed is:

1. A semiconductor device comprising:
a chalcogenide layer which records information by causing a change in an electrical resistance;
an upper electrode formed on an upper portion of the chalcogenide layer; and
a lower electrode formed on a lower portion of the chalcogenide layer,
wherein the chalcogenide layer comprises at least two layers including a first layer positioned on a lower electrode side and a second layer positioned on an upper electrode side,
an average content of a group II or group III element of the first layer in a film thickness direction is 7 atomic % or more and 40 atomic % or less,
an average content of a group II or group III element of the second layer in a film thickness direction is from 0% to 15 atomic % or less, and
the average content of the first layer is 5 atomic % or more larger than the average content of the second layer,
wherein the first layer is made of a material containing:
at least either indium (In) or gallium (Ga) of 7 atomic % or more and 40 atomic % or less;
germanium (Ge) of 5 atomic % or more and 35 atomic % or less;
antimony (Sb) of 5 atomic % or more and 25 atomic % or less; and
tellurium (Te) of 40 atomic % or more and 65 atomic % or less.

2. A semiconductor device comprising:
a chalcogenide layer which records information by causing a change in an electrical resistance;
an upper electrode formed on an upper portion of the chalcogenide layer;
a lower electrode formed on a lower portion of the chalcogenide layer;
a bit line connected to the upper electrode;
a transistor having one end connected to the lower electrode and the other end connected to a ground voltage; and
a word line connected to a control terminal of the transistor,
wherein the chalcogenide layer comprises at least two layers including a first layer positioned on a lower electrode side and a second layer positioned on an upper electrode side,
an average content of a group II or group III element of the first layer in a film thickness direction is 7 atomic % or more and 40 atomic % or less,
an average content of a group II or group III element of the second layer in a film thickness direction is from 0% to 15 atomic % or less,
the average content of the first layer is 5 atomic % or more larger than the average content of the second layer, and
a voltage higher than that of the lower electrode is applied to the upper electrode when information is recorded in the chalcogenide layer,
wherein the first layer is made of a material containing:
at least either indium (In) or gallium (Ga) of 7 atomic % or more and 40 atomic % or less;
germanium (Ge) of 5 atomic % or more and 35 atomic % or less;
antimony (Sb) of 5 atomic % or more and 25 atomic % or less; and
tellurium (Te) of 40 atomic % or more and 65 atomic % or less.

* * * * *